(12) United States Patent
Jeoung et al.

(10) Patent No.: US 7,439,539 B2
(45) Date of Patent: Oct. 21, 2008

(54) FLAT PANEL DISPLAY DEVICE AND FABRICATING METHOD THEREOF

(75) Inventors: Hun Jeoung, Chilgok-gun (KR); Soon Kwang Hong, Buk-gu (KR)

(73) Assignee: LG Display Co., Ltd., Seoul (KR)

( * ) Notice: Subject to any disclaimer, the term of this patent is extended or adjusted under 35 U.S.C. 154(b) by 88 days.

(21) Appl. No.: 11/194,091

(22) Filed: Jul. 29, 2005

(65) Prior Publication Data
US 2006/0023130 A1    Feb. 2, 2006

(30) Foreign Application Priority Data
Jul. 30, 2004    (KR) .................. 10-2004-0060232

(51) Int. Cl.
*H01L 29/00* (2006.01)
(52) U.S. Cl. .......................................... 257/59; 438/30
(58) Field of Classification Search .............. 438/30, 438/151–166; 257/57–61
See application file for complete search history.

(56) References Cited

U.S. PATENT DOCUMENTS

| | | | | |
|---|---|---|---|---|
| 5,396,084 A | * | 3/1995 | Matsumoto | 257/72 |
| 5,409,851 A | * | 4/1995 | Oh | 438/159 |
| 6,188,452 B1 | * | 2/2001 | Kim et al. | 349/43 |
| 6,204,081 B1 | * | 3/2001 | Kim et al. | 438/30 |

* cited by examiner

*Primary Examiner*—Richard A. Booth
(74) *Attorney, Agent, or Firm*—Brinks Hofer Gilson & Lione

(57) ABSTRACT

A flat panel display device (FPD) and fabricating method thereof are disclosed, which reduce the number of masks during fabrication and prevent electrochemical corrosion problems. In the FPD, a cell area and a pad area are defined on a substrate. A storage electrode traverses an active layer in parallel to a gate line. Source and drain regions of the active layer in the vicinity of both sides of a gate electrode are not formed below the storage electrode. An insulating interlayer over the substrate has first and second contact holes on the source and drain regions, respectively. A source electrode contacts the source region via a first contact hole and a drain electrode contacts the drain region via a second contact hole to directly contact a pixel electrode. A protective layer is disposed over the substrate including the pixel electrode.

21 Claims, 47 Drawing Sheets

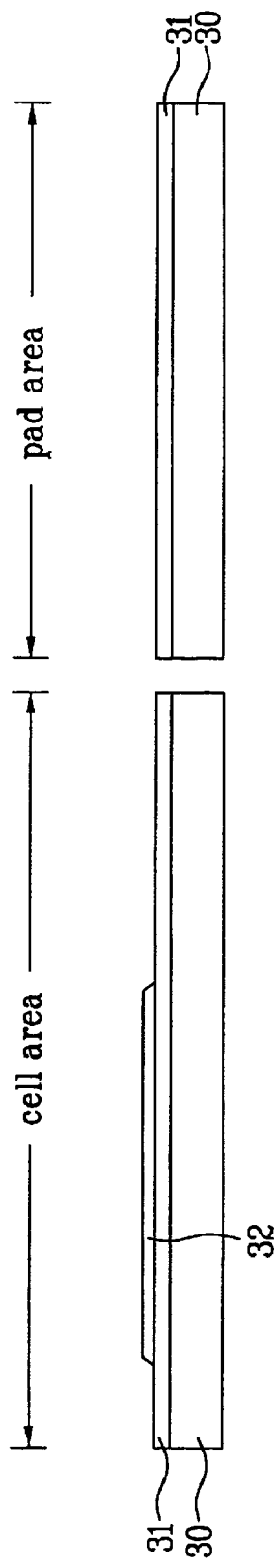
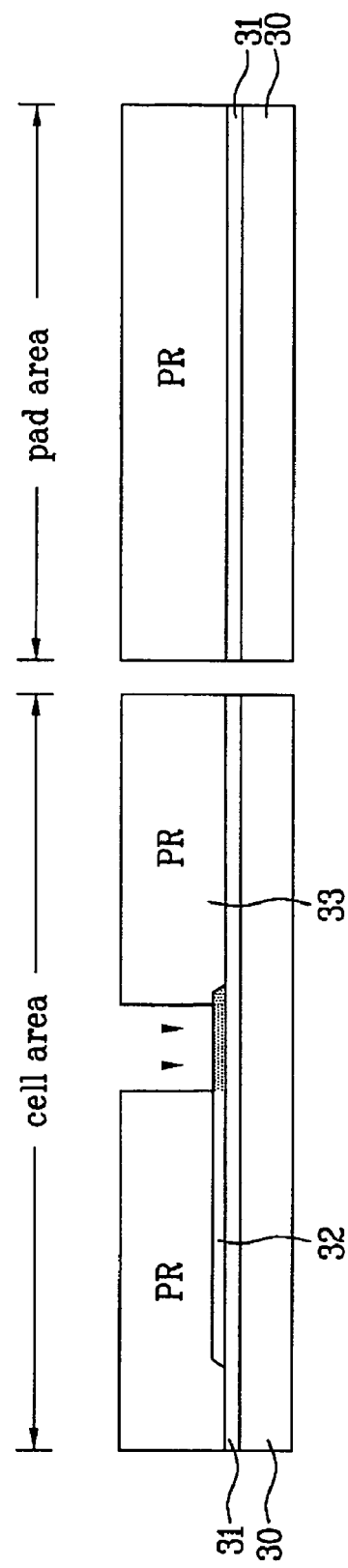

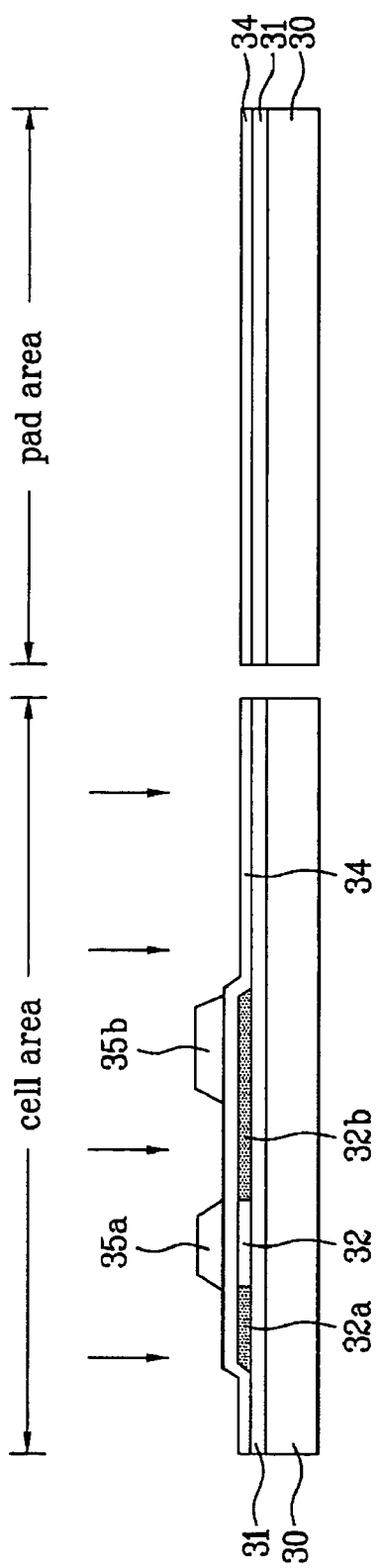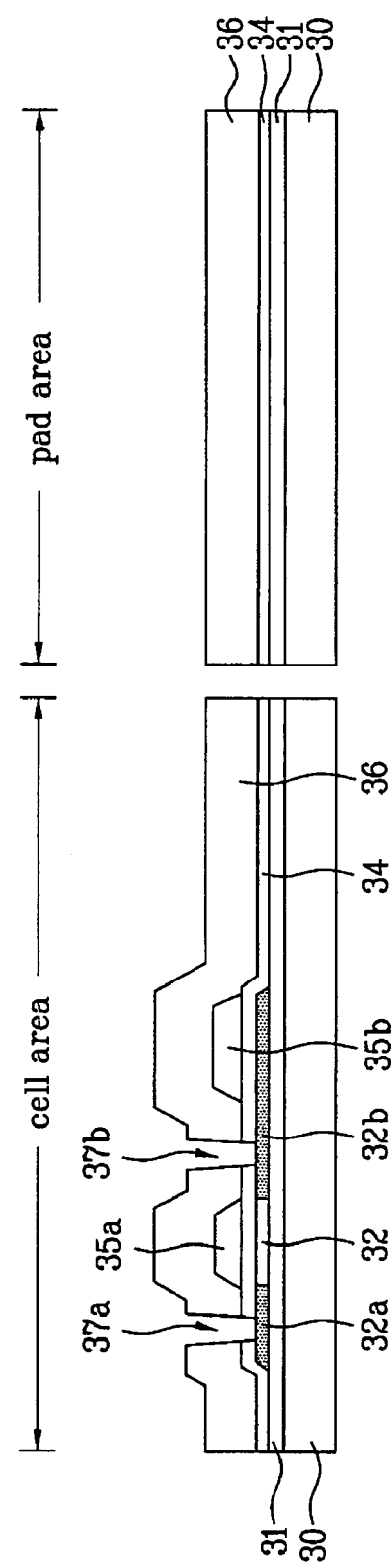

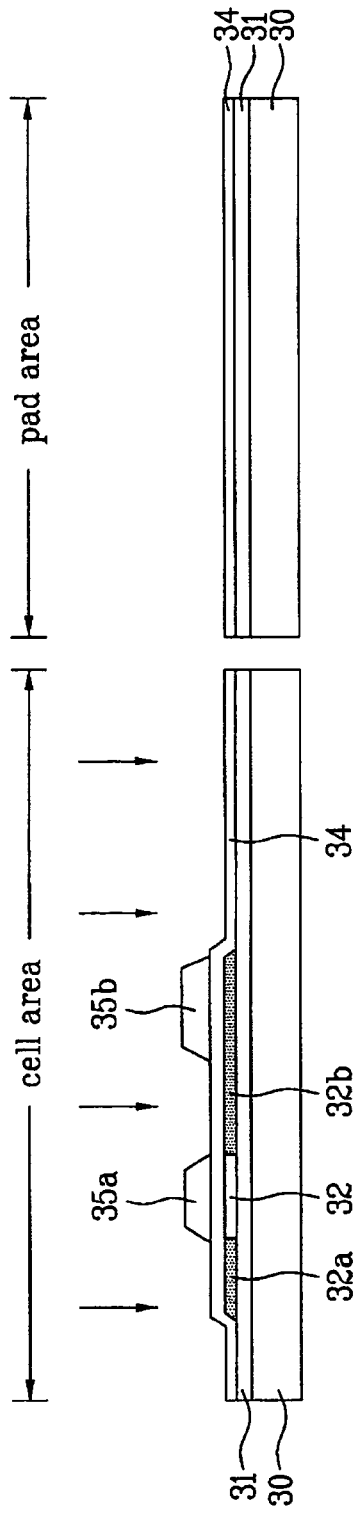
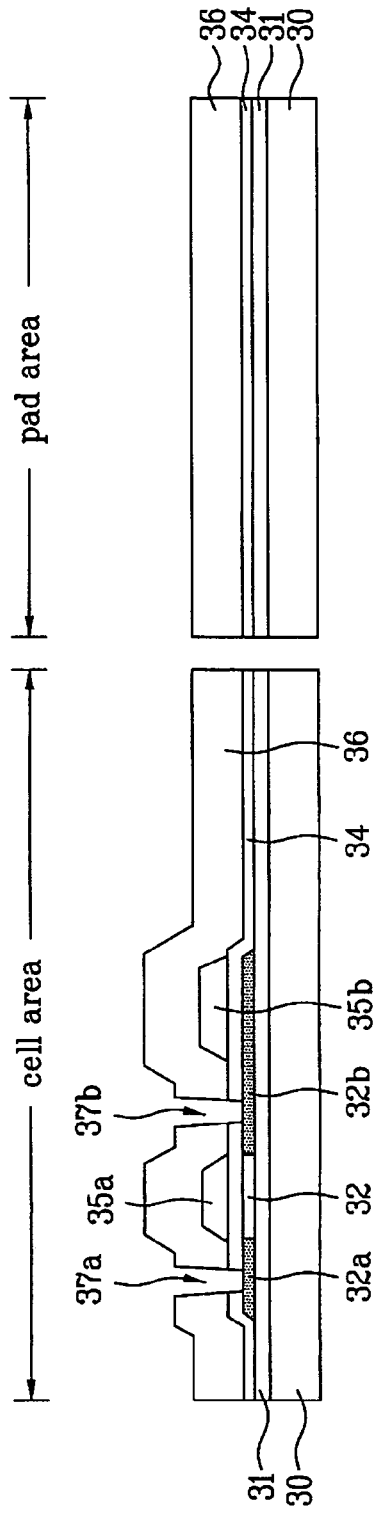

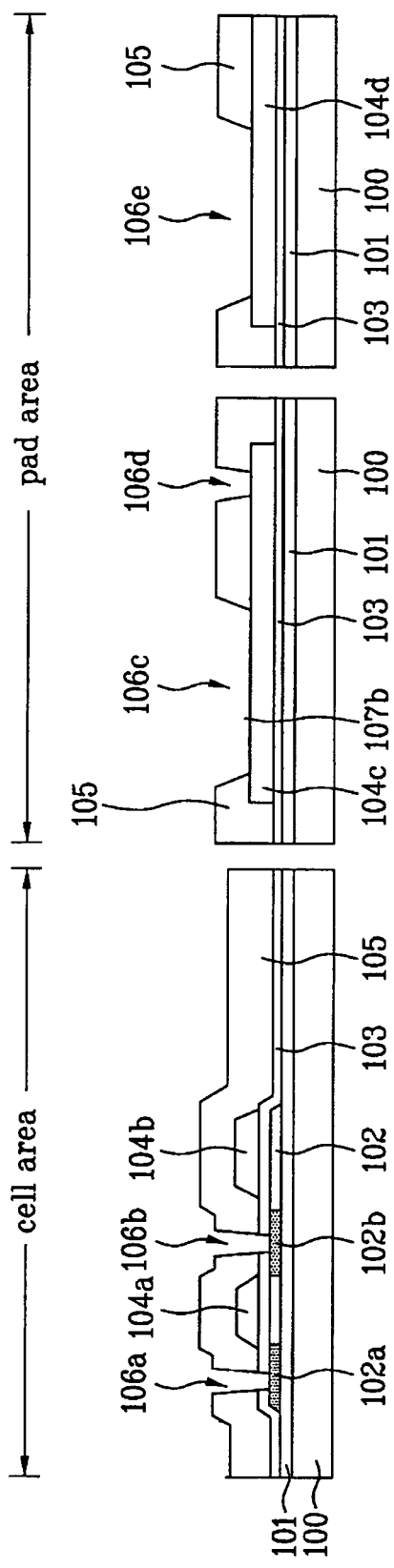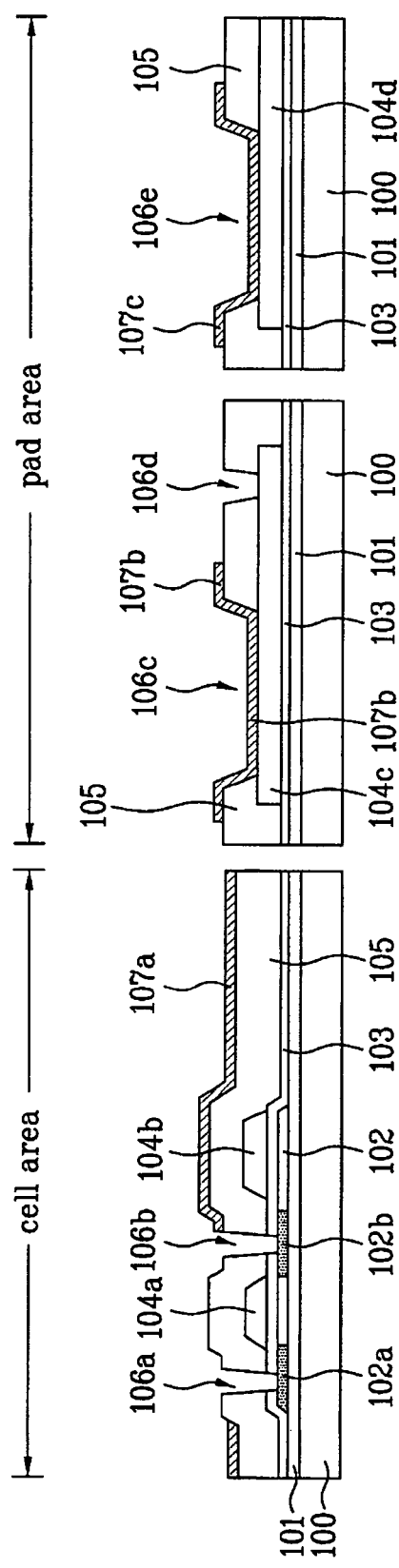

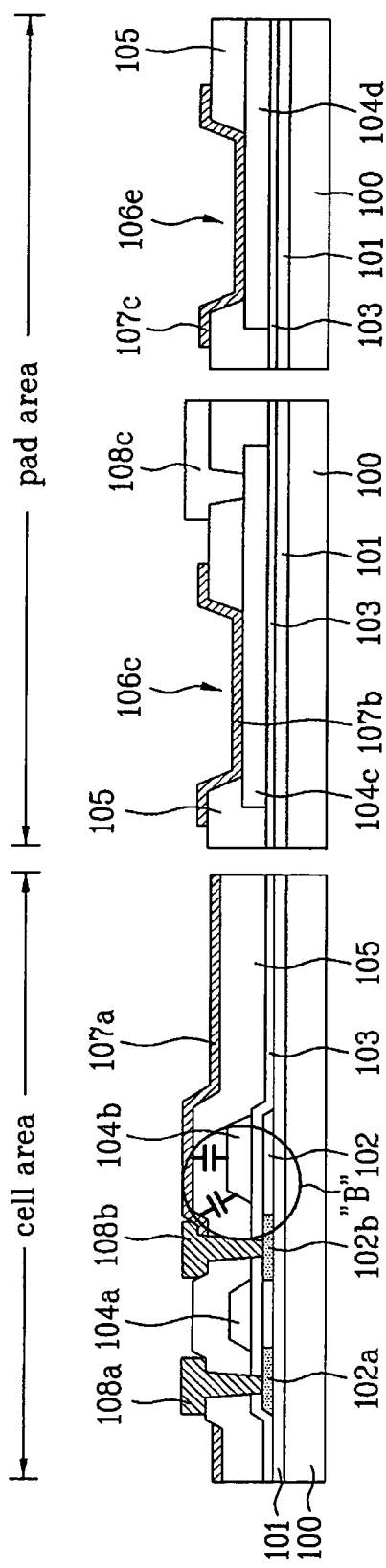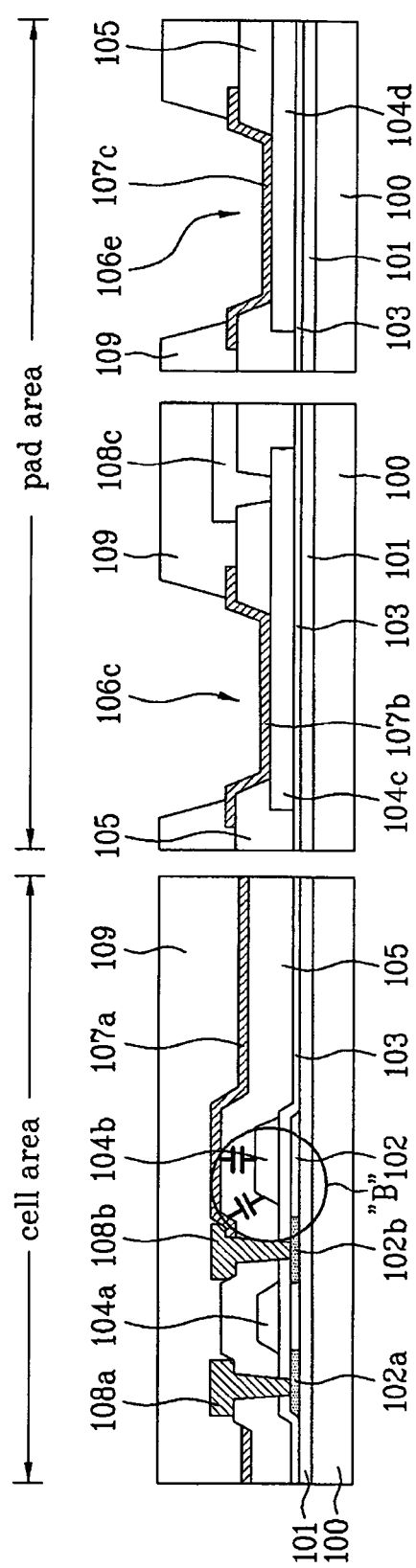

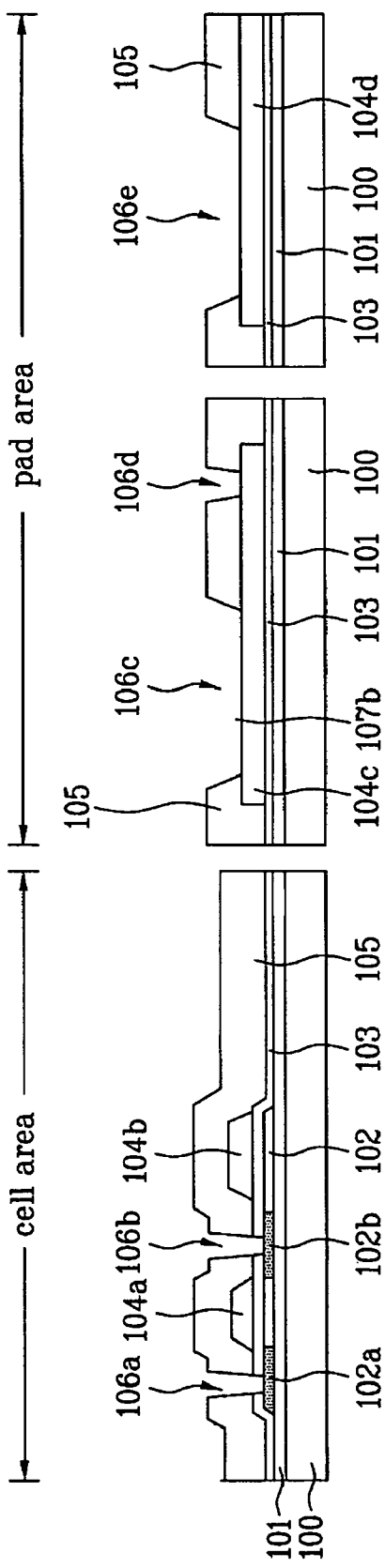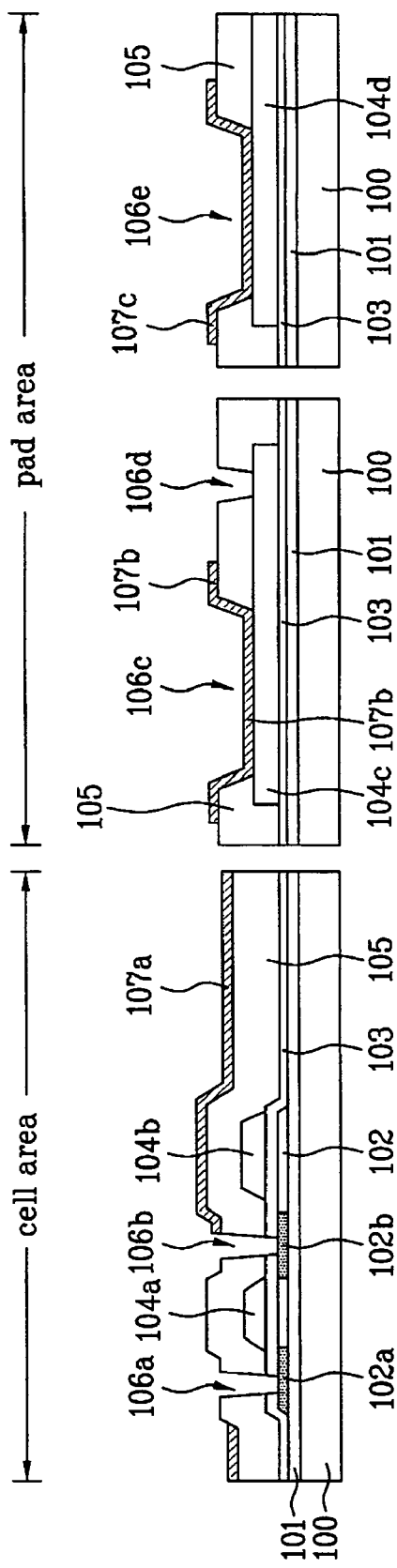

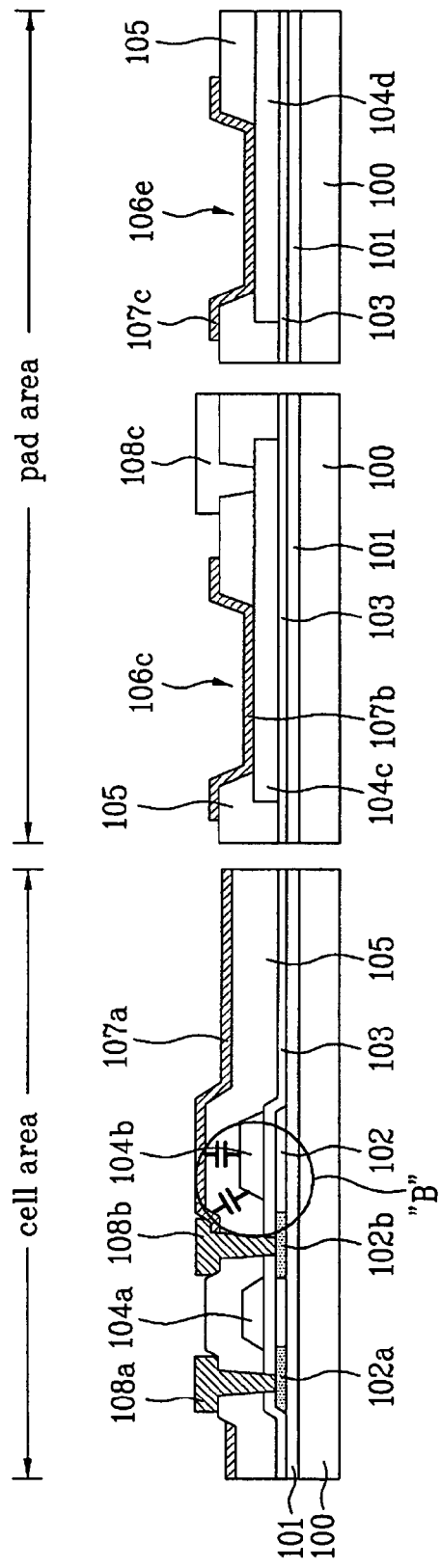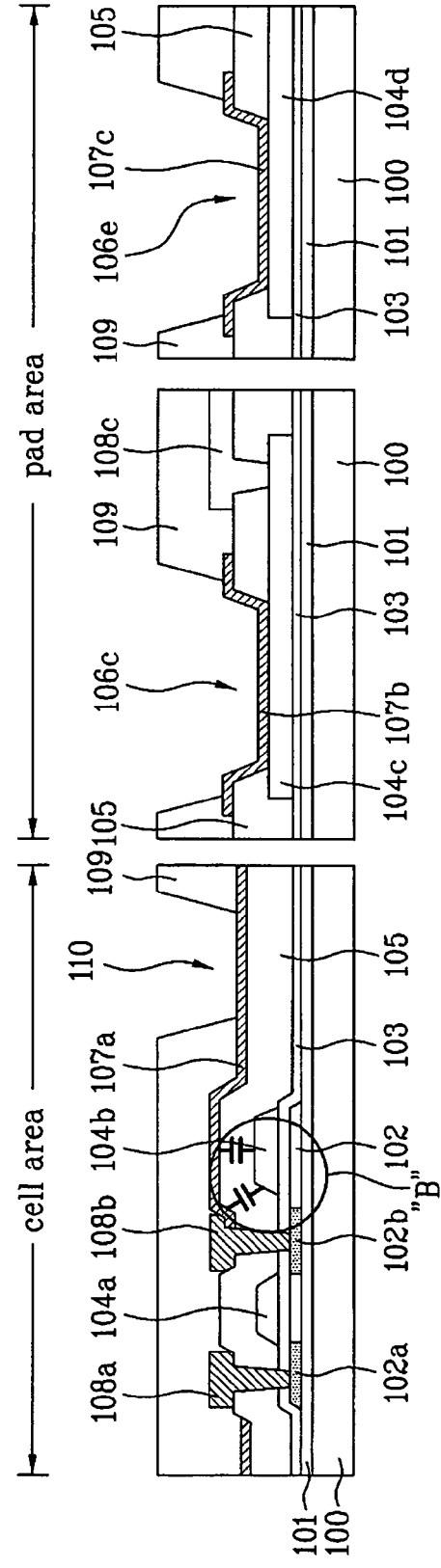

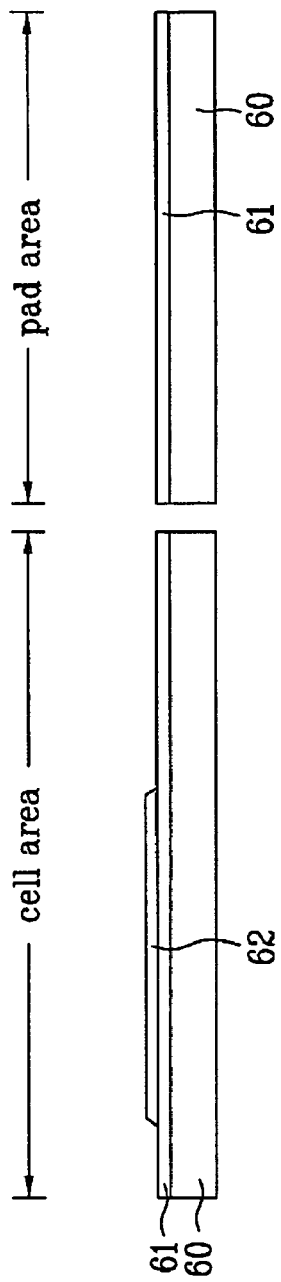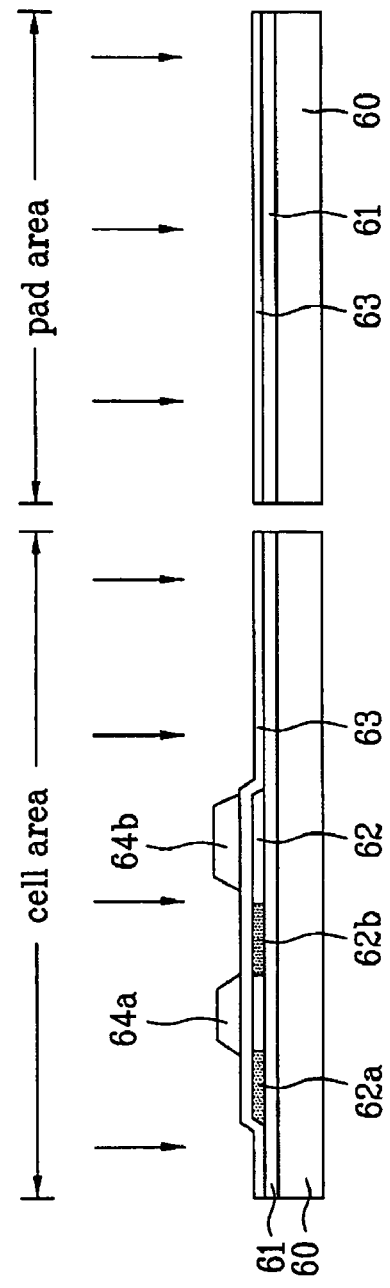

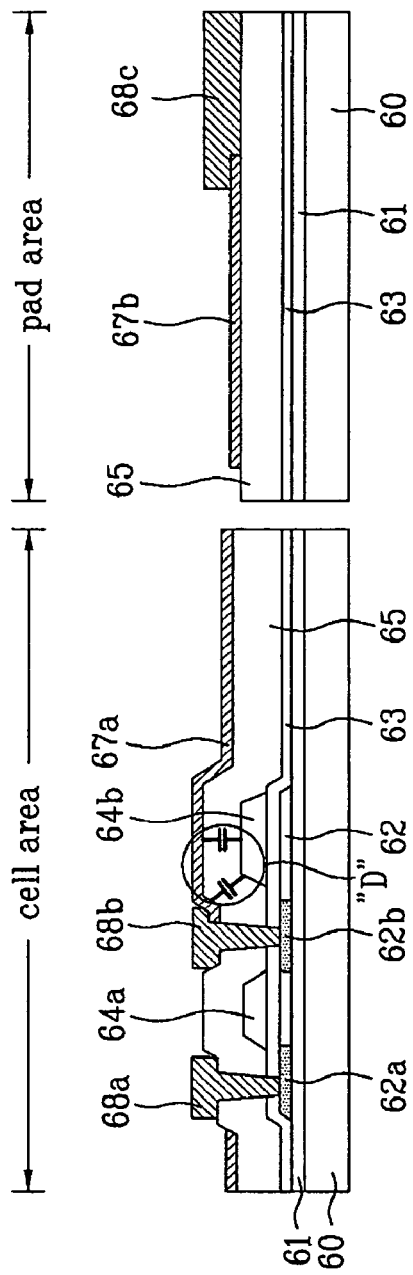
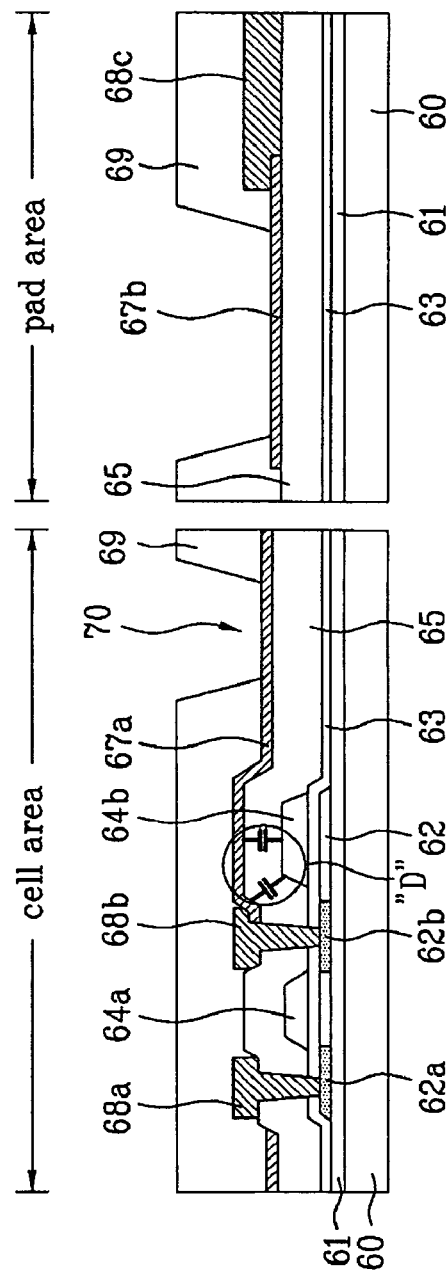

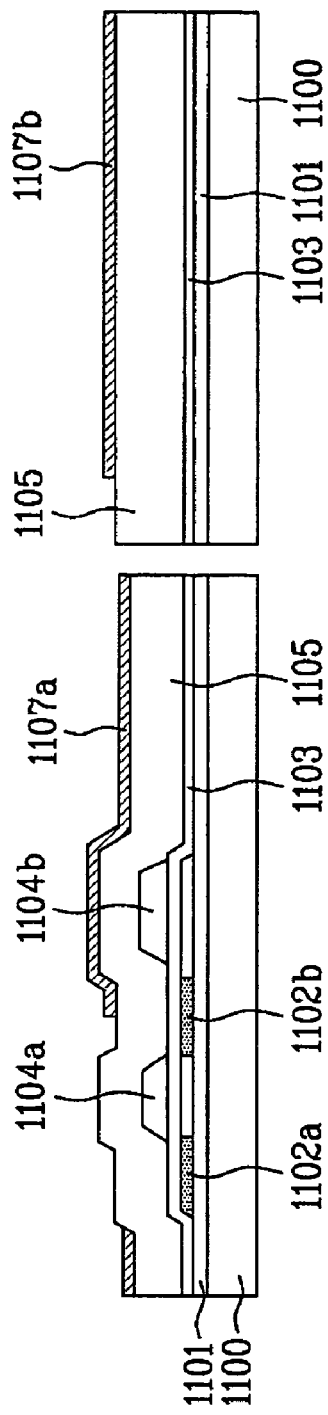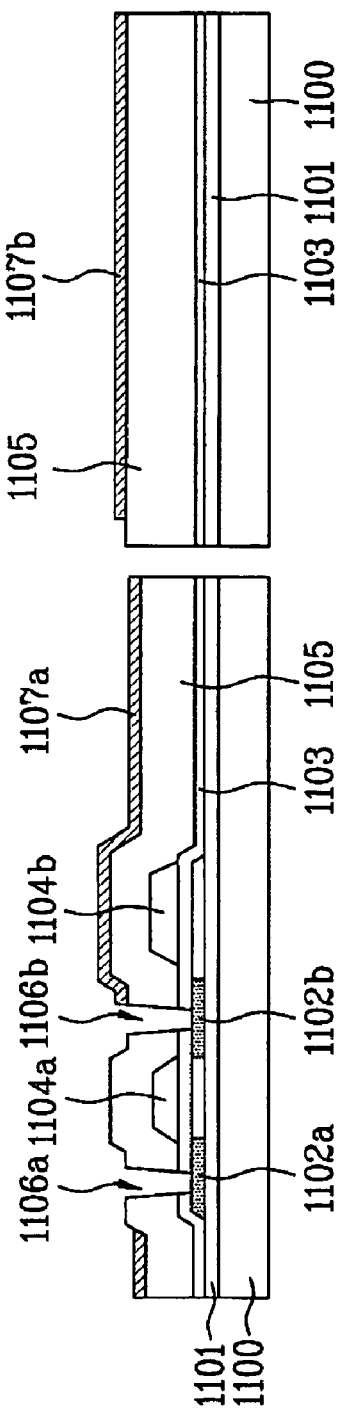

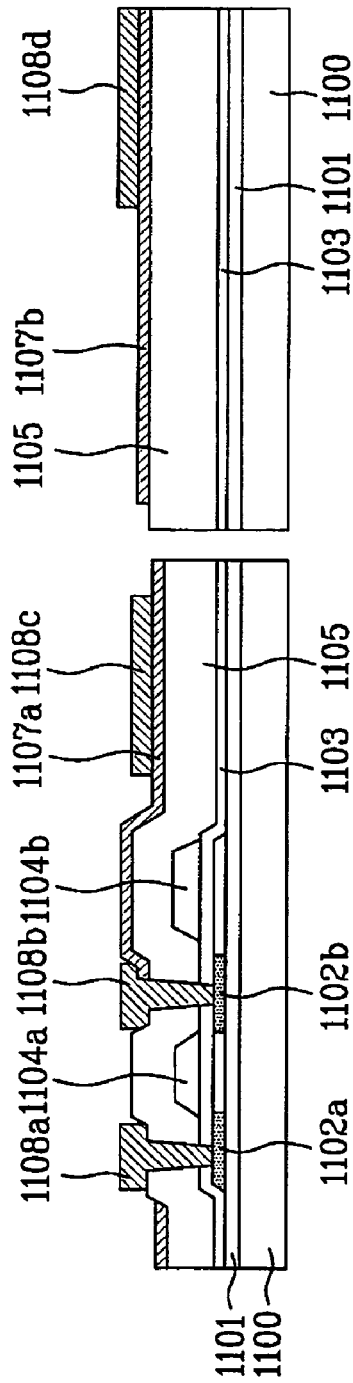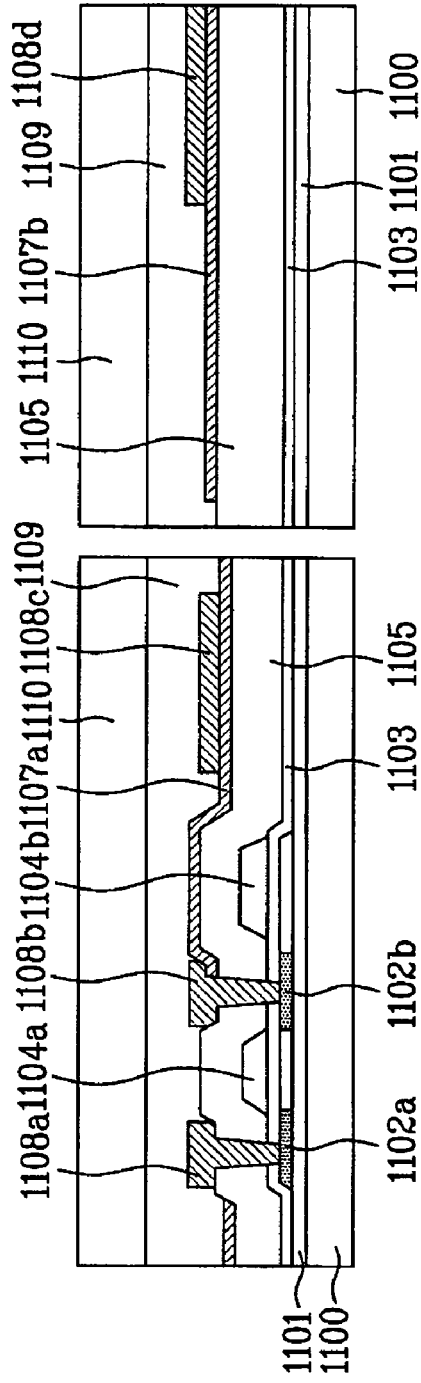

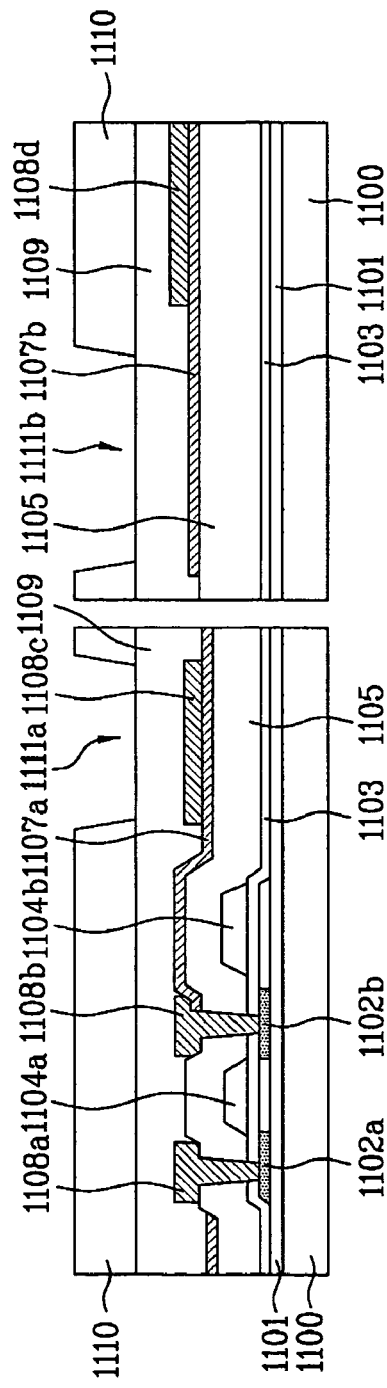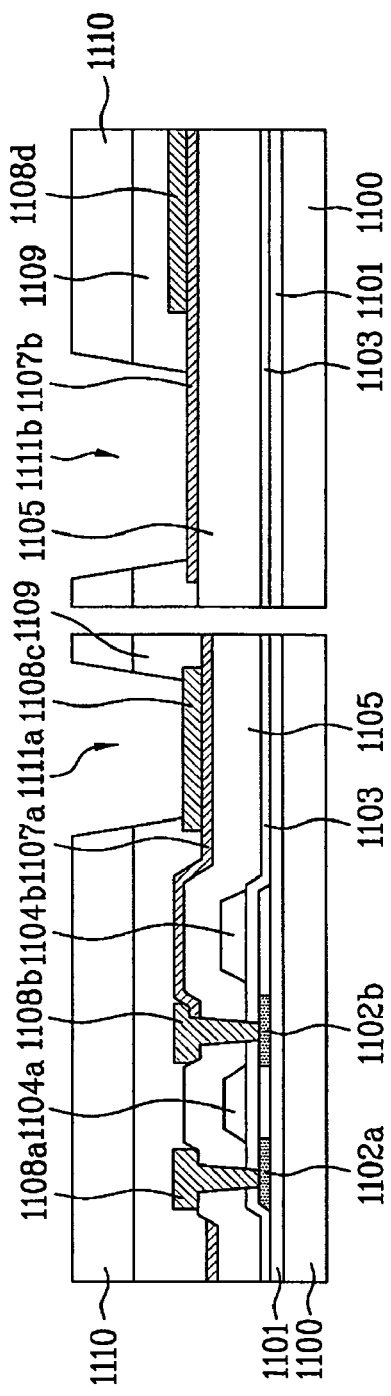

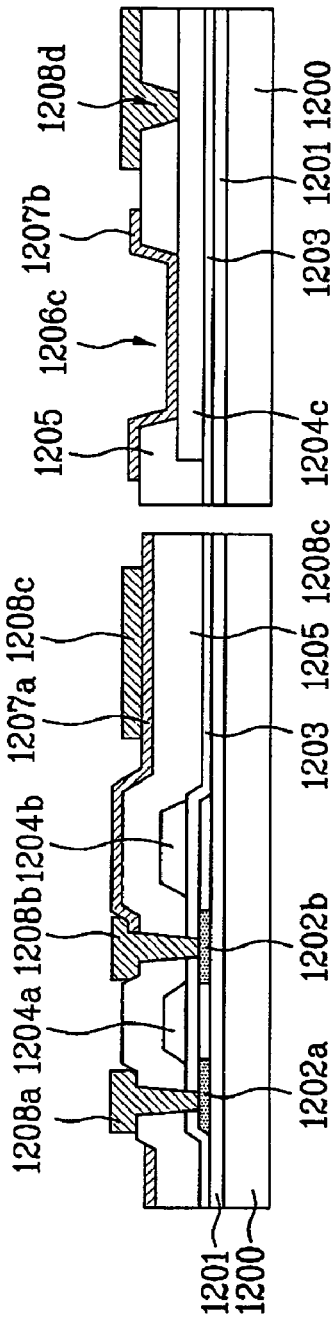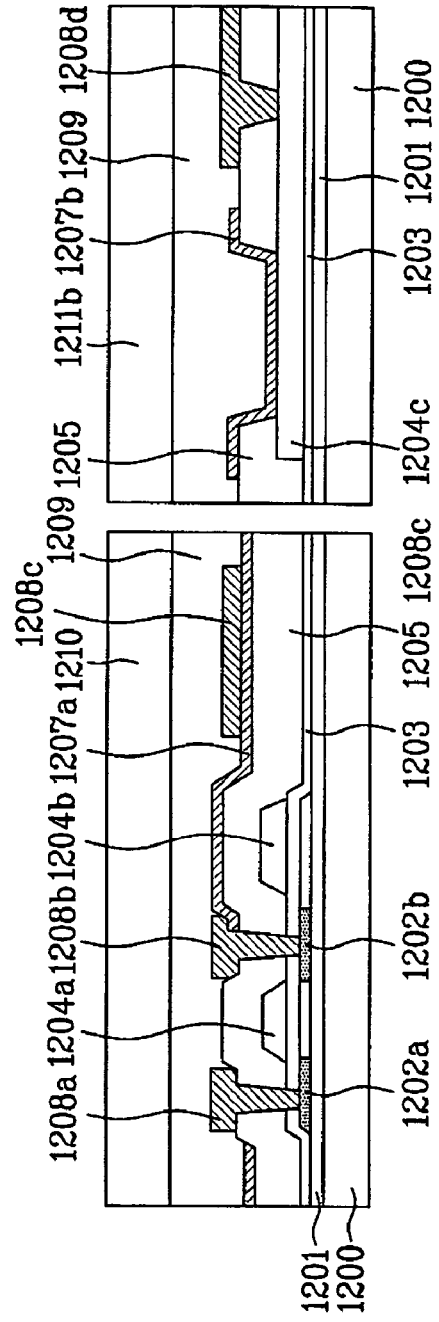

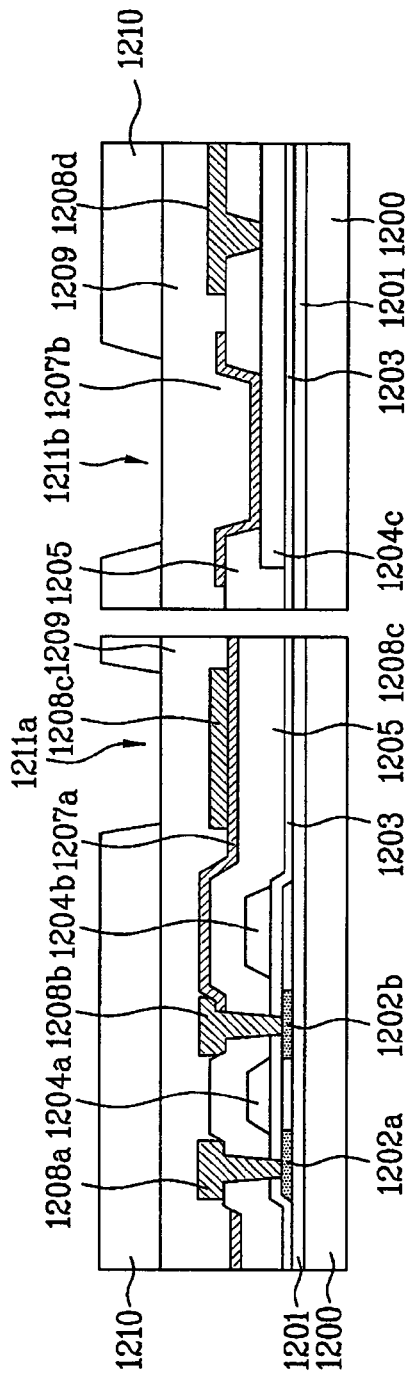
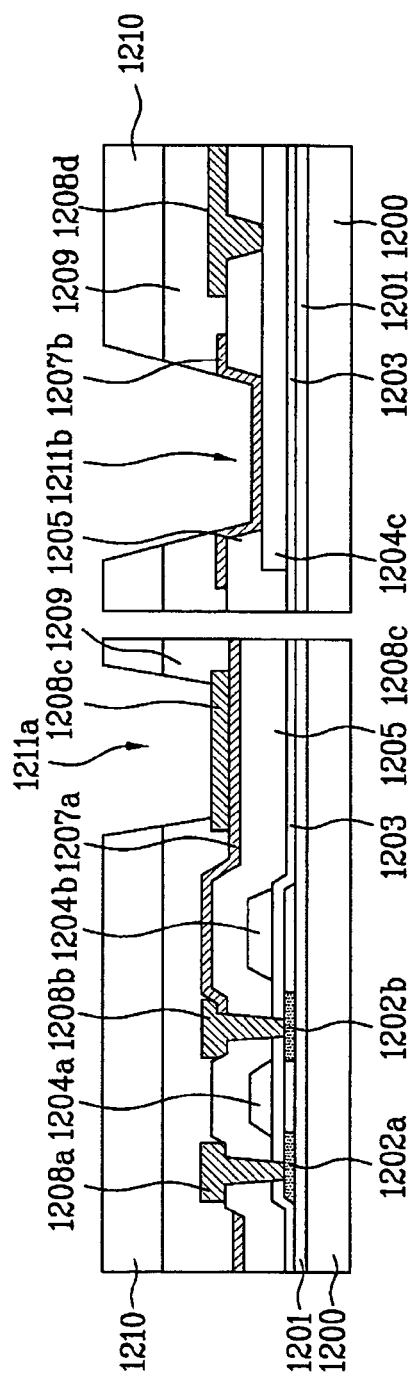
FIG. 24G
FIG. 24H

FLAT PANEL DISPLAY DEVICE AND FABRICATING METHOD THEREOF

This application claims the benefit of the Korean Patent Application No. P2004-060232, filed on Jul. 30, 2004, which is hereby incorporated by reference as if fully set forth herein.

FIELD OF THE INVENTION

The present invention relates to a flat panel display device, and more particularly, to a flat panel display device and fabricating method thereof.

DISCUSSION OF THE RELATED ART

Generally, liquid crystal display devices are relatively lighter, thinner, shorter, and/or smaller than other display devices. The liquid crystal display device is used in numerous devices such as cellular telephones, personal digital assistants (PDAs), and notebook personal computers (PCs).

A liquid crystal display (hereinafter abbreviated LCD) device is mainly divided into an upper substrate, a lower substrate and a liquid crystal layer injected between the upper and lower substrates.

On the lower substrate, a plurality of uniformly spaced gate lines are arranged on a glass substrate and a plurality of uniformly spaced data lines are arranged in a direction perpendicular to that of the gate lines. The gate and data lines define matrix type pixel areas in which a plurality of pixel electrodes are provided. A plurality of thin film transistors are provided at intersections between the gate and data lines to apply data signals of the data lines according to signals of the gate lines.

On the upper glass substrate, a black matrix layer prevents light from irradiating an area other than the pixel areas of the lower substrate. A color filter layer is formed to represent colors on the pixel areas through apertures of the black matrix layer. A common electrode is provided over the substrate including the color filter layer.

The liquid crystal layer is provided between the above-configured upper and lower substrates.

In the above-configured LCD device, a plurality of pixels is arranged in a matrix form. If a signal is applied to one gate line, a data signal is applied to the pixel corresponding to the line. However, characteristics of the liquid crystals injected between the upper and lower substrates are degraded if a DC voltage is applied thereto for a considerable duration. Accordingly, a polarity inversion drive method is used in which the polarity of the applied voltage is periodically changed to prevent the characteristic degradation. A number of different polarity inversion drive methods exist: frame inversion, line inversion, column inversion, and dot inversion.

In the frame inversion method, the polarity of a data voltage applied to liquid crystals for a common electrode voltage is uniform within each frame, but changes from frame to frame. Namely, if a positive data voltage is applied during an even frame, a negative data voltage is applied during an odd frame. The frame inversion drive method has small current consumption for switching but is sensitive to flickers due to transmittance asymmetry between positive and negative polarities and is vulnerable to crosstalk caused by inter-data interference.

The line inversion drive method is generally used for low resolution (VGA, SVGA) displays. In the line inversion drive method, a data voltage is applied so that the pixel polarity is varied each horizontal line. Namely, if a positive data voltage is applied to an odd line and if a negative voltage is applied to an even line, negative and positive data voltages are applied to odd and even lines during the next frame, respectively. In the line inversion drive method, since data voltages of opposite polarity are applied to neighboring lines, an inter-line difference is lowered by spatial averaging to reduce a frame inversion to flicker. Coupling generated between data due to vertical opposite polarity voltage distribution is cancelled out to reduce a frame inversion to vertical crosstalk. However, the voltage of the same polarity is distributed in a horizontal direction to generate horizontal crosstalk and the frame inversion to switching repetition number increases. Hence, the current consumption is raised.

In the column inversion drive method, polarities of the applied data voltages are equal in a vertical direction but are opposite to each other in a horizontal direction. Like the line inversion drive method, the flicker phenomenon to frame inversion is lowered by spatial averaging and the frame inversion to horizontal crosstalk is small. However, since data voltages of opposite polarities are applied to neighboring lines in a common electrode voltage to vertical direction, a high-voltage column drive IC is used.

The dot inversion drive method is used in high resolution (XGA, SXGA, UXGA) displays as it can implement the best image quality of the inversion drive methods. In dot inversion drive method, polarities of data voltages of neighboring pixels are opposite to each other in all directions (vertical/horizontal). Hence, the dot inversion drive method minimizes the flicker phenomenon by spatial averaging. However, the dot inversion drive method uses the high-voltage column drive IC and has high current consumption.

In addition to LCD devices, an active matrix organic light-emitting device (AM-OLED) has been used in flat panel display devices. A general AM-OLED is explained as follows.

FIG. 1 is a layout of a flat panel display device having a general AM-OLED and FIG. 2 is a cross-sectional diagram of a general organic light-emitting device.

Referring to FIG. 1, a general AM-OLED consists of a data drive circuit 20, a scan drive circuit 22 and an organic electroluminescent (EL) display panel 24 having a plurality of scan lines S1 to Sm, a plurality of data lines D1 to Dn, switching PMOS transistors P1 between the scan and data lines, capacitors C2 between the scan and data lines, current driving PMOS transistors P2 between the scan and data lines, and organic ELs (OEL) between the scan and data lines.

A gate of the PMOS transistor P1 is connected to the scan line and a source is connected to the data line. One side of the capacitor C2 is connected to a drain of the PMS transistor P1, and the other side is connected to a voltage Vdd. A gate of the PMOS transistor P2 is connected to the drain of the PMOS transistor P1. A positive polarity of the organic EL OEL is connected to a drain of the PMOS transistor P2 and a negative polarity is connected to a ground voltage.

In the above configured AM-OLED, the organic EL, as shown in FIG. 2, consists of an anode electrode 2 formed of a transparent electrode pattern on a glass substrate 1. A hole injection layer 3, an emitting layer 4 and an electron injection layer 5 are stacked on the anode electrode 2. A cathode electrode 6 formed of a metal electrode is formed on the electron injection layer 5.

If a drive voltage is applied between the anode and cathode electrodes 2 and 6, holes within the hole injection layer 3 and electrons within the electron injection layer 5 proceed to the emitting layer 4 so that the emitting layer 4 emits visible light by being excited.

Flat panel display devices, i.e., LCD and AM-OLED, driven by line inversion among the various inversion drive methods are explained in the following. A flat panel display device and fabricating method thereof according to a related art are explained with reference to the attached drawings as follows.

FIG. 3 is a layout of an LCD flat panel display device according to a related art and FIG. 4 is a cross-sectional diagram taken along a cutting line I-I' in FIG. 3.

Referring to FIG. 3 and FIG. 4, a buffer layer 31 is formed on an insulating substrate 30. An active layer 32 is patterned on the buffer layer 31. A gate insulating layer 34 is formed over the insulating substrate 30 including the active layer 32. A gate line 35 is arranged on one area of the gate insulating layer 34 in one direction. A gate electrode 35a protrudes from one side of the gate line 35. A storage electrode 35b is arranged in a direction parallel to the gate line 35 to traverse the active layer 32. Source and drain regions 32a and 32b doped with p type impurities are provided within the active layer 32 in the vicinity of both sides of the gate electrode 35a, respectively. An insulating interlayer 36 is formed over the insulating substrate 30 to have first and second contact holes 37a and 37b on the source and drain regions 32a and 32b, respectively. A source electrode 38a contacts the source region 32a via the first contact hole 37a. A data line 38 extending from the source electrode 38a crosses with the gate line 35 to define a pixel area. A drain electrode 38b having a predetermined shape contacts the drain region 32b via the second contact hole 37b. A protective layer 39 is formed over the insulating substrate 30 to have a third contact hole 40a in one area of the drain electrode 38b. A pixel electrode 41 is formed on one area of the pixel area to contact with the drain electrode 38b via the third contact hole 40a. A photosensitive organic layer 42 is formed over the insulating substrate 30 including the pixel electrode 41a.

The insulating interlayer 36 is formed of a silicon nitride ($SiN_x$) layer having a thickness of about 7.000 Å. The active layer 32 below the storage electrode 35b is doped with p type impurities to lower the resistance of the active layer 32. A storage capacitor is configured with the doped region of the active layer, the gate insulating layer 34 and the storage electrode 35b (indicated by 'A' in the drawing)).

In a pad area, as shown in FIG. 4, for applying signals to the gate line 35 and the data line 38, the buffer insulating layer 31, the gate insulating layer 34 and the insulating interlayer 36 are stacked on the insulating substrate 30. A first conductive layer 37c is patterned on one area of the insulating interlayer 36. The protective layer 39 having a pad contact hole 40b is formed on one area of the first conductive layer 37c. A pad electrode 41a is formed on the pad contact hole 40b and the protective layer 39 in the vicinity of the pad contact hole 40b. The photosensitive organic layer 42 is formed to open the pad electrode 41a.

The above-explained pad area is configured for a connection to an inside of the LCD panel via the pad electrode 41a and the first conductive layer 37c.

The first conductive layer 37c is formed of the same material of the source/drain electrode 38a/38b on the same layer. The pad electrode 41a is formed of the same material of the pixel electrode 41 on the same layer. The pad area can be used as a gate or data pad for applying a signal to the gate or data line of the LCD panel.

A method of fabricating the above-configured flat panel display device according to a related art is explained as follows. FIGS. 5A to 5H are cross-sectional diagrams for explaining a method of fabricating a flat panel display device according to a related art.

Referring to FIG. 5A, a buffer layer 31 is formed on an insulating substrate 30 on which an active area is defined. The insulating substrate 30 is formed of glass or the like. A polysilicon layer is deposited on the buffer layer 31 by chemical vapor deposition (CVD). An active layer 32 is then formed by selectively etching the polysilicon layer using a first mask for forming the active area.

Alternatively, the active layer 32 can be formed by depositing amorphous silicon and by crystallizing the deposited amorphous silicon by laser beam irradiation or the like. In doing so, the active layer is not formed on a pad area.

Referring to FIG. 5B, a photosensitive layer 33 is coated on the buffer layer 31 including the active layer 32 and is then selectively patterned to expose one area of the active layer by exposure and development using a second mask.

Subsequently, the patterned active layer 32 is doped with impurity ions by ion implantation. In doing so, the doped area corresponds to an active area below a storage electrode that will be formed later. The second mask is a doping mask for forming a storage capacitor. After completion of the ion implantation process, the photosensitive layer 33 is removed.

Referring to FIG. 5C, a gate insulating layer 34 is deposited over the insulating substrate 30 including the active layer 32. A gate forming material is formed of Al or Mo on the gate insulating layer 34 by sputtering.

Subsequently, the gate forming material is etched using a third mask for gate formation to form a gate line 35 running in one direction, a gate electrode 35a protruding from one side of the gate line 35 and a storage electrode 35b in a direction parallel to the gate line 35. Hence, a storage capacitor is configured with the doped active layer/gate insulating layer/storage electrode 32/34/35b in part.

The gate electrode 35a protrudes from one side to traverse a predetermined portion of the active layer 32. In this case, the pad area has the gate insulating layer 34 deposited thereon only.

A source region 32a and a drain region 32b are formed within the active layer 32 in the vicinity of both sides of the gate electrode 35a, respectively by implanting p type impurity ions using the gate electrode 35a and the storage electrode 35b as an ion blocking mask.

Referring to FIG. 5D, an insulating interlayer 36 is deposited on the gate insulating layer 34 including the gate line 35. In this case, the insulating interlayer 36 is formed of a silicon nitride layer about 7.000 Å thick.

Subsequently, first and second contact holes 37a and 37b are formed on the source and drain regions 32a and 32b, respectively using a fourth mask. In doing so, only the insulating interlayer 36 is formed on the pad area.

Referring to FIG. 5E, a metal layer is deposited over the substrate including the first and second contact holes 37a and 37b. The deposited metal layer is then patterned using a fifth mask to form a source electrode 38a in the first contact hole 37a and on the insulating interlayer 36 in the vicinity of the first contact hole 37a, a drain electrode 38b in the second contact hole 37b and on the insulating interlayer 36 in the vicinity of the second contact hole 37b, and a data line 38 formed in one body of the source electrode 38a to define a pixel area by crossing with the gate line 35 (cf. FIG. 3). In doing so, a first conductive layer 37c is formed on one area of the pad area.

Referring to FIG. 5F, a protective layer 39 is deposited over the substrate including the source and drain electrodes 38a and 38b and is then etched to form a third contact hole 40a exposing the drain electrode 38b using a sixth mask. In doing so, a pad contact hole 30b is formed at a portion of the first conductive layer 37c.

Referring to FIG. 5G, a transparent conductive material is deposited over the insulating substrate 30 including the third contact hole 40*a* and is then patterned to form a pixel electrode on a pixel area using a seventh mask. In doing so, a pad electrode 41 is formed in the pad contact hole 40*b* and on the protective layer 39 in the vicinity of the pad contact hole 40*b* in the pad area.

Referring to FIG. 5H, a photosensitive organic layer 42 is coated over the insulating substrate 30 including the pixel electrode 41 and the pad electrode 41*a*. The photosensitive organic layer 42 is then etched using an eighth mask to form a pad opening 43 that exposes the pad electrode 41*a* on the pad area.

A flat panel display device and fabricating method thereof according to another related art are explained as follows. FIG. 6 is a layout of a flat panel display device according to another related art, FIG. 7 is a cross-sectional diagram taken along a cutting line II-II' in FIG. 6, and FIGS. 8A to 8H are cross-sectional diagrams for explaining a method of fabricating a flat panel display device according to another related art.

A flat panel display device according to another related art relates to an active matrix organic light emitting device (AMOLED). The former related art flat panel display device differs from the latter related art flat panel display only in that a bank area 44 is formed on a flat portion of the pixel electrode 41 to form an organic electroluminescent device thereon. Hence, the explanation of the latter related art flat panel display is skipped in the following description.

The steps shown in FIG. 8A to 8G of a method of fabricating the above-configured flat panel display device according to another related art equal to those of the former related art fabricating method. However, the step shown in FIG. 8H of the latter related art fabricating method differs from that in the former related art fabricating method only in that a bank area 44 is formed to expose a flat portion of a pixel electrode in forming a pad opening 43 in a pad area. Hence, the explanation of the latter related art fabrication method is skipped in the following. In this case, the bank area is for forming an organic electroluminescent device thereon.

In forming the bank area, a photosensitive organic layer 42 formed of such a material as polyimide and photoacryl is used to be selectively removed by dry etching. If an inorganic layer is used to be dry-etched instead of the photosensitive organic layer, the pixel electrode is damaged and has an uneven surface. Hence, light-emitting endurance of the AM-OLED may be reduced.

Moreover, although not shown in the drawings, in forming the bank area in a cell area, the photosensitive organic layer 42 of the pad area can be formed to partially expose a pad electrode 41*a* only or can be entirely removed.

However, the related art flat panel display devices and fabricating methods thereof have the following problem. To form the storage capacitor between the doped active layer/gate insulating layer/storage electrode in fabricating the line-inversion LCD or AMOLED, the active layer is separately doped using the storage doping mask. Hence, the corresponding process becomes complicated and the number of masks is raised. Namely, since an additional mask is needed to form the storage capacitor, the number of masks is increased, which lowers productivity.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIGS. 5A to 5H are cross-sectional diagrams for explaining a method of fabricating a flat panel display device according to a related art;

FIGS. 8A to 8H are cross-sectional diagrams for explaining a method of fabricating a flat panel display device according to another related art;

FIGS. 11A to 11F are cross-sectional diagrams for explaining a method of fabricating a flat panel display device according to a first embodiment of the present invention;

FIGS. 14A to 14F are cross-sectional diagrams for explaining a method of fabricating a flat panel display device according to a second embodiment of the present invention;

FIGS. 19A to 19F are cross-sectional diagrams for explaining a method of fabricating a flat panel display device applicable to the present invention;

FIGS. 22A to 22I are cross-sectional diagrams for explaining a method of fabricating a flat panel display device according to a third embodiment of the present invention;

FIGS. 24A to 24I are cross-sectional diagrams for explaining a method of fabricating a flat panel display device according to a fourth embodiment of the present invention.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

First of all, a flat panel display device and fabricating method thereof according to a preferred embodiment of the present invention are explained with reference to the attached drawings as follows.

First Embodiment

A flat panel display device according to a first embodiment of the present invention is explained as follows.

Figure 9:
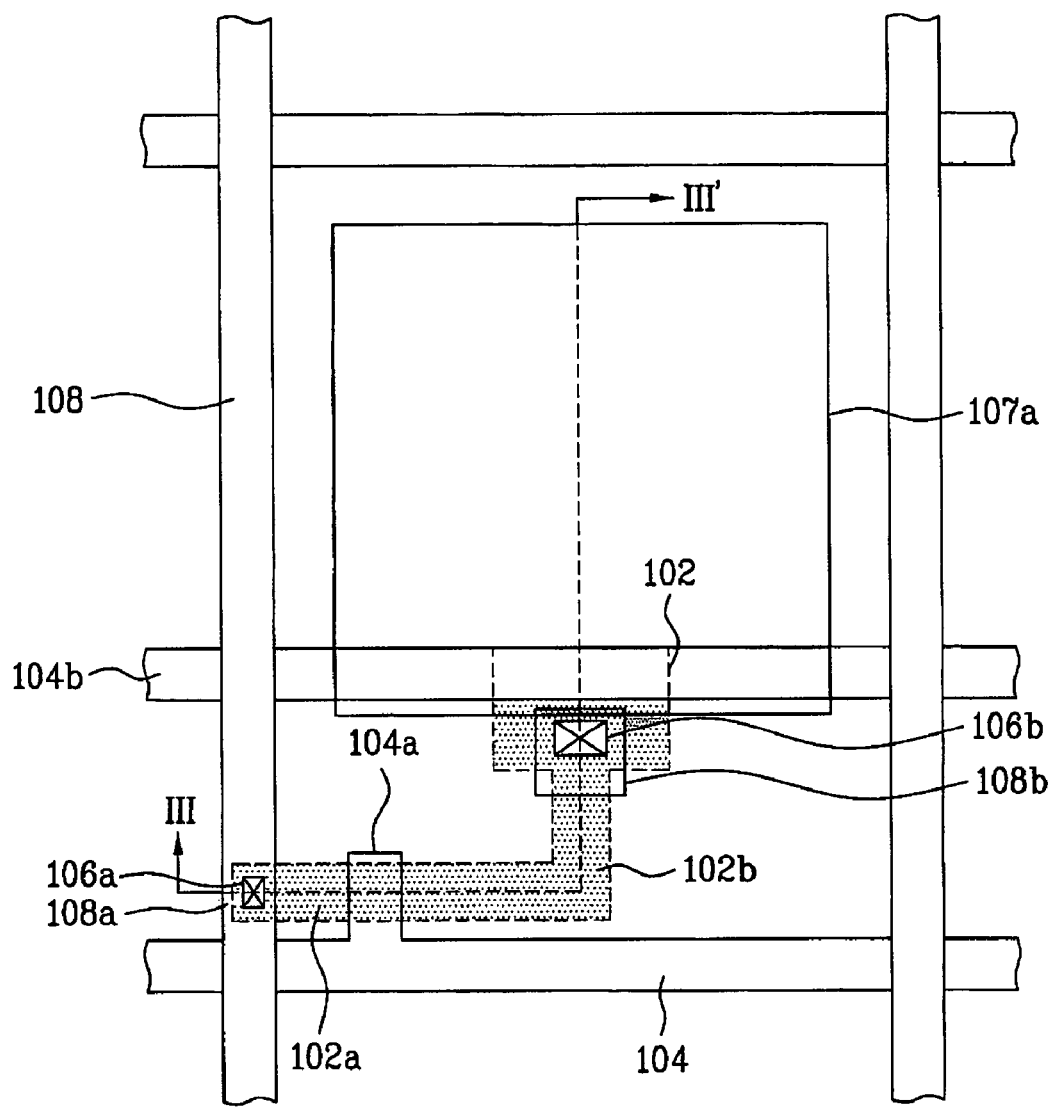
FIG. 9 is a layout of a flat panel display device according to a first embodiment of the present invention.
Figure 10:
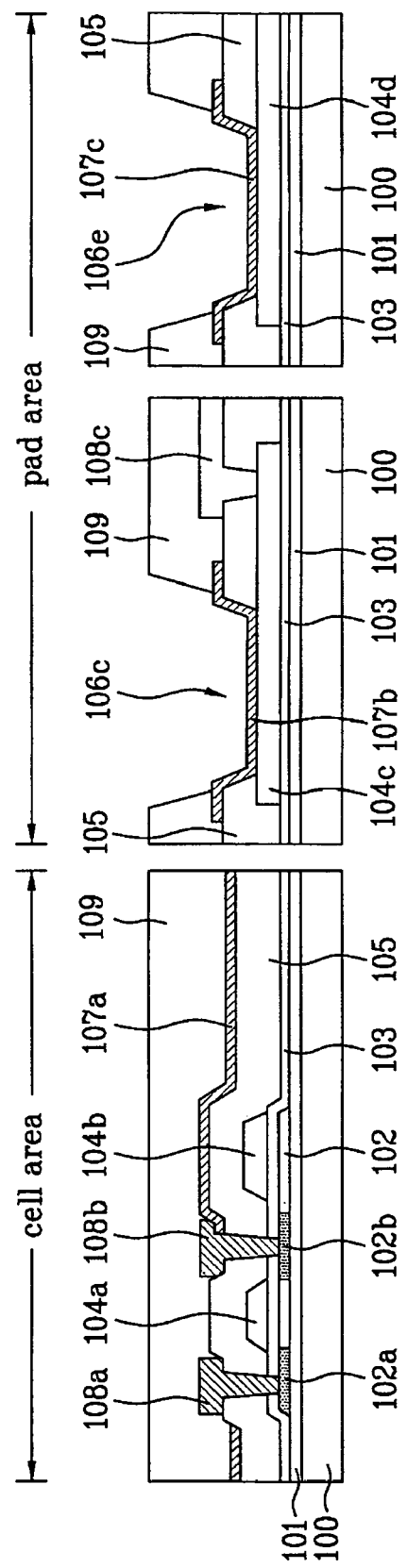
FIG. 10 is a cross-sectional diagram taken along a cutting line III-III' in FIG. 9.
Figure 15:
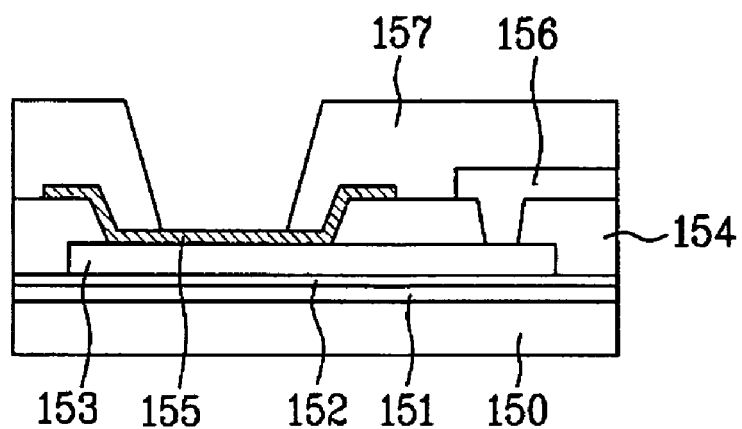
FIG. 15 and FIG. 16 are exemplary cross-sectional diagrams of pad areas, respectively.
Figure 16:
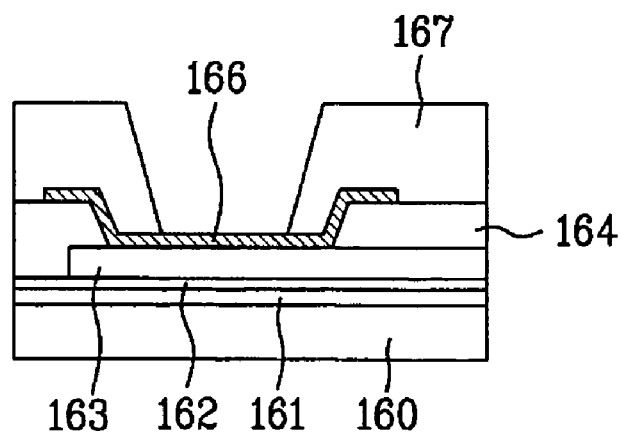

FIG. 9 is a layout of a flat panel display device according to a first embodiment of the present invention, FIG. 10 is a cross-sectional diagram taken along a cutting line III-III' in FIG. 9, and FIG. 15 and FIG. 16 are exemplary cross-sectional diagrams of pad areas, respectively.

A first embodiment of the present invention relates to a P type LTPS (low temperature polysilicon) (PMOS) LCD device suitable for line inversion drive.

Referring to FIG. 9 and FIG. 10, a buffer layer 101 is formed on an insulating substrate 100. An active layer 102 is patterned on the buffer layer 101. A gate insulating layer 103 is formed over the insulating substrate 100 including the active layer 102. A gate line 104 is arranged on one area of the gate insulating layer 103 in one direction. A gate electrode 104a protrudes from one side of the gate line 104. A storage electrode 104b is arranged in a direction parallel to the gate line 104 to traverse the active layer 102. Source and drain regions 102a and 102b doped with p type impurities are provided within the active layer 102 in the vicinity of both sides of the gate electrode 104a, respectively. An insulating interlayer 105 is formed over the insulating substrate 100 to have first and second contact holes 106a and 106b on the source and drain regions 102a and 102b, respectively. A pixel electrode 107a is formed on one area of a pixel area excluding the first and second contact holes 106a and 106b. A source electrode 108a contacts the source region 102a via the first contact hole 106a. A data line 108 extending from the source electrode 108a crosses with the gate line 104 to define a pixel area. A drain electrode 108b contacts with the drain region 102b via the second contact hole 106b to have a predetermined shape directly contacting the pixel electrode 107a. A protective layer 109 is formed over the insulating substrate 100 including the source and drain electrodes 108a and 108b and the pixel electrode 107a.

The insulating interlayer 105 is formed of a silicon nitride ($SiN_x$) layer to have a thickness of about 2,000~3,000 Å. So, a storage capacitor is configured between the storage electrode/insulating interlayer/pixel electrode 104b/105/107a or between the storage electrode/insulating interlayer/drain electrode 104b/105/108b (indicated by area-'B' in the drawing). As the storage capacitor is configured in the above manner, the active layer 102 below the storage electrode 104b is not doped.

The pixel electrode 107a is formed of indium tin oxide (ITO), tin oxide (TO), indium zinc oxide (IZO) or indium tin zinc oxide (ITZO).

The protective layer 109 protects the device and is formed of an inorganic insulator such as silicon nitride ($SiN_x$) or an organic insulator such as acrylic organic compound, BCB (benzocyclobutene), PFCB and the like.

One area (not shown in the drawing) of the pixel electrode 107a is formed open and flat. The pad area for applying signals to the gate and data lines 104 and 108 within an LCD panel can be implemented into two types shown in FIG. 10 or into other types shown in FIG. 15 and FIG. 16, respectively.

Referring to FIG. 10, a buffer insulating layer 101 and a gate insulating layer 103 are stacked on an insulating substrate 100. A first conductive layer 104c is patterned on one area of the gate insulating layer 103. An insulating interlayer 105 having first and second pad contact holes 106c and 106d therein is formed on one area of the first conductive layer 104c. A pad electrode 107b is formed in the first pad contact hole 106c and on the insulating interlayer 105 in the vicinity of the first pad contact hole 106c. A second conductive layer 108c is formed in the second pad contact hole 106d and on the insulating interlayer 105 to extend in one direction. A protective layer 109 is formed over the substrate 100 to expose the pad electrode 107b in the first pad contact hole 106c.

The pad area is configured for a connection to an inside of an LCD panel via the pad electrode 107b, the first conductive layer 104c and the second conductive layer 108c. Namely, the pad area is configured to apply a signal to the inside of the LCD panel via the second conductive layer 108c.

Alternatively, the pad area can be configured for a connection to gate and data lines by means of the first conductive layer 104d, which is connected to the pad electrode 107c, directly extending to the inside of the LCD panel without the second conductive layer 108c.

The first conductive layer 104c or 104d is formed of the same material of the gate electrode 104a. The pad electrode 107b or 107c is formed of the same material of the pixel electrode 107a on the same layer. The second conductive layer 108c is formed of the same material of the source/drain electrode 108a/108b on the same layer.

The pad opening is configured to expose both tilted sides of the pad electrode 107b or 107c. The pad opening, as shown in FIG. 15 or FIG. 16, can be configured so that a protective layer 157 or 167 can enclose both tilted sides of a pad electrode 155 or 166.

In preventing electro-chemical corrosion, the configuration of providing the first conductive layer to the inside of the LCD panel directly is superior to the other configuration of applying the signal to the inside of the LCD panel via the second conductive layer. Each of the pad areas is usable as a gate or data pad for applying a signal to the gate or data line of the LCD panel.

A method of fabricating the above-configured flat panel display device according to the first embodiment of the present invention is explained as follows.

FIGS. 11A to 11F are cross-sectional diagrams for explaining a method of fabricating a flat panel display device according to a first embodiment of the present invention.

Figure 11A:
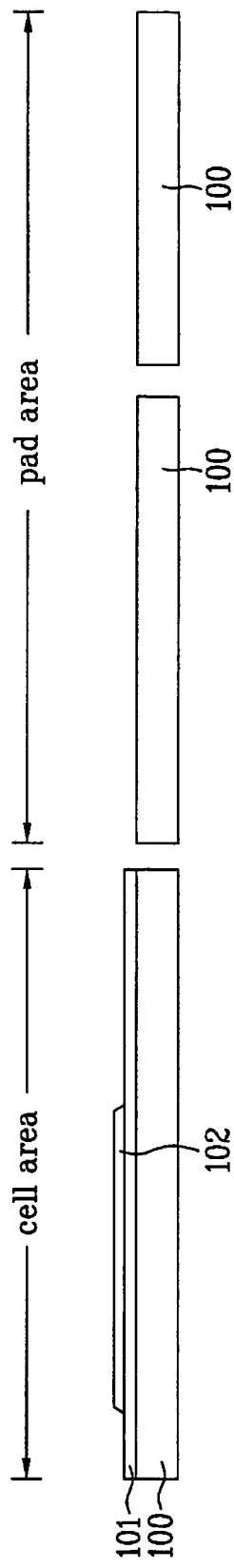

Referring to FIG. 11A, a buffer layer 101 is formed on an insulating substrate 100 on which an active area is defined. The insulating substrate 100 is formed of glass or the like.

A polysilicon layer is deposited on the buffer layer 101 by chemical vapor deposition (CVD). An active layer 102 is then formed by selectively etching the polysilicon layer using a first mask for forming the active area. Alternatively, the active layer 102 can be formed by depositing amorphous silicon and by crystallizing the deposited amorphous silicon by laser beam irradiation or the like.

The buffer layer 101 prevents impurities of the insulating substrate 100 from diffusing into the active area and eventually plays a role in cutting off heat in laser crystallization. However, the active layer 102 is not formed on a pad area.

Figure 11B:
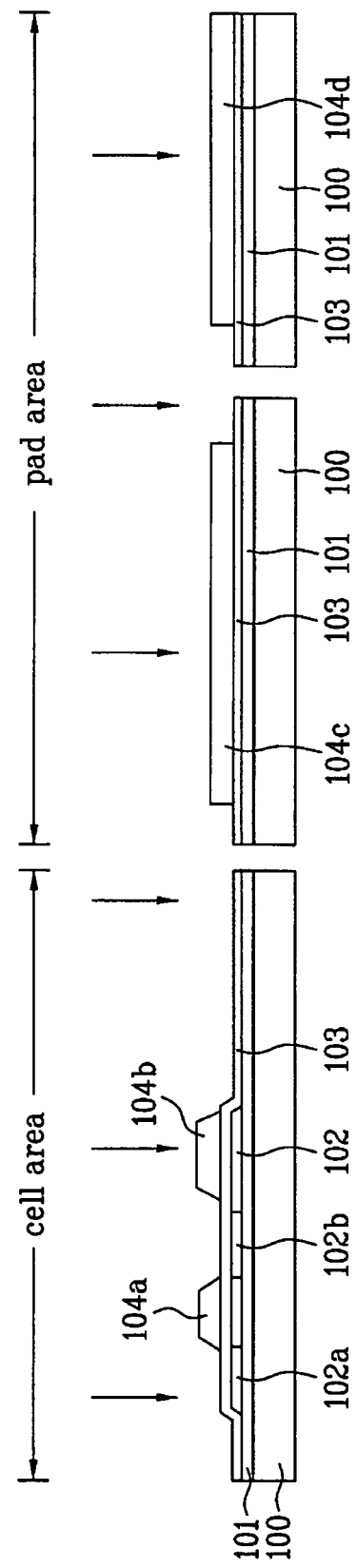

Referring to FIG. 11b, a gate insulating layer 103 is deposited on the buffer layer 101 including the active layer 102. A gate forming material is formed of Al or Mo on the gate insulating layer 103 by sputtering.

Subsequently, the gate forming material is selectively etched using a second mask for gate formation to form a gate line 104 running in one direction, a gate electrode 104a protruding from one side of the gate line 104 and a storage electrode 104b in a direction parallel to the gate line 104. The gate electrode 104a protrudes from one side to traverse a predetermined portion of the active layer 102. First conductive layers 104c and 104d are formed on the pad area.

A source region 102a and a drain region 102b are formed within the active layer 102 in the vicinity of both sides of the gate electrode 104a, respectively by implanting p type impurity ions using the gate electrode 104a and the storage electrode 104b as an ion blocking mask.

Referring to FIG. 11C, an insulating interlayer 105 is deposited on the gate insulating layer 103 including the gate line 104. Subsequently, first and second contact holes 106a and 106b are formed on the source and drain regions 102a and 102b, respectively using a third mask. In doing so, first and second pad contact holes 106c and 106d are formed on the pad area.

Referring to FIG. 11D, a transparent conductive layer is deposited over the insulating substrate 100 and is then patterned to form a pixel electrode 107a on a pixel area using a fourth mask. Indium tin oxide (ITO), tin oxide (TO), indium zinc oxide (IZO) or indium tin zinc oxide (ITZO) is used as the transparent conductive layer. A pad electrode 107b is formed in the first pad contact hole 106c and on the insulating interlayer 105 in the vicinity of the first pad contact hole 106c.

Referring to FIG. 11E, a metal layer is deposited over the substrate including the first and second contact holes 106a and 106b. The deposited metal layer is then patterned using a fifth mask to form a source electrode 108a in the first contact hole 106a and on the insulating interlayer 105 in the vicinity of the first contact hole 106a, a drain electrode 108b in the second contact hole 106b and on the insulating interlayer 105 in the vicinity of the second contact hole 106b, and a data line 108 formed in one body of the source electrode 108a to define a pixel area by crossing with the gate line 104 (cf. FIG. 9). In this case, a lower side of the drain electrode 108b directly contacts the pixel electrode 107a.

In an area-B, a storage capacitor is configured between the storage electrode/insulating interlayer/pixel electrode 104b/105/107a or between the storage electrode/insulating interlayer/drain electrode 104b/105/108b. In doing so, a second conductive layer 108c is formed in the second pad contact hole 106d of the pad area and on the insulating interlayer 105 in the vicinity of the second pad contact hole 106d of the pad area.

Referring to FIG. 11F, a protective layer 109 is deposited over the substrate 100 including the source and drain electrodes 108a and 108b. In the pad area, the protective layer 109 is then etched to form a pad opening that exposes both tilted sides of the pad electrode 107b using a sixth mask. In forming the pad opening, etching of the protective layer 109 to expose the pixel electrode 107a in the cell area may be avoided. The protective layer 109 can be formed of an inorganic insulator such as silicon nitride ($SiN_x$) or an organic insulator such as acrylic organic compound, BCB (benzocyclobutene), PFCB and the like.

In the above process, the pad area is configured to expose both of the tilted sides of the pad electrodes 107b and 107c. Alternatively, the pad opening, as shown in FIG. 15 or FIG. 16, can be configured so that a protective layer 157 or 167 can enclose both tilted sides of a pad electrode 155 or 166.

In the pad area, to prevent electro-chemical corrosion, the first conductive layer is provided directly on the inside of the LCD panel. This structure is superior to the other configuration of applying the signal to the inside of the LCD panel via the second conductive layer.

Second Embodiment

A flat panel display device according to a second embodiment of the present invention is explained as follows.

Figure 12:
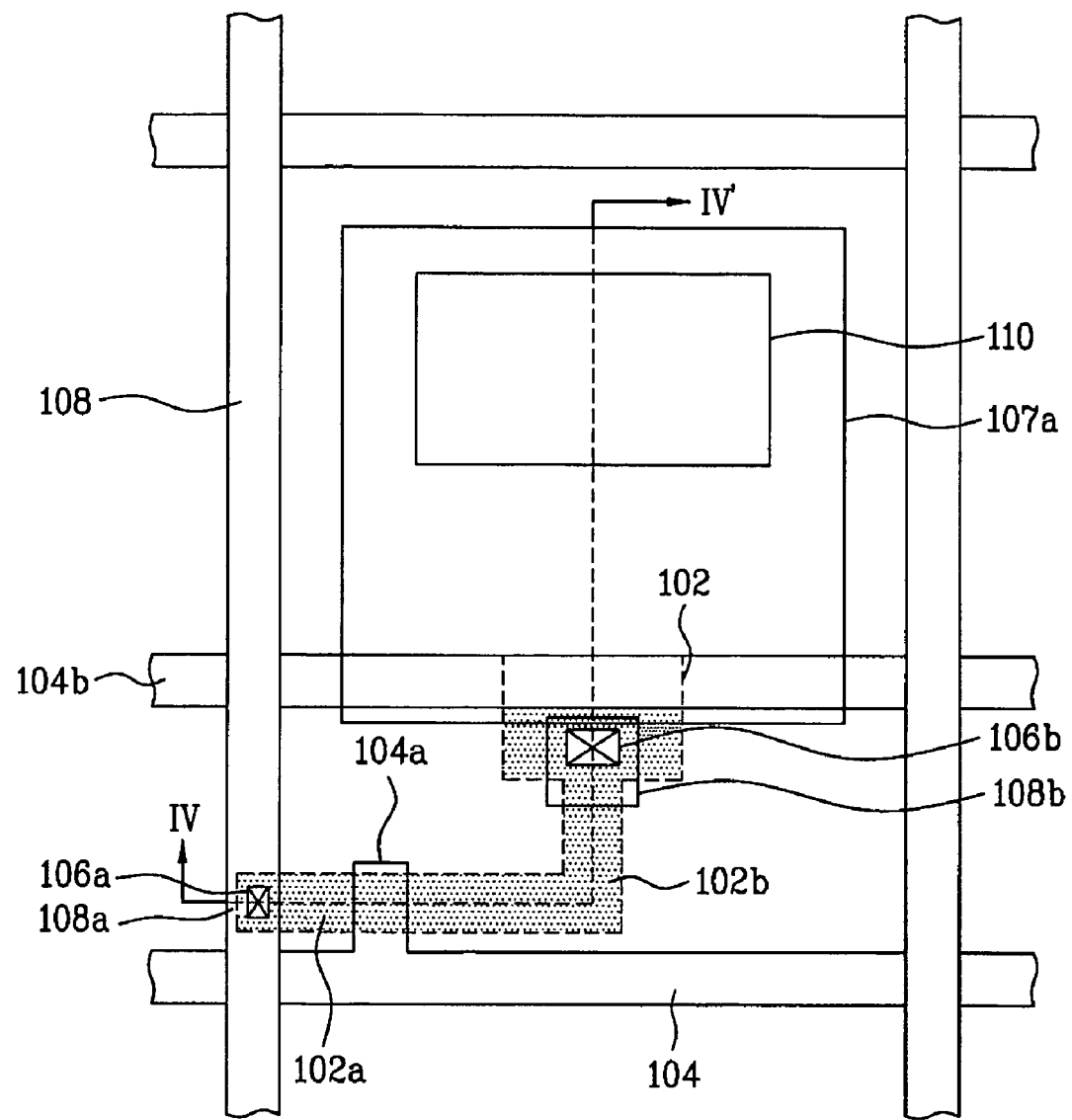
FIG. 12 is a layout of a flat panel display device according to a second embodiment of the present invention.
Figure 13:
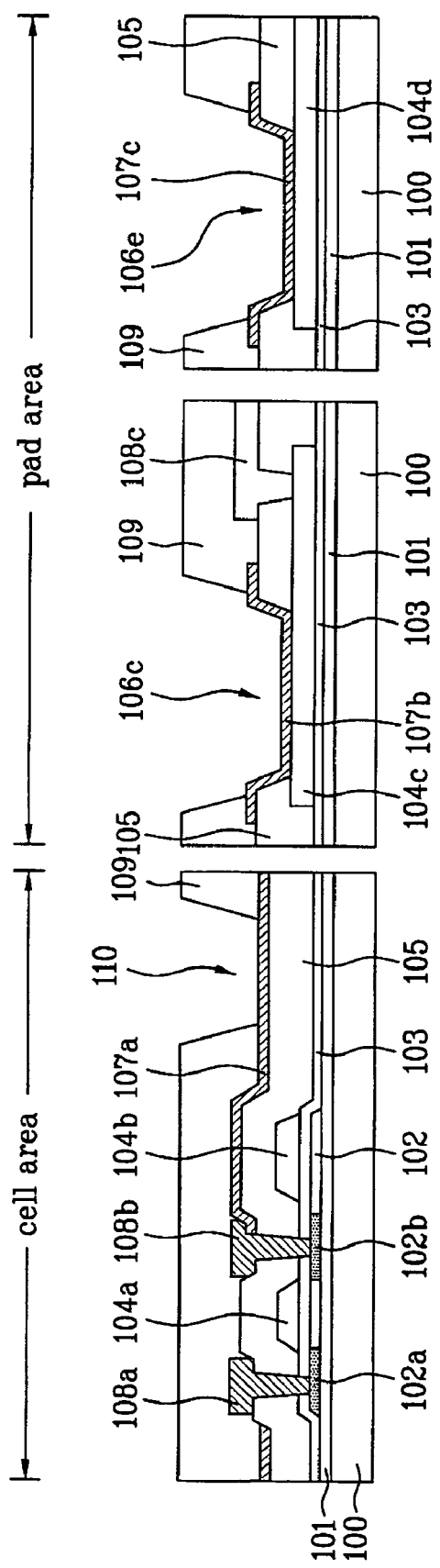
FIG. 13 is a cross-sectional diagram taken along a cutting line IV-IV' in FIG. 12.

FIG. 12 is a layout of a flat panel display device according to a second embodiment of the present invention, FIG. 13 is a cross-sectional diagram taken along a cutting line IV-IV' in FIG. 12.

FIG. 15 and FIG. 16 are exemplary cross-sectional diagrams of pad areas, respectively.

A second embodiment of the present invention relates to an active matrix organic light emitting device (AM-OLED) suitable for line inversion drive.

Referring to FIG. 12 and FIG. 13, a buffer layer 101 is formed on an insulating substrate 100. An active layer 102 is patterned on the buffer layer 101. A gate insulating layer 103 is formed over the insulating substrate 100 including the active layer 102. A gate line 104 is arranged on one area of the gate insulating layer 103 in one direction. A gate electrode 104a protrudes from one side of the gate line 104. A storage electrode 104b is arranged in a direction parallel to the gate line 104 to traverse the active layer 102. Source and drain regions 102a and 102b doped with p type impurities are provided within the active layer 102 in the vicinity of both sides of the gate electrode 104a, respectively. An insulating interlayer 105 is formed over the insulating substrate 100 to have first and second contact holes 106a and 106b on the source and drain regions 102a and 102b, respectively. A pixel electrode 107a is formed on one area of a pixel area excluding the first and second contact holes 106a and 106b. A source electrode 108a contacts the source region 102a via the first contact hole 106a. A data line 108 extending from the source electrode 108a crosses with the gate line 104 to define a pixel area. A drain electrode 108b contacts the drain region 102b via the second contact hole 106b to have a predetermined shape directly contacting with the pixel electrode 107a. A protective layer 109 is formed over the insulating substrate 100 including the source and drain electrodes 108a and 108b and the pixel electrode 107a. A bank area 110 is formed flat to expose one area of the pixel electrode 107a. The bank area 110 is where an organic electroluminescent device will be formed later.

The insulating interlayer 105 is formed of a silicon nitride ($SiN_x$) layer having a thickness of about 2,000~3,000 Å.

A storage capacitor is configured between the storage electrode/insulating interlayer/pixel electrode 104b/105/107a or between the storage electrode/insulating interlayer/drain electrode 104b/105/108b (indicated by area-'B' in the drawing). As the storage capacitor is configured in the above manner, the active layer 102 below the storage electrode 104b is not doped.

The pixel electrode 107a is formed of indium tin oxide (ITO), tin oxide (TO), indium zinc oxide (IZO) or indium tin zinc oxide (ITZO). The protective layer 109 is formed of an organic insulator such as acrylic organic compound, BCB (benzocyclobutene), PFCB and the like.

The bank area 110 is formed to secure a flat anode electrode thereon in forming the organic EL device layer. Hence, the bank area 110 is formed on a flat part of the pixel electrode 107a.

Figure 1:
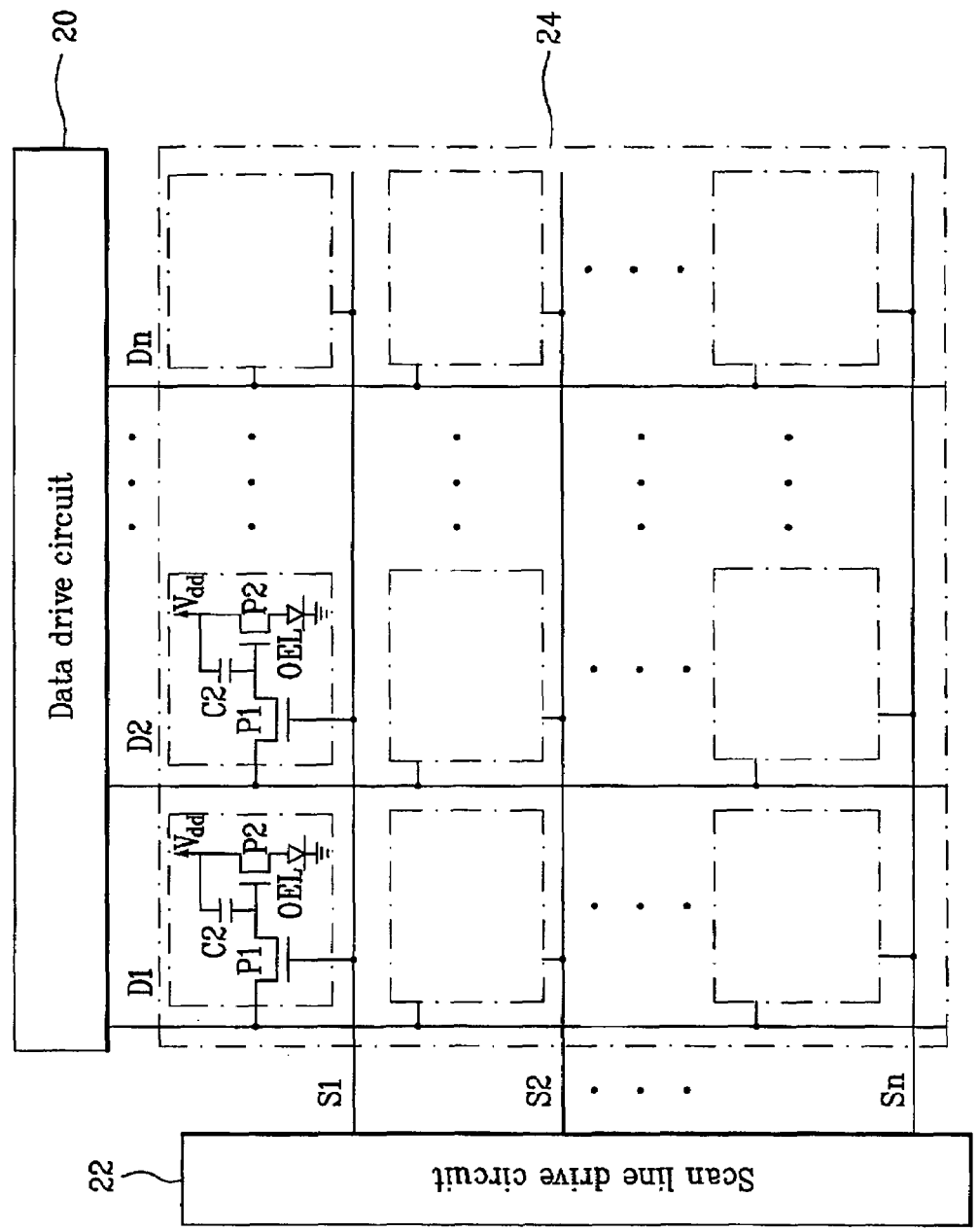
FIG. 1 is a layout of a flat panel display device having a general AM-OLED.
Figure 2:
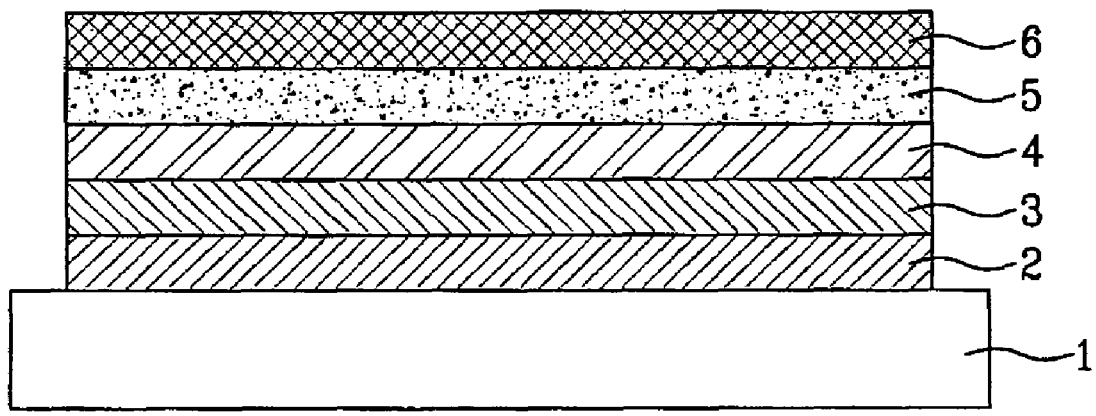
FIG. 2 is a cross-sectional diagram of a general organic light-emitting device.
Figure 3:
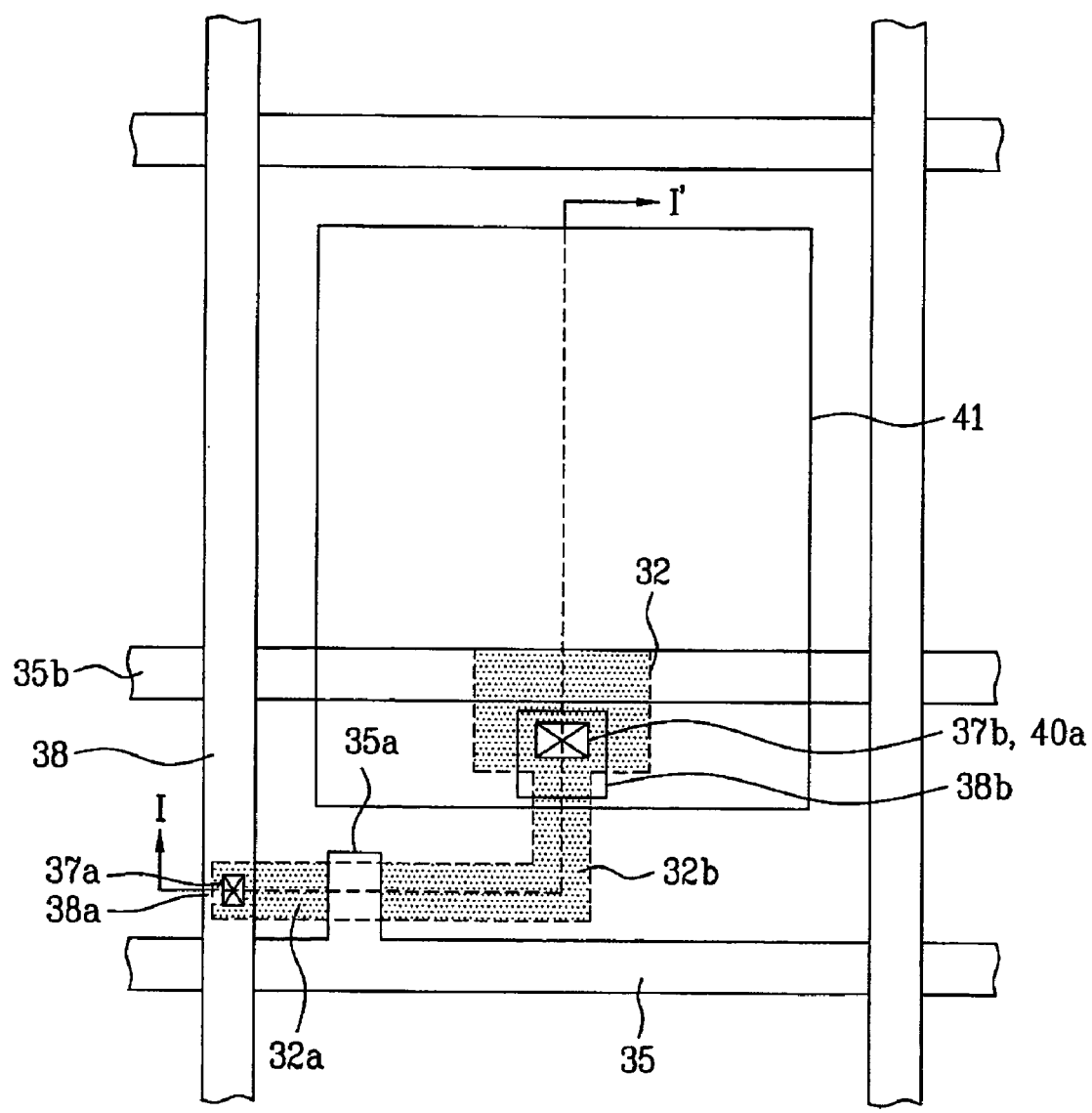
FIG. 3 is a layout of a flat panel display device according to a related art.
Figure 4:
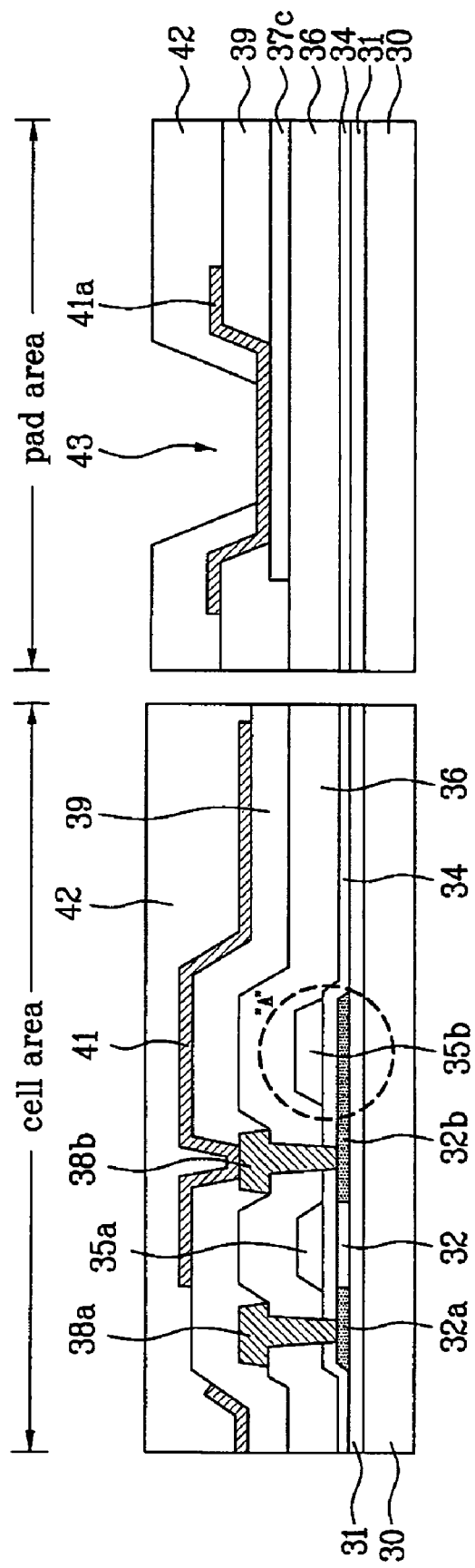
FIG. 4 is a cross-sectional diagram taken along a cutting line I-I' in FIG. 3.
Figure 5E:
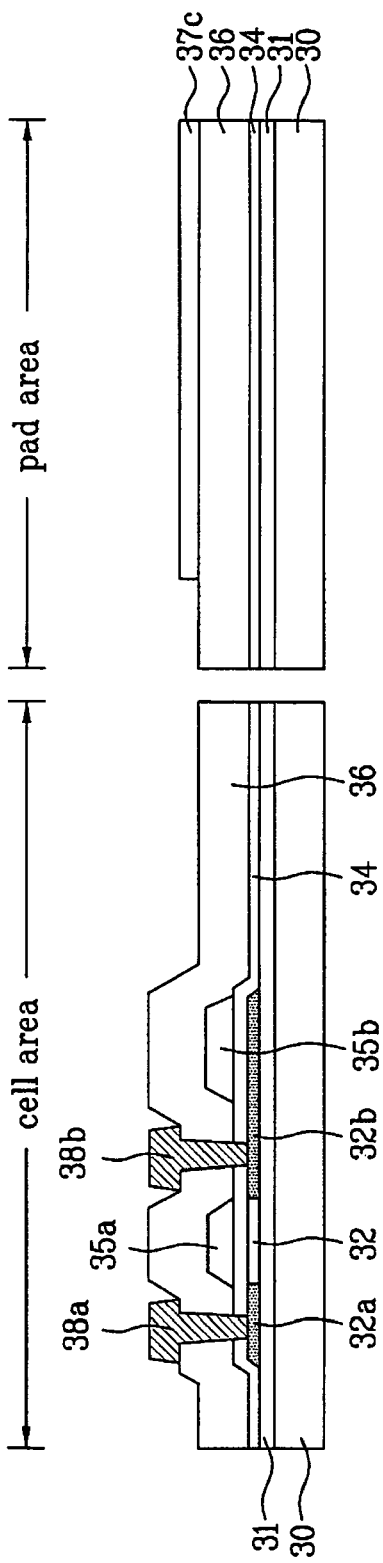
Figure 5F:
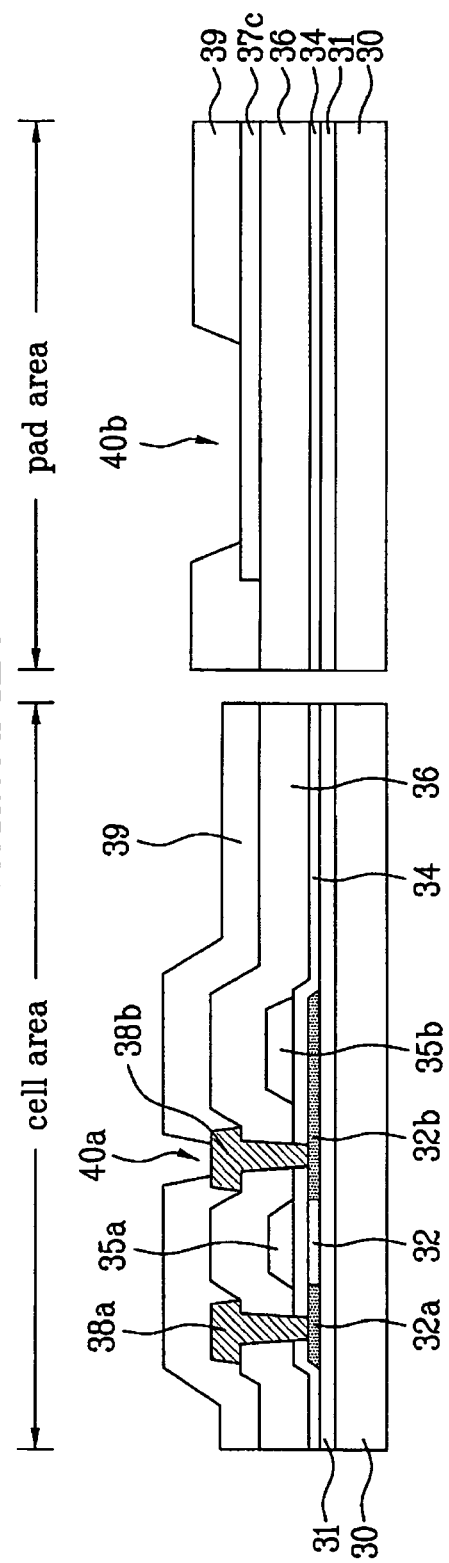
Figure 5G:
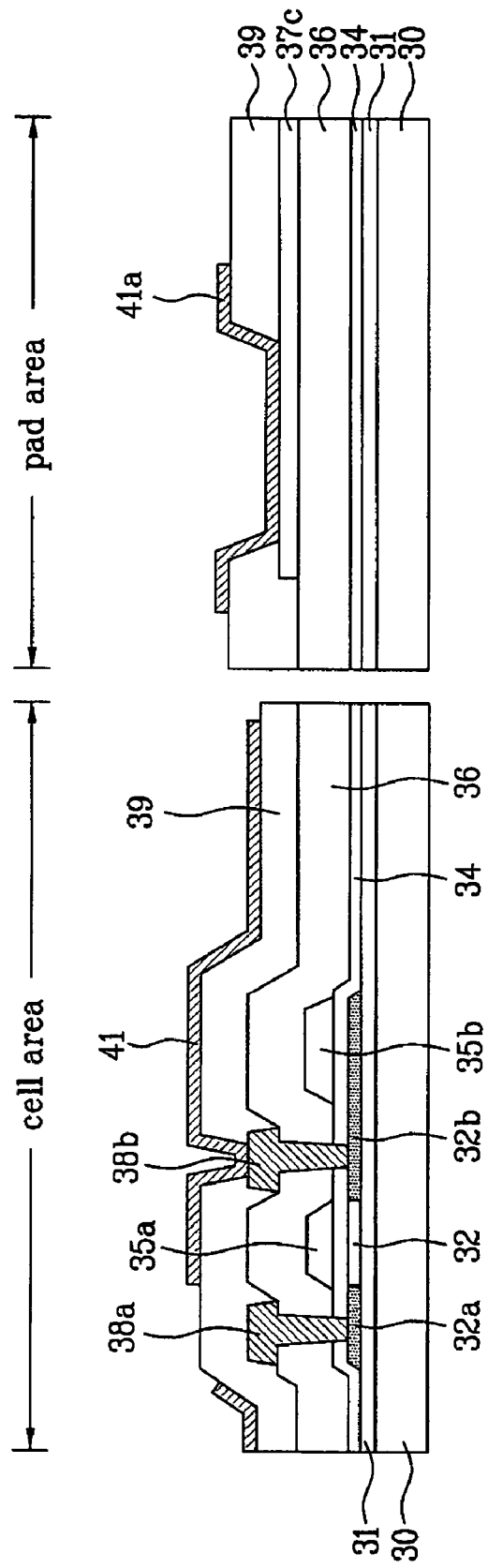
Figure 5H:
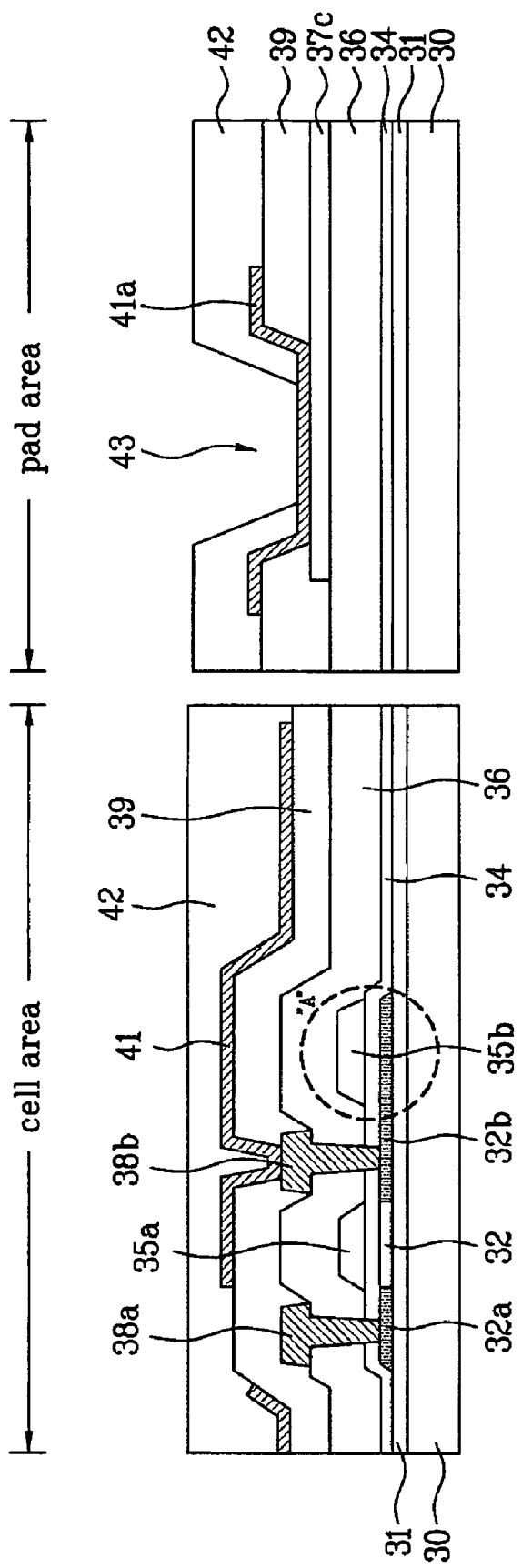
Figure 6:
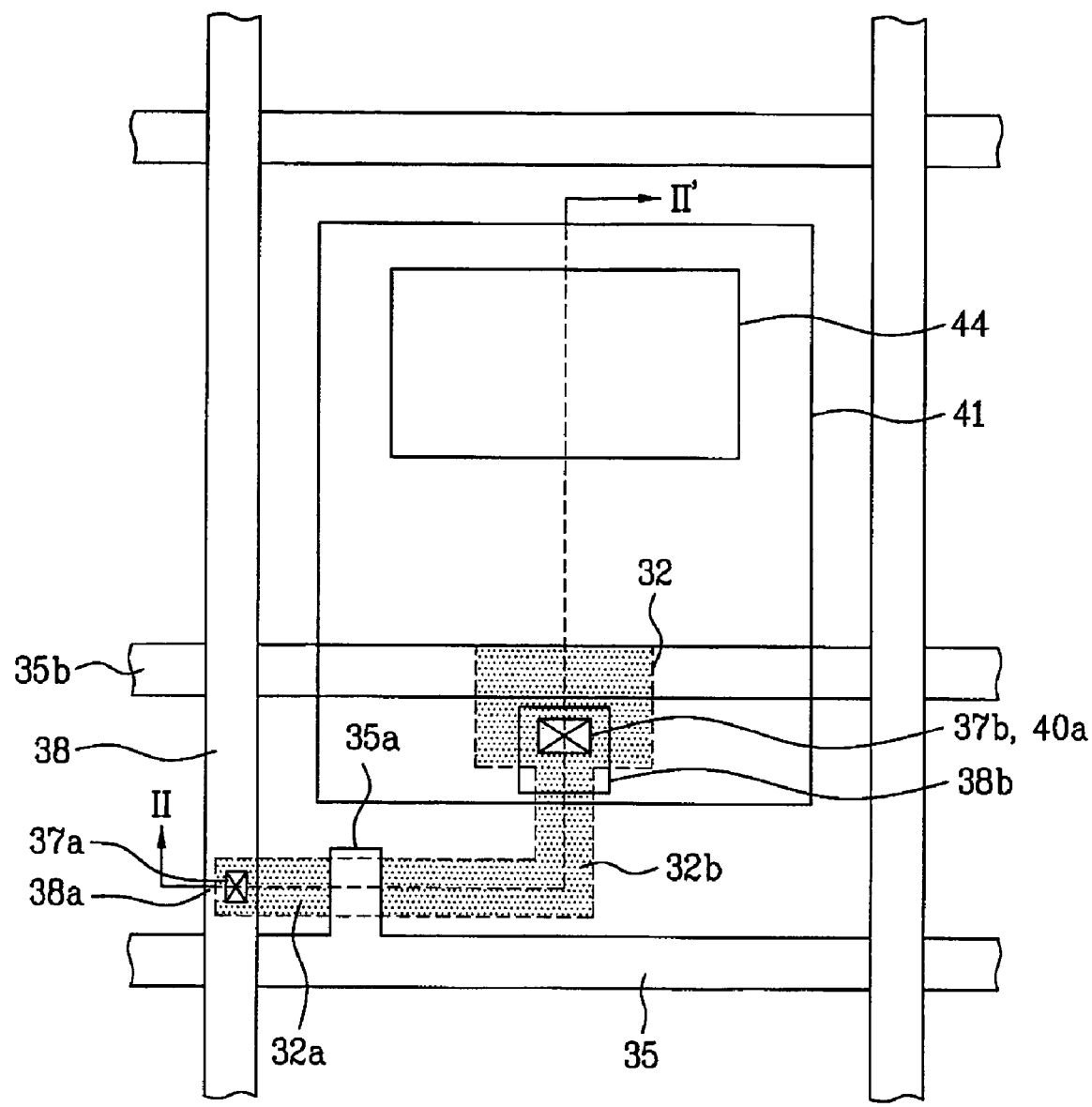
FIG. 6 is a layout of a flat panel display device according to another related art.
Figure 7:
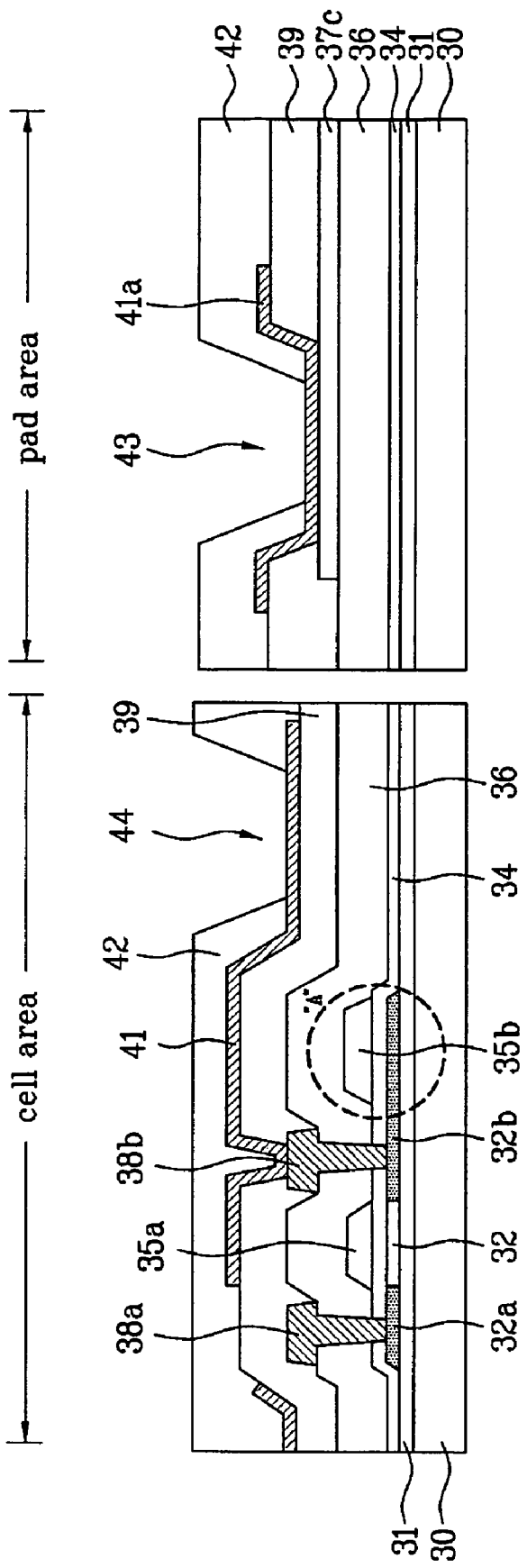
FIG. 7 is a cross-sectional diagram taken along a cutting line II-II' in FIG. 6.
Figure 8A:
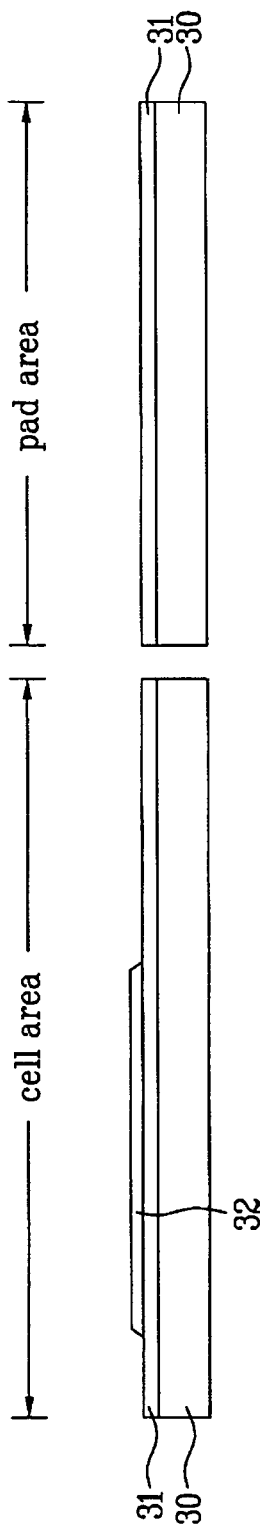
Figure 8B:
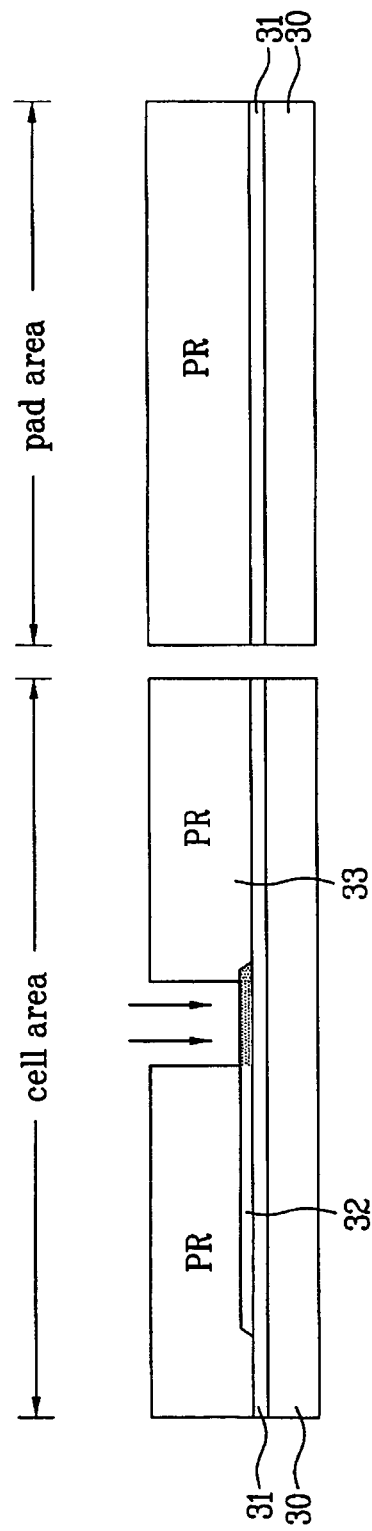
Figure 8E:
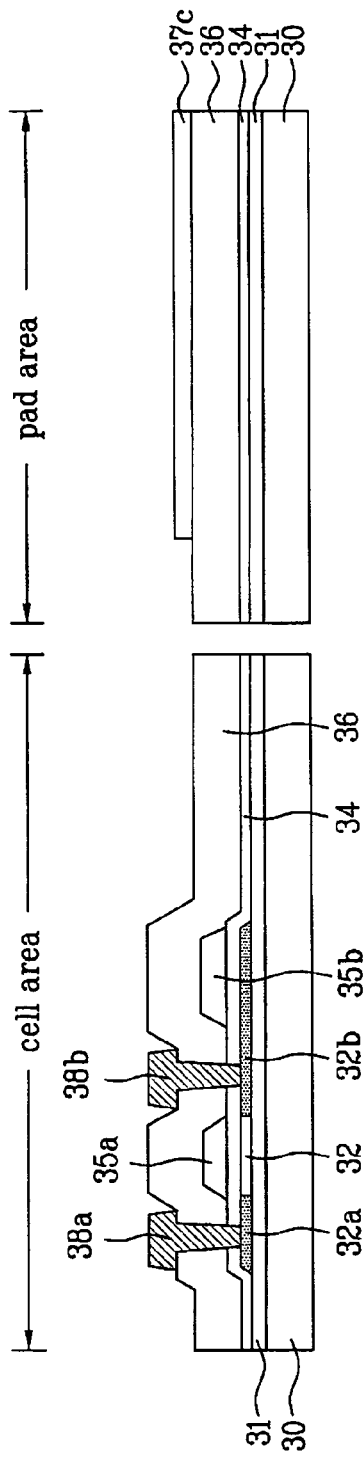
Figure 8F:
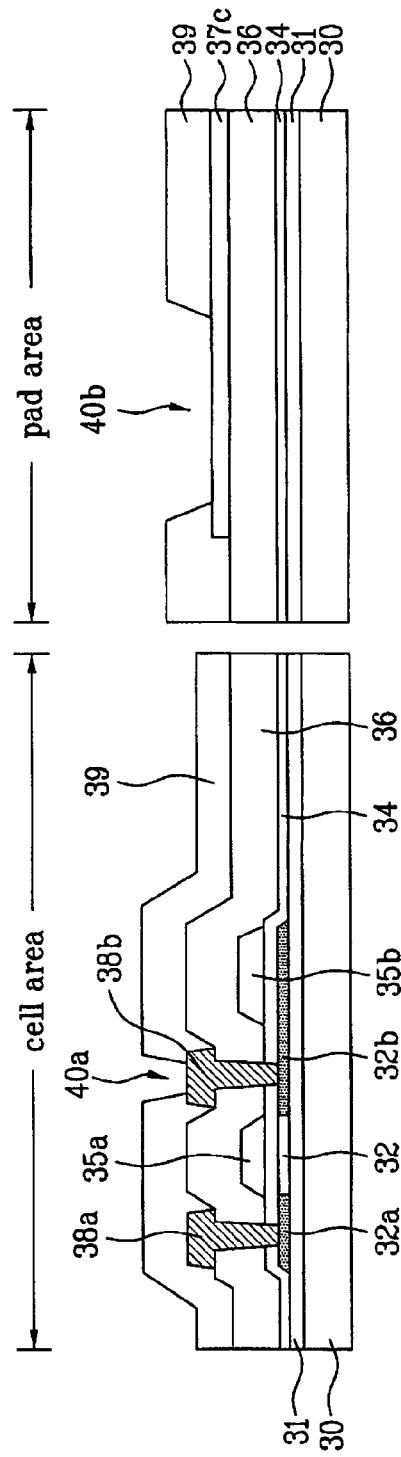
Figure 8G:
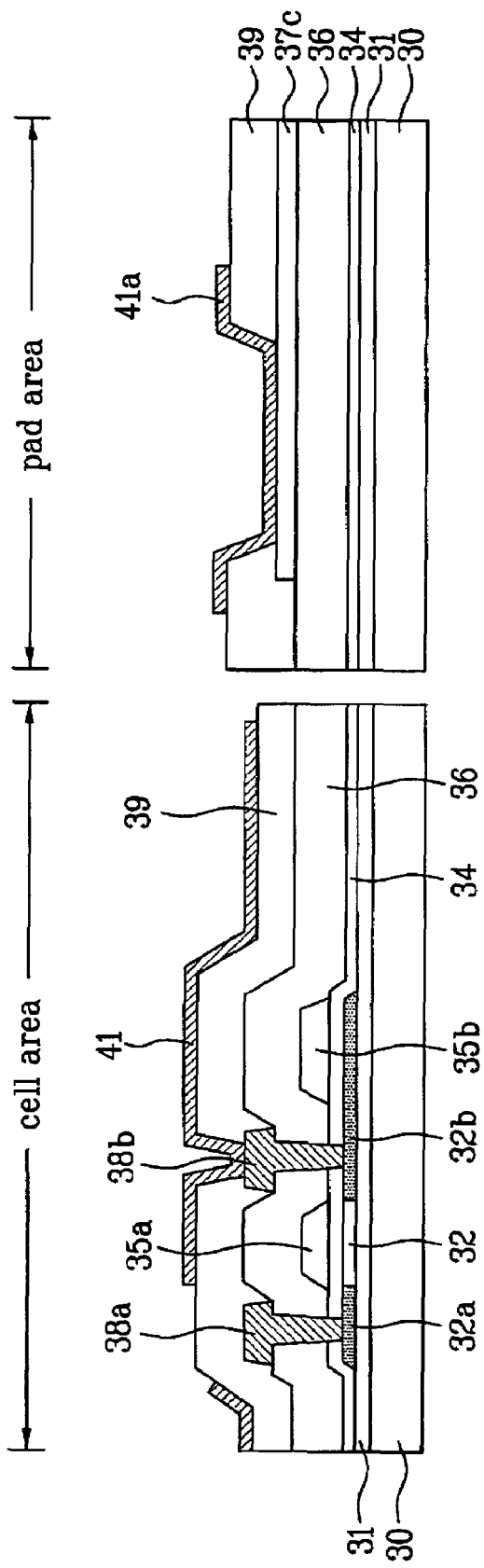
Figure 8H:
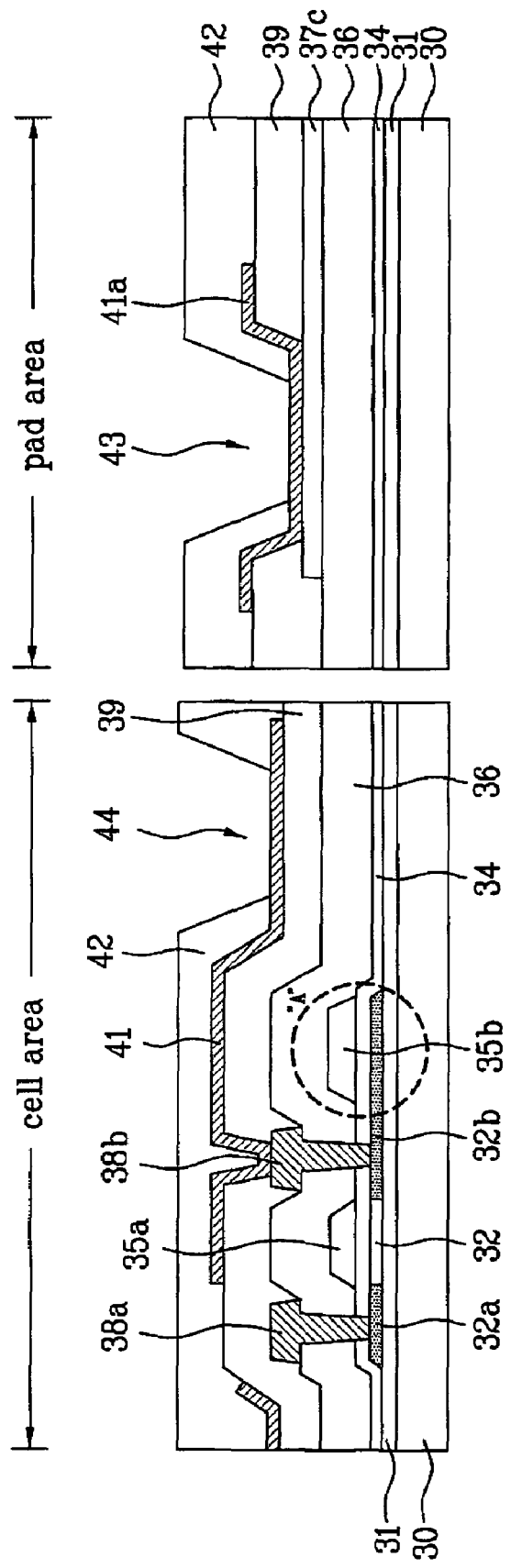

A general organic EL device is used as the organic EL device. The organic EL device, as shown in FIG. 2, includes an anode electrode 2 with a transparent electrode pattern, a hole injection layer 3 on the anode electrode 2, an emitting layer 4 on the hole injection layer 3, an electron injection layer 5 on the emitting layer 4, and a cathode electrode 6 on the electron injection layer 5. The cathode electrode 6 is formed of a metal electrode.

In the organic EL device, once a drive voltage is applied between the anode and cathode electrodes 2 and 6, holes within the hole injection layer 3 and electrons within the electron injection layer 5 proceed to the emitting layer 4 so that the emitting layer 4 emits visible light by excitation. Hence, the visible light emitted from the emitting layer can display an image or video.

In this case, the anode electrode 2 corresponds to the pixel electrode 107a in FIG. 12 or FIG. 13. Hence, the hole injection layer, the emitting layer, the electron injection layer and the cathode electrode sequentially stacked on the pixel electrode 107a configure an active matrix organic light emitting device (AM-OLED).

The bank area 110 is formed on the flat part of the pixel electrode 107a. If the bank area 110 is formed on a tilted part of the anode electrode, an electric field is concentrated on a tilted corner of the stacked hole injection layer, emitting layer, electron injection layer and cathode electrode so that the tilted corner is easily degraded to reduce the endurance of the device.

The pad area for applying signals to the gate and data lines 104 and 108 within an LCD panel can be implemented into two types shown in FIG. 13 or into other types shown in FIG. 15 and FIG. 16, respectively.

Referring to FIG. 13, a buffer insulating layer 101 and a gate insulating layer 103 are stacked on an insulating substrate 100. A first conductive layer 104c is patterned on one area of the gate insulating layer 103. An insulating interlayer 105 having first and second pad contact holes 106c and 106d therein is formed on one area of the first conductive layer 104c. A pad electrode 107b is formed in the first pad contact hole 106c and on the insulating interlayer 105 in the vicinity of the first pad contact hole 106c. A second conductive layer 108c is formed in the second pad contact hole 106c and on the insulating interlayer 105 to extend in one direction. A protective layer 109 is formed over the substrate to expose the pad electrode 107b in the first pad contact hole 106c.

The pad area is configured for a connection to an inside of an LCD panel via the pad electrode 107b, the first conductive layer 104c and the second conductive layer 108c. Namely, the pad area is configured to apply a signal to the inside of the LCD panel via the second conductive layer 108c.

Alternatively, the pad area can be configured for a connection to gate and data lines by means of the first conductive layer 104d, which is connected to the pad electrode 107c, directly extending to the inside of the LCD panel without the second conductive layer 108c.

The first conductive layer 104c or 104d is formed of the same material of the gate electrode 104a. The pad electrode 107b or 107c is formed of the same material of the pixel electrode 107a on the same layer. The second conductive layer 108c is formed of the same material of the source/drain electrode 108a/108b on the same layer.

In the two types of the pad areas, the pad opening is configured to expose both tilted sides of the pad electrode 107b or 107c. The pad opening, as shown in FIG. 15 or FIG. 16, can be configured so that a protective layer 157 or 167 can enclose both tilted sides of a pad electrode 155 or 166.

In preventing electro-chemical corrosion, providing the first conductive layer to the inside of the LCD panel directly is superior to the other configuration of applying the signal to the inside of the LCD panel via the second conductive layer. Each of the pad areas is usable as a gate or data pad for applying a signal to the gate or data line of the LCD panel.

A method of fabricating the above-configured flat panel display device according to the second embodiment of the present invention is explained as follows.

FIGS. 14A to 14F are cross-sectional diagrams for explaining a method of fabricating a flat panel display device according to a second embodiment of the present invention.

Figure 14A:
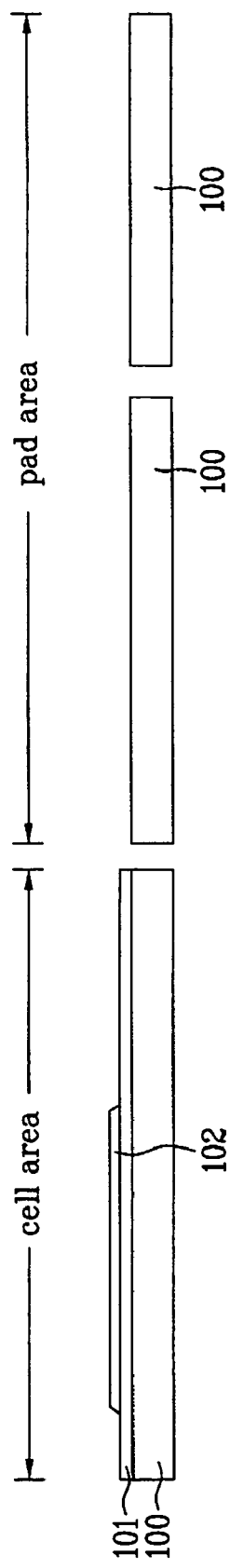

Referring to FIG. 14A, a buffer layer 101 is formed on an insulating substrate 100 on which an active area is defined. The insulating substrate 100 is formed of glass or the like.

A polysilicon layer is deposited on the buffer layer 101 by chemical vapor deposition (CVD). An active layer 102 is then formed by selectively etching the polysilicon layer using a first mask for forming the active area. Alternatively, the active layer 102 can be formed by depositing amorphous silicon and by crystallizing the deposited amorphous silicon by laser beam irradiation or the like.

The buffer layer 101 prevents impurities of the insulating substrate 100 from diffusing into the active area and eventually plays a role in cutting off heat in laser crystallization. The active layer 102 is not formed on a pad area.

Figure 14B:
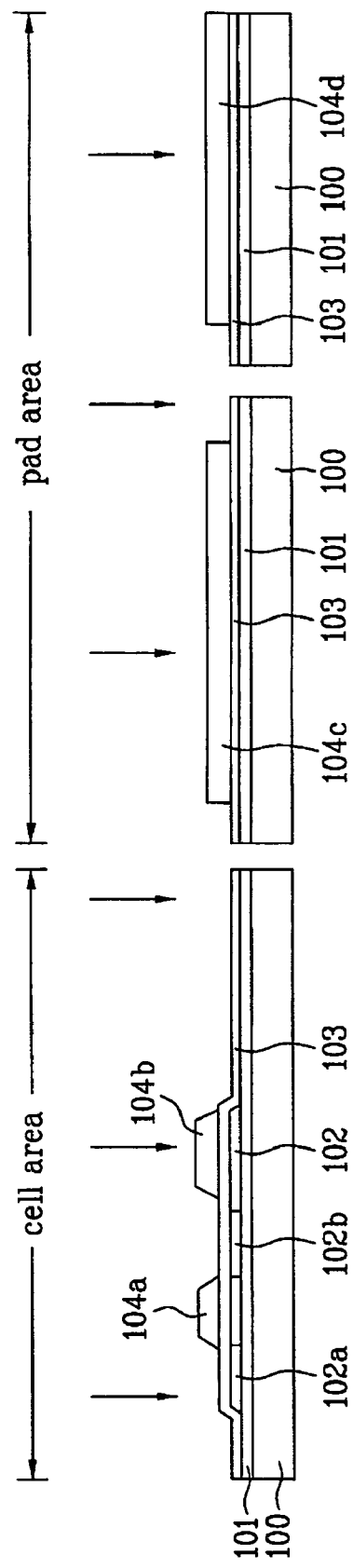

Referring to FIG. 14B, a gate insulating layer 103 is deposited on the buffer layer 101 including the active layer 102. A gate forming material is formed of Al or Mo on the gate insulating layer 103 by sputtering.

Subsequently, the gate forming material is selectively etched using a second mask for gate formation to form a gate line 104 running in one direction, a gate electrode 104a protruding from one side of the gate line 104 and a storage electrode 104b in a direction parallel to the gate line 104. The gate electrode 104a protrudes from one side to traverse a predetermined portion of the active layer 102.

First conductive layers 104c and 104d are formed on the pad area. A source region 102a and a drain region 102b are formed within the active layer 102 in the vicinity of both sides of the gate electrode 104a, respectively by implanting p type impurity ions using the gate electrode 104a and the storage electrode 104b as an ion blocking mask.

Referring to FIG. 14C, an insulating interlayer 105 is deposited on the gate insulating layer 103 including the gate line 104. Subsequently, first and second contact holes 106a and 106b are formed on the source and drain regions 102a and 102b, respectively using a third mask. First and second pad contact holes 106c and 106d are formed on the pad area.

Referring to FIG. 14D, a transparent conductive layer is deposited over the insulating substrate 100 and is then patterned to form a pixel electrode 107a on a pixel area using a fourth mask. Indium tin oxide (ITO), tin oxide (TO), indium zinc oxide (IZO) or indium tin zinc oxide (ITZO) is used as the transparent conductive layer. A pad electrode 107b is formed in the first pad contact hole 106c and on the insulating interlayer 105 in the vicinity of the first pad contact hole 106c.

Referring to FIG. 14E, a metal layer is deposited over the substrate including the first and second contact holes 106a and 106b. The deposited metal layer is then patterned using a fifth mask to form a source electrode 108a in the first contact hole 106a and on the insulating interlayer 105 in the vicinity of the first contact hole 106a, a drain electrode 108b in the second contact hole 106b and on the insulating interlayer 105 in the vicinity of the second contact hole 106b, and a data line 108 formed in one body of the source electrode 108a to define a pixel area by crossing with the gate line 104 (cf. FIG. 12). A lower side of the drain electrode 108b directly contacts the pixel electrode 107a.

In an area-B, a storage capacitor is configured between the storage electrode/insulating interlayer/pixel electrode 104b/105/107a or between the storage electrode/insulating interlayer/drain electrode 104b/105/108b. A second conductive layer 108c is formed in the second pad contact hole 106d of the pad area and on the insulating interlayer 105 in the vicinity of the second pad contact hole 106d of the pad area.

Referring to FIG. 14F, a protective layer 109 is deposited over the substrate 100 including the source and drain electrodes 108a and 108b. The protective layer 109 is then etched to form a bank area 110 that exposes a flat part of the pixel electrode 107a using a sixth mask. The protective layer 109 in the pad area is etched to form a pad opening that exposes both tilted sides of the pad electrode 107b. The protective layer 109 can be formed of an organic insulator such as acrylic organic compound, BCB (benzocyclobutene), PFCB and the like.

After forming the bank area 110, an active matrix organic light emitting device (AM-OLED) (not shown in the drawing) is formed by stacking a hole injection layer, an emitting layer, an electron injection layer and a cathode electrode sequentially on the pixel electrode 107a.

The bank area 110 should be formed on the flat part of the pixel electrode 107a. If the bank area 110 is formed on an area including a tilted part of the anode electrode, an electric field is concentrated on a titled corner of the stacked hole injection layer, emitting layer, electron injection layer and cathode electrode so that the tilted corner is easily degraded to reduce the endurance of the device.

In the above process, the pad area is configured to expose both of the tilted sides of the pad electrodes 107b and 107c. Alternatively, the pad opening, as shown in FIG. 15 or FIG. 16, can be configured so that a protective layer 157 or 167 can enclose both tilted sides of a pad electrode 155 or 166.

In the pad area, to prevent electro-chemical corrosion, providing the first conductive layer to the inside of the LCD panel directly is superior to the other configuration of applying the signal to the inside of the LCD panel via the second conductive layer. In addition, enclosing the tilted sides of the pad electrode 155 or 166 better protects against electro-chemical corrosion.

A flat panel display device and fabricating method thereof applicable in part to the present invention using six masks are explained as follows.

Figure 17:
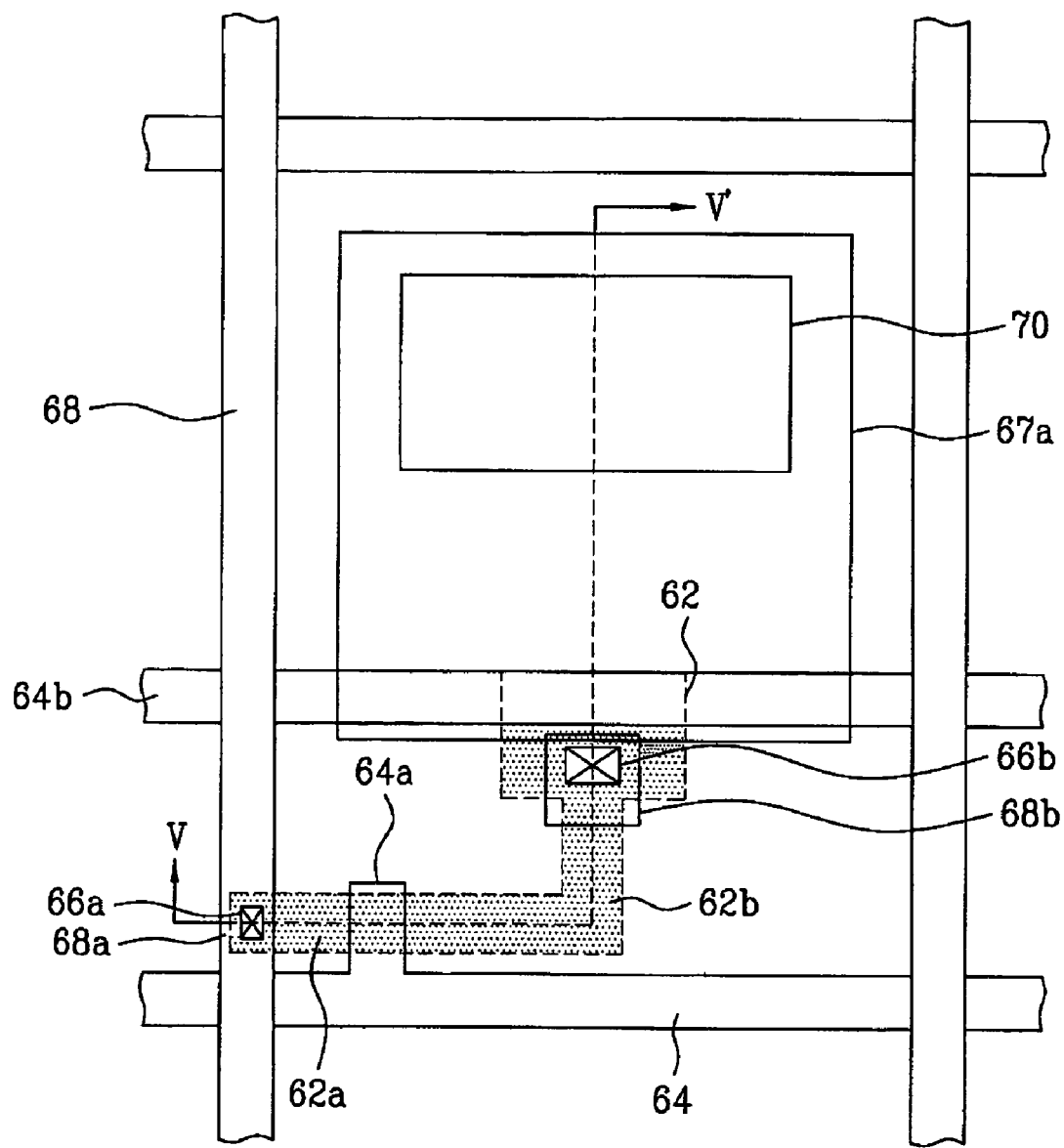
FIG. 17 is a layout of a flat panel display device applicable to the present invention.
Figure 18:
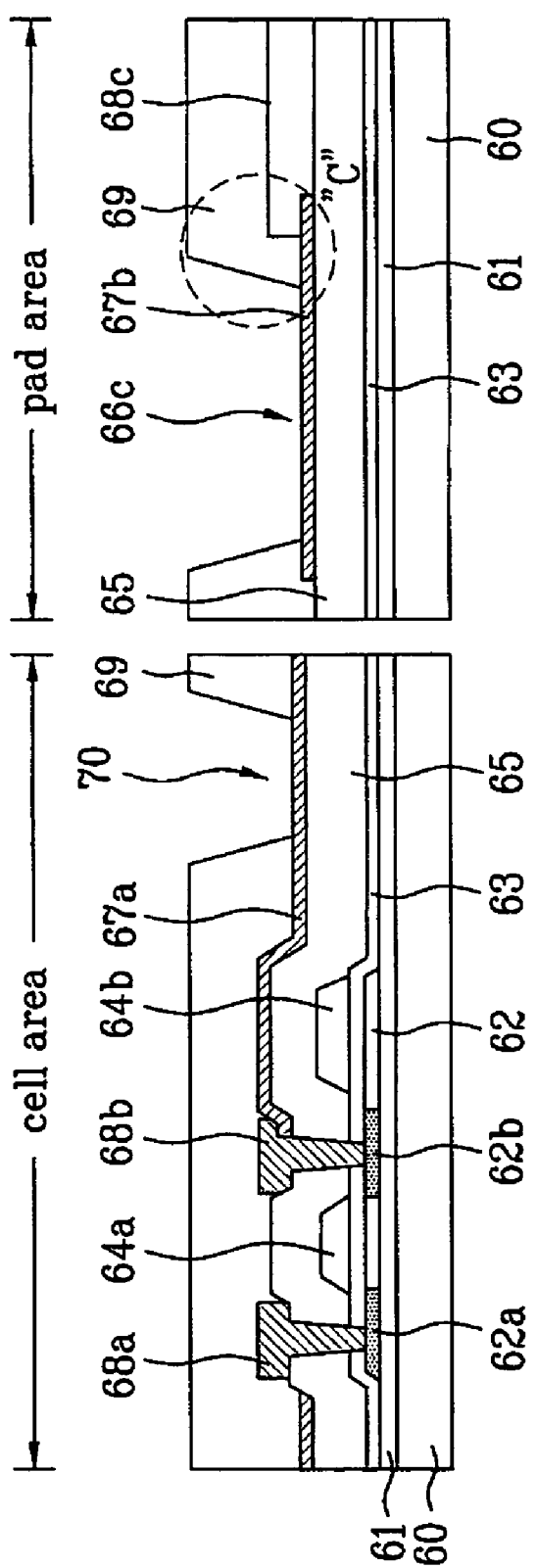
FIG. 18 is a cross-sectional diagram taken along a cutting line V-V' in FIG. 17.

FIG. 17 is a layout of a flat panel display device applicable to the present invention and FIG. 18 is a cross-sectional diagram taken along a cutting line V-V' in FIG. 17.

FIGS. 19A to 19F are cross-sectional diagrams for explaining a method of fabricating a flat panel display device applicable to the present invention. The flat panel display device, as shown in FIG. 17 and FIG. 18, relates to an active matrix organic light emitting device (AM-OLED) suitable for line inversion drive.

Referring to FIG. 17 and FIG. 18, a buffer layer 61 is formed on an insulating substrate 60. An active layer 62 is patterned on the buffer layer 61. A gate insulating layer 63 is formed over the insulating substrate 60 including the active layer 62. A gate line 64 is arranged on one area of the gate insulating layer 63 in one direction. A gate electrode 64a protrudes from one side of the gate line 64. A storage electrode 64b is arranged in a direction parallel to the gate line 64 to traverse the active layer 62. Source and drain regions 62a and 62b doped with p type impurities are provided within the active layer 62 in the vicinity of both sides of the gate electrode 64a, respectively. An insulating interlayer 65 is formed over the insulating substrate 60 to have first and second contact holes 66a and 66b on the source and drain regions 62a and 62b, respectively. A pixel electrode 67a is formed on one area of a pixel area excluding the first and second contact holes 66a and 66b. A source electrode 68a contacts with the source region 62a via the first contact hole 66a. A data line 68 extending from the source electrode 68a crosses with the gate line 64 to define a pixel area. A drain electrode 68b contacts the drain region 62b via the second contact hole 66b and has a predetermined shape that directly contacts the pixel electrode 67a. A protective layer 69 is formed over the insulating substrate 60 including the source and drain electrodes 68a and 68b and the pixel electrode 67a and has a bank area 70 that exposes one flat area of the pixel electrode 67a. An organic EL device is later formed on the bank area 70.

In the pad area, as shown in FIG. 18, for applying signals to the gate and data lines 64 and 68 within the LCD panel, a buffer insulating layer 61, a gate insulating layer 63 and an insulating interlayer 65 are stacked on the insulating substrate 60, a pad electrode 67a is patterned on one area of the insulating interlayer 65, a first conductive layer 68 extends in one direction to directly contact one side of the pad electrode 67b, and a protective layer 69 is formed over the substrate 60 to have a first pad contact hole 66c on one area of the pad electrode 67b.

In the pad area, the pad electrode 67b directly contacts the first conductive layer 68c to be connected to the inside of the LCD panel. Namely, a signal can be applied to the inside of the LCD panel via the first conductive layer 68c. The pad electrode 67b is formed of the same material of the pixel electrode 67a on the same layer. The first conductive layer 68c is formed of the same material of the source/drain electrode 68a/68b on the same layer.

The insulating interlayer 65 is formed of a silicon nitride (SiN$_x$) layer to have a thickness of about 2,000~3,000 Å. A storage capacitor is configured between the storage electrode/insulating interlayer/pixel electrode 64b/65/67a or between the storage electrode/insulating interlayer/drain electrode 64b/65/68b. As the storage capacitor is configured in the above manner, the active layer 62 below the storage electrode 64b is not doped. The protective layer 69 is formed of an inorganic insulator such as SiN$_x$ or an organic insulator such as acrylic organic compound, BCB (benzocyclobutene), PFCB and the like.

A method of fabricating the above-configured flat panel display device is explained as follows.

Referring to FIG. 19A, a buffer layer 61 is formed on an insulating substrate 60 on which an active area is defined. A polysilicon layer is deposited on the buffer layer 61 by chemical vapor deposition (CVD). An active layer 62 is then formed by selectively etching the polysilicon layer using a first mask for forming the active area.

Alternatively, the active layer 62 can be formed by depositing amorphous silicon and by crystallizing the deposited amorphous silicon by laser beam irradiation or the like.

The buffer layer 61 prevents impurities of the insulating substrate 60 from diffusing into the active area and eventually plays a role in cutting off heat in laser crystallization. The active layer 62 is not formed on a pad area.

Referring to FIG. 19B, a gate insulating layer 63 is deposited on the buffer layer 61 including the active layer 62. A gate forming material is formed of Al or Mo on the gate insulating layer 63 by sputtering.

Subsequently, the gate forming material is selectively etched using a second mask for gate formation to form a gate line 64 running in one direction, a gate electrode 64a protruding from one side of the gate line 64 and a storage electrode 64b in a direction parallel to the gate line 64. The gate electrode 64a protrudes from one side to traverse a predetermined portion of the active layer 62. The gate insulating layer 63 is formed on the pad area.

A source region 62a and a drain region 62b are formed within the active layer 62 in the vicinity of both sides of the gate electrode 64a, respectively by implanting p type impurity ions using the gate electrode 64a and the storage electrode 64b as an ion blocking mask.

Figure 19C:
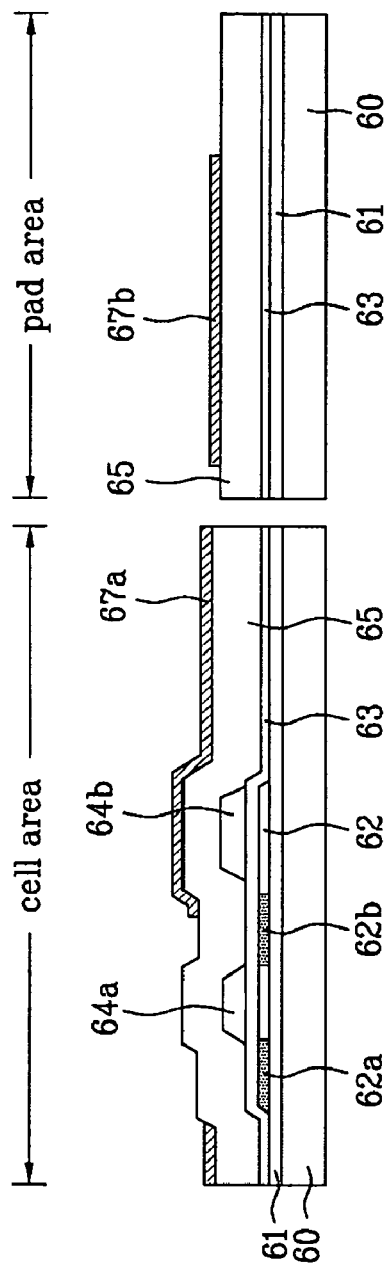

Referring to FIG. 19C, an insulating interlayer 65 is deposited on the gate insulating layer 63 including the gate line 64. Subsequently, a transparent conductive layer is deposited over the insulating substrate 60 and is then patterned to form a pixel electrode 67a on a pixel area using a third mask. A pad electrode 67b is formed on one area of the insulating interlayer 65. Indium tin oxide (ITO), tin oxide (TO), indium zinc oxide (IZO) or indium tin zinc oxide (ITZO) is used as the transparent conductive layer. The pad electrode 67b is formed of the same material of the pixel electrode 67a on the same layer.

Figure 19D:
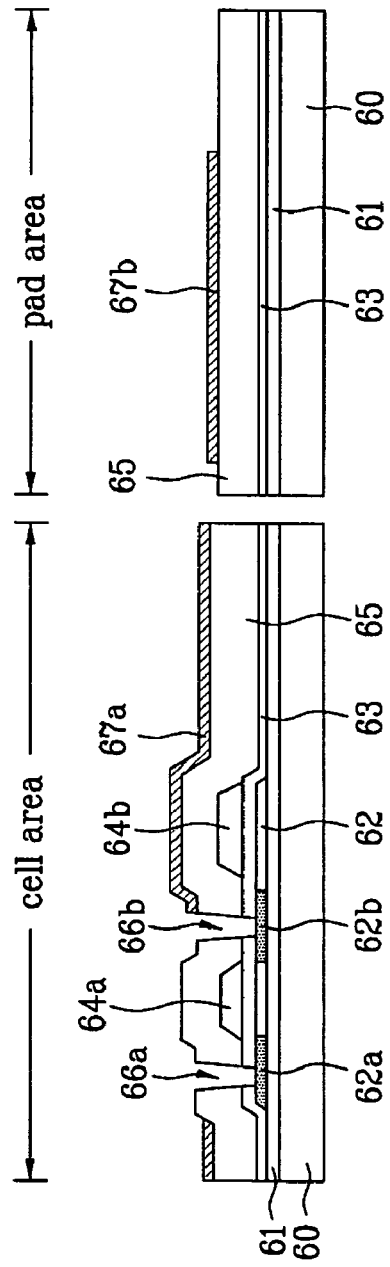

Referring to FIG. 19D, first and second contact holes 66a and 66b are formed on the source and drain regions 62a and 62b, respectively using a fourth mask.

Referring to FIG. 19E, a metal layer is deposited over the substrate 60 including the first and second contact holes 66a and 66b. The deposited metal layer is then patterned using a fifth mask to form a source electrode 68a in the first contact hole 66a and on the insulating interlayer 65 in the vicinity of the first contact hole 66a, a drain electrode 68b in the second contact hole 66b and on the insulating interlayer 65 in the vicinity of the second contact hole 66b, and a data line 68 formed in one body of the source electrode 68a to define a pixel area by crossing with the gate line 64 (cf. FIG. 17). In this case, a lower side of the drain electrode 68b directly contacts the pixel electrode 67a.

In an area-D, a storage capacitor is configured between the storage electrode/insulating interlayer/pixel electrode 64b/65/67a or between the storage electrode/insulating interlayer/drain electrode 64b/65/68b. The first conductive layer 68c extends to directly contact one upper side of the pad electrode 67b in the pad area.

Referring to FIG. 19F, a protective layer 69 is deposited over the substrate 60 including the source and drain electrodes 68a and 68b. The protective layer 69 is then etched to form a bank area 70 that exposes a flat part of the pixel electrode 67a using a sixth mask. In doing so, the protective layer 69 in the pad area is etched to form a pad opening that exposes one area of the pad electrode 67b using the sixth mask. The protective layer 69 can be formed of an inorganic insulator such as $SiN_x$ or an organic insulator such as acrylic organic compound, BCB (benzocyclobutene), PFCB and the like.

After forming the bank area 70, an active matrix organic light emitting device (AM-OLED) (not shown in the drawing) is formed by stacking a hole injection layer, an emitting layer, an electron injection layer and a cathode electrode sequentially on the pixel electrode 67a. If the protective layer 69 is formed using an inorganic insulator, dry etching is performed to form the bank area 70. However, using dry etching damages a surface of the pixel electrode 67a, causing the surface to be uneven. If the surface of the pixel electrode 67a of the bank area 70 becomes uneven, luminance of the corresponding AM-OLED is degraded.

If the protective layer 69 is formed from an organic insulator, a development process is performed to form the bank area 70 to avoid damaging the surface of the pixel electrode 67a. However, the photosensitive organic layer is vulnerable to moisture in a seal periphery area or in the pad area (area-C) of the LCD panel. Hence, care is taken lest the moisture penetrate the photosensitive organic layer, which increases the possibility of electro-chemical corrosion. Electro-chemical corrosion causes disconnection of signal lines and the like and lowers long-term robustness of the final overall product.

Flat panel display devices and fabricating methods thereof according to third and fourth embodiments of the present invention, which can solve the electro-chemical corrosion problem, using six masks are explained as follows.

Third Embodiment

A flat panel display device according to a third embodiment of the present invention is explained as follows.

Figure 20:
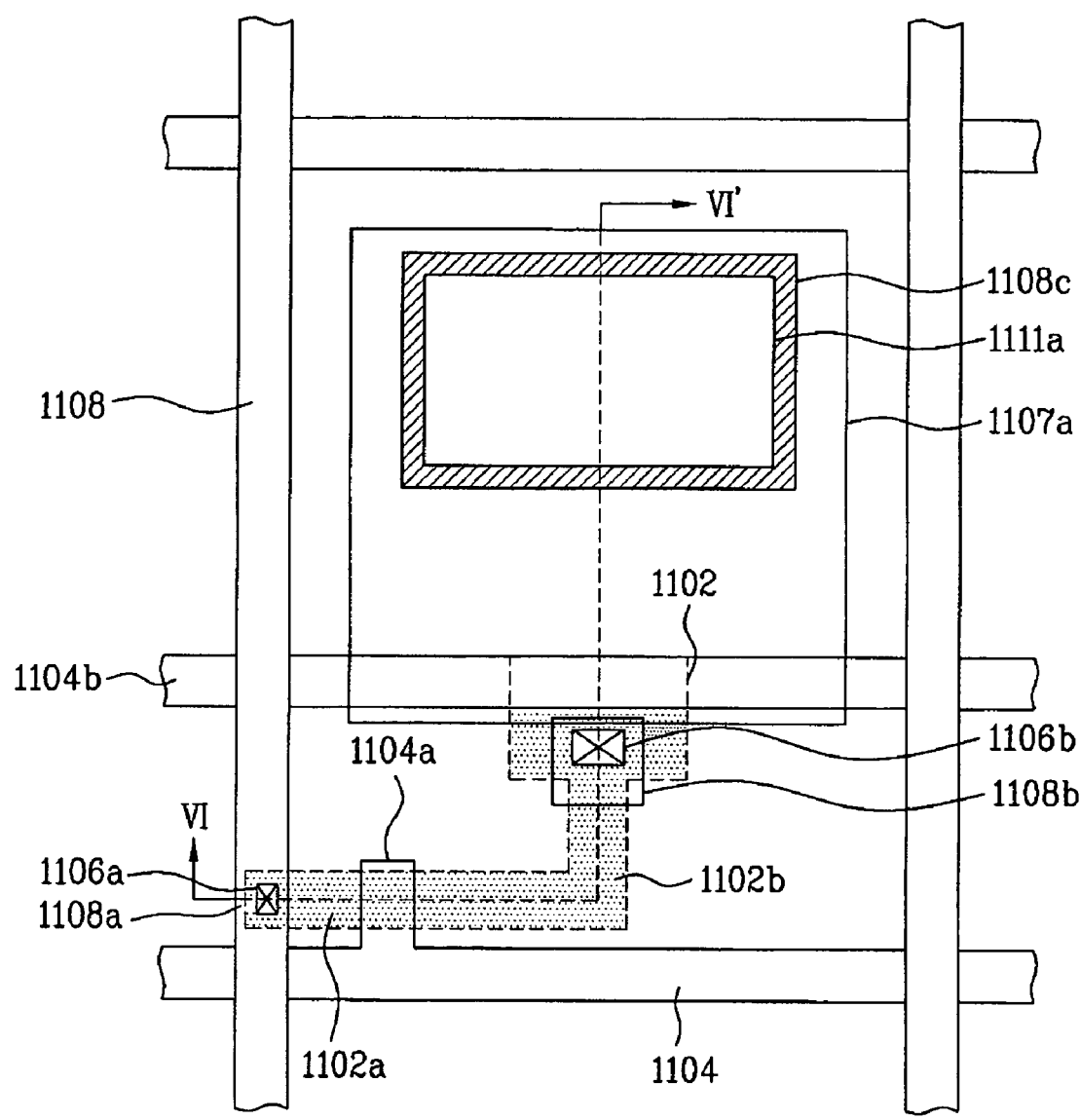
FIG. 20 is a layout of a flat panel display device according to a third embodiment of the present invention.
Figure 21:
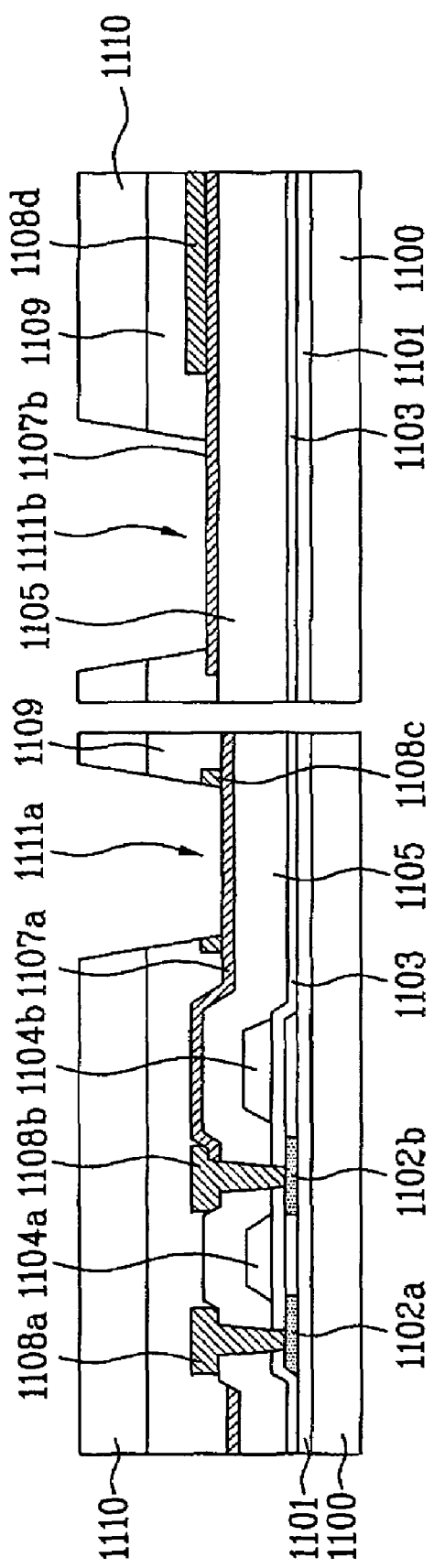
FIG. 21 is a cross-sectional diagram taken along a cutting line VI-VI' in FIG. 20.
Figure 25:
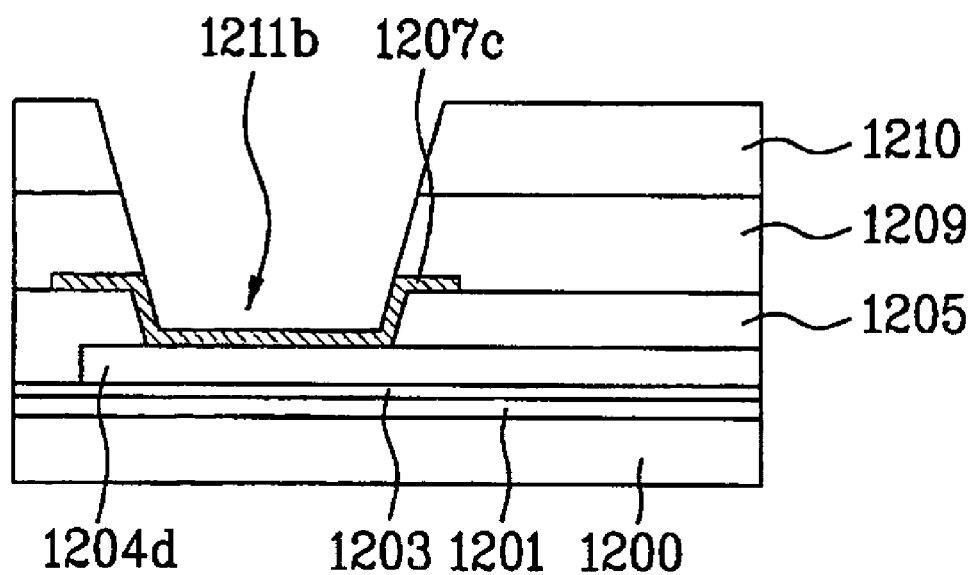
FIGS. 25 to 27 are exemplary cross-sectional diagrams of pad areas according to the present invention, respectively.
Figure 26:
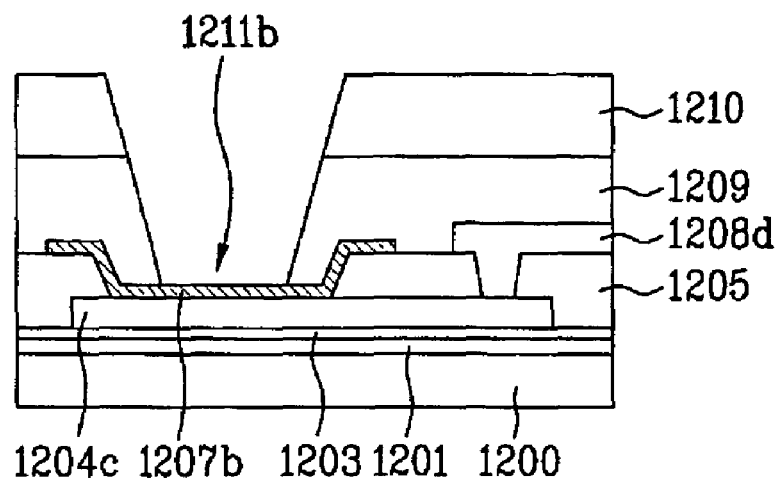
Figure 27:
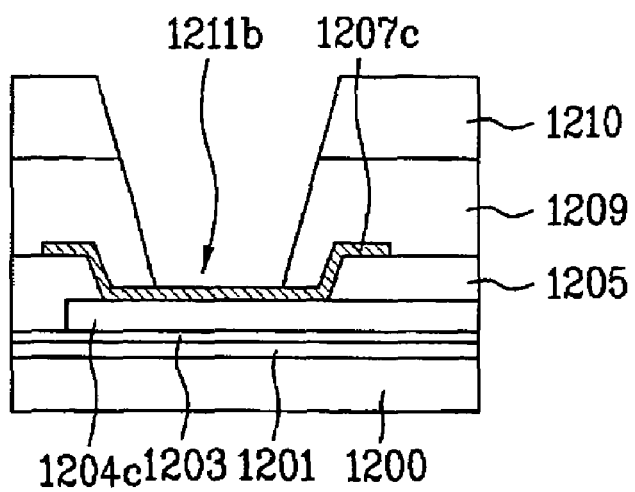

FIG. 20 is a layout of a flat panel display device according to a third embodiment of the present invention, FIG. 21 is a cross-sectional diagram taken along a cutting line VI-VI' in FIG. 20. FIGS. 25 to 27 are exemplary cross-sectional diagrams of pad areas according to the present invention, respectively. The third embodiment of the present invention, as shown in FIG. 20 and FIG. 21, relates to an active matrix organic light emitting device (AM-OLED) suitable for line inversion drive.

Referring to FIG. 20 and FIG. 21, a buffer layer 1101 is formed on an insulating substrate 1100. An active layer 1102 is patterned on the buffer layer 1101. A gate insulating layer 1103 is formed over the insulating substrate 1100 including the active layer 1102. A gate line 1104 is arranged on one area of the gate insulating layer 1103 in one direction. A gate electrode 1104a protrudes from one side of the gate line 1104. A storage electrode 1104b is arranged in a direction parallel to the gate line 1104 to traverse the active layer 1102. Source and drain regions 1102a and 1102b doped with p type impurities are provided within the active layer 1102 in the vicinity of both sides of the gate electrode 1104a, respectively. An insulating interlayer 1105 is formed over the insulating substrate 1100 to have first and second contact holes 1106a and 1106b on the source and drain regions 1102a and 1102b, respectively. A pixel electrode 1107a is formed on one area of a pixel area excluding the first and second contact holes 1106a and 1106b. A source electrode 1108a contacts the source region 1102a via the first contact hole 1106a. A data line 1108 extending from the source electrode 1108a crosses with the gate line 1104 to define a pixel area. A drain electrode 1108b contacts the drain region 1102b via the second contact hole 1106b and has a predetermined shape that directly contacts the pixel electrode 1107a. A blocking layer 1108c is formed on one area of the pixel electrode 1107a. First and second protective layers 1109 and 1110 are formed over the insulating substrate 1100 to have a bank area 1111a that exposes one flat area of the pixel electrode 1107a below the blocking layer 1108c. An organic EL device is later formed on the bank area 1111a. The blocking layer 1108c is formed of the same material of the source/drain electrode 1108a/1108b on the same layer.

The bank area 1111a is formed to secure a flat anode electrode thereon in forming the organic EL device layer. Hence, the bank area 1111a is formed on a flat part of the pixel electrode 1107a.

The organic EL device, as shown in FIG. 2, includes an anode electrode 2 with a transparent electrode pattern, a hole injection layer 3 on the anode electrode 2, an emitting layer 4 on the hole injection layer 3, an electron injection layer 5 on the emitting layer 4, and a cathode electrode 6 on the electron injection layer 5. The cathode electrode 6 is formed of a metal electrode.

In the organic EL device, once a drive voltage is applied between the anode and cathode electrodes 2 and 6, holes within the hole injection layer 3 and electrons within the electron injection layer 5 proceed to the emitting layer 4 so that the emitting layer 4 emits visible light by excitation. Hence, the visible light emitted from the emitting layer can display an image or video.

The anode electrode 2 corresponds to the pixel electrode 1107a in FIG. 20 or FIG. 21. Hence, the hole injection layer, the emitting layer, the electron injection layer and the cathode electrode sequentially stacked on the pixel electrode 1107a configure an active matrix organic light emitting device (AM-OLED).

The bank area 1111a is formed on the flat part of the pixel electrode 1107a. If the bank area 1111a is formed on a tilted part of the anode electrode, an electric field is concentrated on a titled corner of the stacked hole injection layer, emitting layer, electron injection layer and cathode electrode so that the tilted corner is easily degraded to reduce the endurance of the device.

In the pad area, as shown in FIG. 21, for applying signals to the gate and data lines 1104 and 1108 within an LCD panel, a buffer layer 1101, a gate insulating layer 1103 and an insulating interlayer 1105 are stacked on an insulating substrate 1100, a pad electrode 1107b is patterned on one area of the insulating interlayer 1105, a first conductive layer 1108d is patterned in one direction to directly contact the upper side of the pad electrode 1107b, and first and second protective layers 1109 and 1110 are formed over the substrate 1100 to form a first pad opening 1111b on one area of the pad electrode 1107b.

The pad area is configured for connection to an inside of an LCD panel such that the pad electrode 1107b directly contacts the first conductive layer 1108d. Namely, the pad area is configured to apply a signal to the inside of the LCD panel via the first conductive layer 1108d.

The pad electrode 1107b is formed of the same material of the pixel electrode 1107a on the same layer. The first conductive layer 1108d is formed of the same material of the source/drain electrode 1108a/1108b on the same layer. The insulating interlayer 1105 in the cell and pad areas is formed of a silicon nitride ($SiN_x$) layer and has a thickness of about 2,000~3,000 Å.

A storage capacitor of the present invention is configured between the storage electrode/insulating interlayer/pixel electrode 1104b/1105/1107a or between the storage electrode/insulating interlayer/drain electrode 1104b/1105/1108b. As the storage capacitor is configured in the above manner, the active layer 1102 below the storage electrode 1104b may remain undoped.

The first protective layer 1109 is formed of an inorganic insulator such as $SiN_x$ and the second protective layer 1110 is formed of an organic insulator such as acrylic organic compound, BCB (benzocyclobutene), PFCB and the like. Since the first protective layer 1109 and the second protective layer 1110 are stacked on the source and drain electrodes 1108a and 1108b and the first conductive layer 1108d connected to the pad electrode 1107b and since the blocking layer 1108c is further deposited on the pixel electrode 1107a on which the bank area 1111a will be formed, the pixel electrode 1107 is prevented from having an uneven surface in forming the bank area 1111a and provides a stable configuration against electro-chemical corrosion.

A method of fabricating the above-configured flat panel display device according to the third embodiment of the present invention is explained as follows. FIGS. 22A to 22I are cross-sectional diagrams for explaining a method of fabricating a flat panel display device according to a third embodiment of the present invention.

Figure 22A:
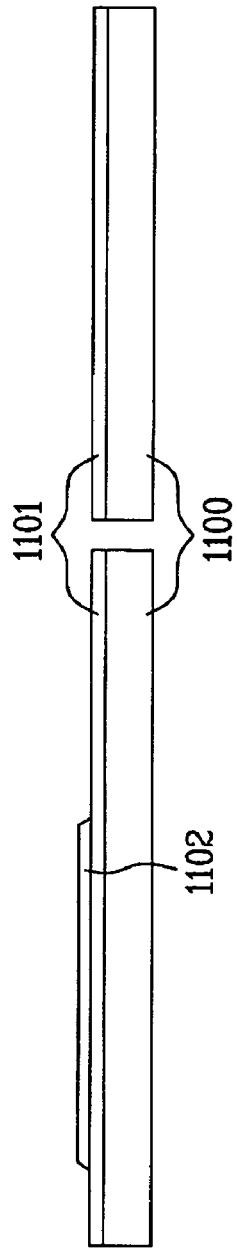

Referring to FIG. 22A, a buffer layer 1101 is formed on an insulating substrate 1100 on which an active area is defined. A polysilicon layer is deposited on the buffer layer 1101 by chemical vapor deposition (CVD). An active layer 1102 is then formed by selectively etching the polysilicon layer using a first mask for forming the active area.

Alternatively, the active layer 1102 can be formed by depositing amorphous silicon and by crystallizing the deposited amorphous silicon by laser beam irradiation or the like.

The buffer layer 1101 prevents impurities of the insulating substrate 1100 from diffusing into the active area and eventually plays a role in cutting off heat in laser crystallization. The active layer 1102 is not formed on a pad area.

Figure 22B:
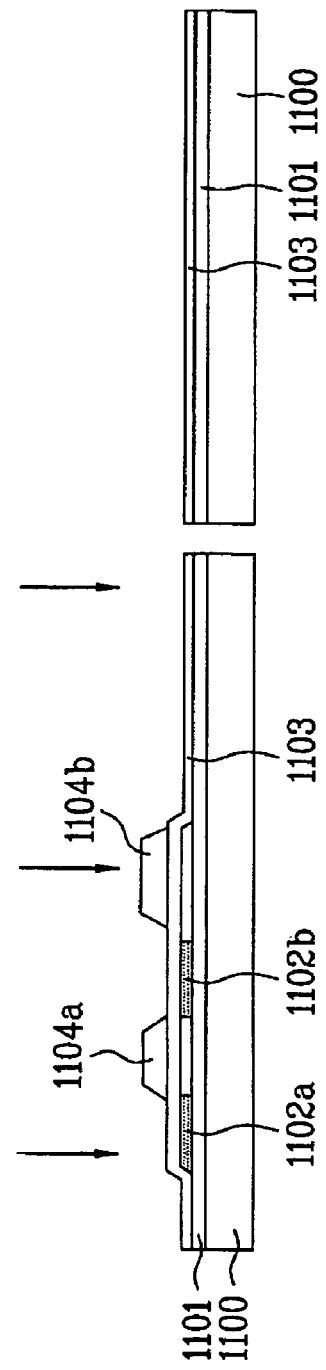

Referring to FIG. 22B, a gate insulating layer 1103 is deposited on the buffer layer 1101 including the active layer 1102. A gate forming material is formed of Al or Mo on the gate insulating layer 1103 by sputtering.

Subsequently, the gate forming material is selectively etched using a second mask for gate formation to form a gate line 1104 running in one direction, a gate electrode 1104a protruding from one side of the gate line 1104 and a storage electrode 1104b in a direction parallel to the gate line 1104. The gate electrode 1104a protrudes from one side to traverse a predetermined portion of the active layer 1102. The gate insulating layer 1103 is also formed on the pad area.

A source region 1102a and a drain region 1102b are formed within the active layer 1102 in the vicinity of both sides of the gate electrode 1104a, respectively by implanting p type impurity ions using the gate electrode 1104a and the storage electrode 1104b as an ion blocking mask.

Referring to FIG. 22C, an insulating interlayer 1105 is deposited on the gate insulating layer 1103 including the gate line 1104. In this case, the insulating interlayer 1105 is formed of $SiN_x$ and has a thickness of 2,000~3,000 Å.

Subsequently, a transparent conductive layer is deposited over the insulating substrate 1100 and is then patterned to form a pixel electrode 1107a on a pixel area using a third mask. A pad electrode 1107b is formed on one area of the insulating interlayer 1105 of the pad area. Indium tin oxide (ITO), tin oxide (TO), indium zinc oxide (IZO) or indium tin zinc oxide (ITZO) is used as the transparent conductive layer. The pad electrode 1107b is formed of the same material of the pixel electrode 1107a on the same layer.

Referring to FIG. 22D, first and second contact holes 1106a and 1106b are formed on the source and drain regions 1102a and 1102b, respectively using a fourth mask.

Referring to FIG. 22E, a metal layer is deposited over the substrate 1100 including the first and second contact holes 1106a and 1106b. The deposited metal layer is then patterned using a fifth mask to form a source electrode 1108a in the first contact hole 1106a and on the insulating interlayer 1105 in the vicinity of the first contact hole 1106a, a drain electrode 1108b in the second contact hole 1106b and on the insulating interlayer 1105 in the vicinity of the second contact hole 1106b, a data line 1108 formed in one body of the source electrode 1108a to define a pixel area by crossing with the gate line 1104 (cf. FIG. 20), and a blocking layer 1108c on one flat area of the pixel electrode 1107a.

In this case, a lower side of the drain electrode 1108b directly contacts the pixel electrode 1107a. A storage capacitor is configured between the storage electrode/insulating interlayer/pixel electrode 1104b/1105/1107a or between the storage electrode/insulating interlayer/drain electrode 1104b/1105/1108b. A first conductive layer 1108d extends to directly contact the upper side of the pad electrode 1107b in the pad area.

Referring to FIG. 22F, a first protective layer 1109 and a second protective layer 1110 are sequentially deposited over the substrate 1100 including the source and drain electrodes 1108a and 1108b. The first protective layer 1109 is formed of an inorganic insulator such as $SiN_x$ and the second protective layer 1110 is formed of an organic insulator such as acrylic organic compound, BCB (benzocyclobutene), PFCB and the like.

Referring to FIG. 22G, the second protective layer 1110 over the pixel electrode 1107a is removed by a development process to form a bank area 1111a therein using a sixth mask. The second protective layer 1110 over the pad electrode 1107b is removed by the development process to expose one area of the first protective layer 1109 using the sixth mask.

Referring to FIG. 22H, the first protective layer 1109 on the pixel electrode 1107a is removed by dry etching to form a bank area therein. The first protective layer 1109 in the pad area is removed by dry etching to form a first pad opening 1111b that exposes one area of the pad electrode 1107b using the sixth mask.

Figure 22I:
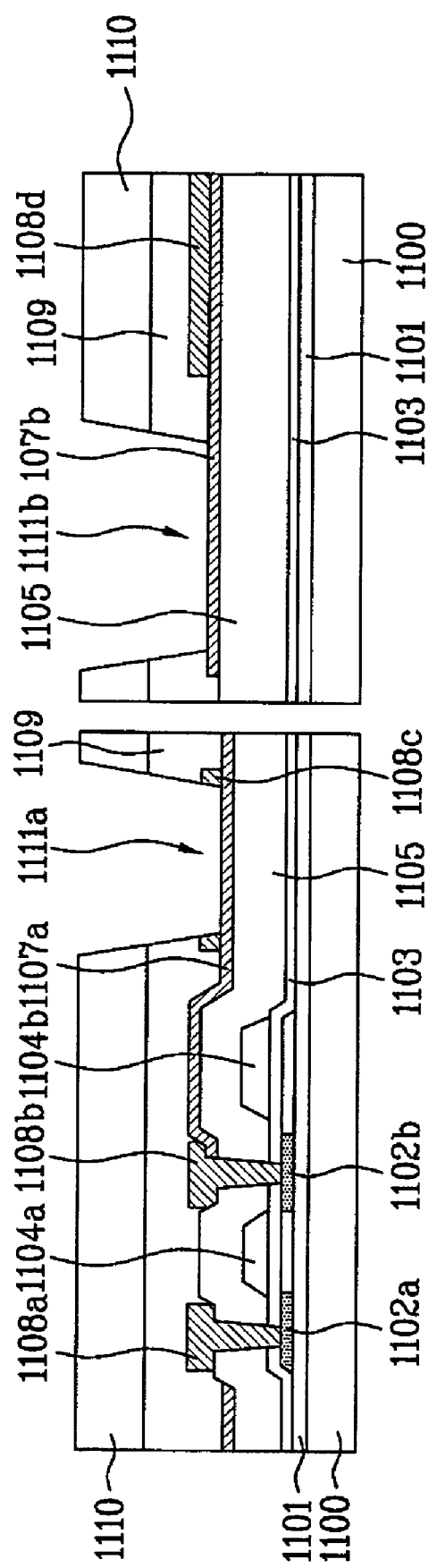

Referring to FIG. 22I, the blocking layer 1108c is removed by wet etching to form a bank area 1111a to expose one area of the pixel electrode 1107a using the sixth mask. In this case, the pad electrode 1107b is open in the pad area.

After forming the bank area 1111a, an active matrix organic light emitting device (AM-OLED) (not shown in the drawing) is formed by stacking a hole injection layer, an emitting layer, an electron injection layer and a cathode electrode sequentially on the pixel electrode 1107a.

Since the inorganic first protective layer 1109 and the organic second protective layer 1110 are stacked on the source and drain electrodes 1108a and 1108b and the first conductive layer 1108d connected to the pad electrode 1107b and since the blocking layer 1108c is further deposited on the pixel electrode 1107a on which the bank area 1111a will be formed, the pixel electrode 1107 is prevented from having an uneven surface in forming the bank area 1111a by dry etching and provides a stable configuration against electro-chemical corrosion occurring due to the use of an organic insulator in a seal periphery area.

The flat panel display device and fabricating method thereof according to the third embodiment of the present invention are designed for the AM-OLED (active matrix organic light emitting device) and are also applicable to a P type LTPS (low temperature polysilicon) (PMOS) LCD and fabricating method thereof. If the third embodiment is used in an LCD, the bank area may not be formed on the pixel electrode in forming the pad opening of the pad area.

Fourth Embodiment

A flat panel display device according to a fourth embodiment of the present invention is explained as follows.

Figure 23:
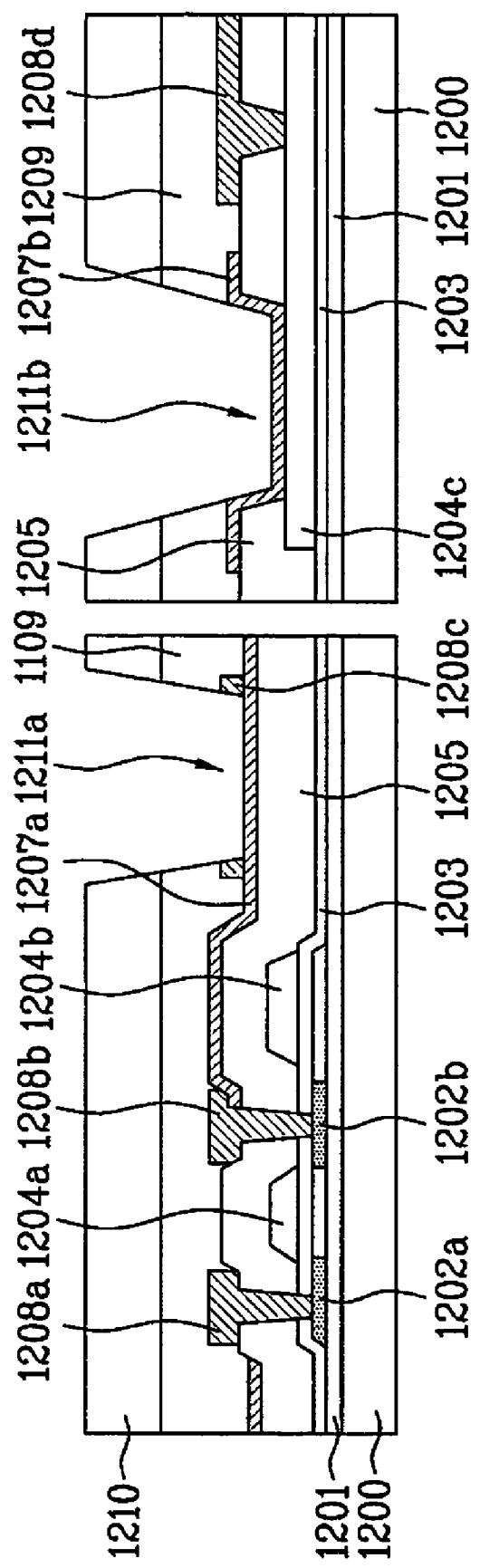
FIG. 23 is a layout of a flat panel display device according to a fourth embodiment of the present invention.

FIG. 23 is a layout of a flat panel display device according to a fourth embodiment of the present invention.

Referring to FIG. 23, a flat panel display device according to a fourth embodiment of the present invention includes a cell area having the same configuration of the third embodiment shown in FIG. 20 and FIG. 21.

In the third embodiment of the present invention, only one the transparent conductive pad electrode 1107b exists after completion of a bonding process such as TCP, FPC and COG. Since the transparent conductive material forming the pad electrode 1107b has a sheet resistance greater than that of a metal substance, drive failure may be caused due to the distance between the first pad opening 1111b and the first conductive layer 1108d.

For instance, if a COG bonding process is performed, a COG chip is built in one body (digital analog converter, DC/DC converter, level shifter, etc.). An operation of the DC/DC converter within the integrated chip is specifically sensitive to resistance and an input resistance thereof is lower than 100Ω. If the resistance increases, a swing width of a built-in circuit control signal is reduced to cause an operational problem of the built-in circuit (e.g., output target reduction from 10V~−8V to 8V~−6V). Hence, a degraded image quality or drive failure is brought about.

Thus, if a single pad electrode 1107b is formed of the transparent conductive material, the sheet resistance of the transparent conductive material is considerably high, that is several hundreds of Ω, despite the short-distance routing. If the line width is increased or thickened to lower the resistance, the corresponding design rule is limited. The fourth embodiment, which has the same cell area configuration of the third embodiment, mitigates above the drive failure problem.

Referring to FIG. 23, a buffer insulating layer 1201 and a gate insulating layer 1203 are stacked on an insulating substrate 1100. A first conductive layer 1204c is patterned on one area of the gate insulating layer 1203. An insulating layer 1205 includes first and second pad contact holes 1206c and 1206d on one area of the first conductive layer 1204c. A pad electrode 1207b is formed in the first pad contact hole 1206c and on the insulating interlayer 1205 in the vicinity of the first pad contact hole 1206c. A second conductive layer 1208d is formed in the second pad contact hole 1206d and on the insulating interlayer 1205 in the vicinity of the second pad contact hole 1206d to extend in one direction. First and second protective layers 1209 and 1210 are stacked over the substrate having a first pad opening 1211b in an area of the first pad contact hole 1206c to expose the pad electrode 1207b.

The pad area is configured for a connection to an inside of an LCD panel via the pad electrode 1207b, the first conductive layer 1204c and the second conductive layer 1208d. Namely, the pad area is configured to apply a signal to the inside of the LCD panel via the second conductive layer 1208d.

Alternatively, the pad area, as shown in FIG. 25, can be configured such that the first conductive layer 1204d connected to the pad electrode 1207c is directly extended to the inside of the LCD panel to be connected to gate and data lines instead of forming the second conductive layer 1208d.

Alternatively, the first pad opening 1211b, as shown in FIG. 23 or FIG. 25, can be configured to expose both sides of the pad electrode 1207b or 1207c. Alternatively, the first pad opening 1211b, as shown in FIG. 26 or FIG. 27, can be configured such that the first protective layer 1209 encloses both sides of the pad electrode 1207b or 1207c.

The first conductive layer 1204c is formed of the same material of the gate electrode 1204a on the same layer. The pad electrode 1207b or 1207c is formed of the same material of the pixel electrode 1207a on the same layer. The second conductive layer 1208d is formed of the same material of the source/drain electrode 1208a/1208b on the same layer.

A method of fabricating the above-configured flat panel display device according to the fourth embodiment of the present invention is explained as follows.

FIGS. 24A to 24I are cross-sectional diagrams for explaining a method of fabricating a flat panel display device according to a fourth embodiment of the present invention.

Figure 24A:
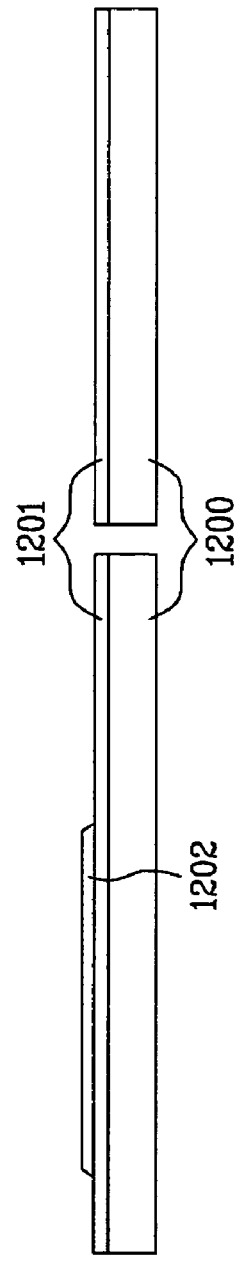

Referring to FIG. 24A, a buffer layer 1201 is formed on an insulating substrate 1200 on which an active area is defined. The insulating substrate 1200 is formed of glass or the like.

A polysilicon layer is deposited on the buffer layer 1201 by chemical vapor deposition (CVD). An active layer 1202 is then formed by selectively etching the polysilicon layer using a first mask for forming the active area. Alternatively, the active layer 1202 can be formed by depositing amorphous silicon and by crystallizing the deposited amorphous silicon by laser beam irradiation or the like.

The buffer layer 1201 prevents impurities of the insulating substrate 1200 from diffusing into the active area and eventually plays a role in cutting off heat in laser crystallization. The active layer 1202 is not formed on a pad area.

Figure 24B:
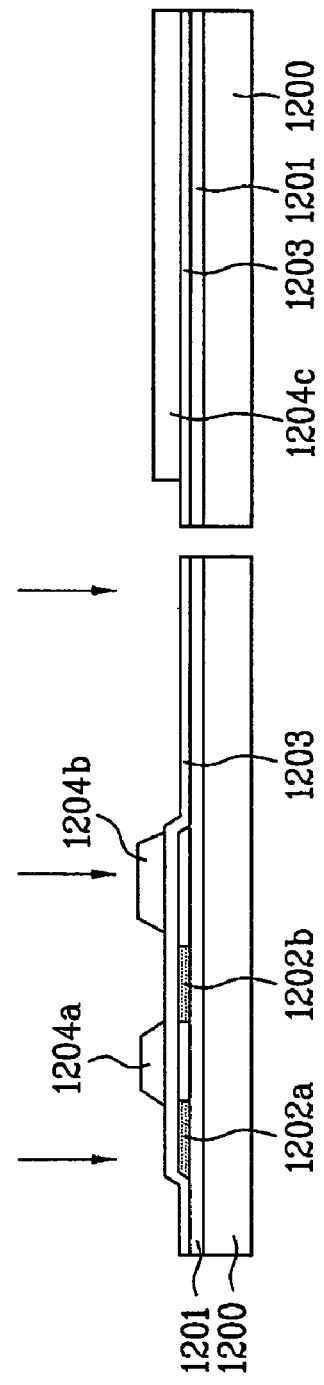

Referring to FIG. 24b, a gate insulating layer 1203 is deposited on the buffer layer 1201 including the active layer 1202. A gate forming material is formed of Al or Mo on the gate insulating layer 1203 by sputtering.

Subsequently, the gate forming material is selectively etched using a second mask for gate formation to form a gate line 1204 running in one direction, a gate electrode 1204a protruding from one side of the gate line 1204 and a storage electrode 1204b in a direction parallel to the gate line 1104. The gate electrode 1204a protrudes from one side to traverse a predetermined portion of the active layer 1202. A first conductive layer 1204c is formed on the pad area as well. A source region 1202a and a drain region 1202b are formed within the active layer 1202 in the vicinity of both sides of the gate electrode 1204a, respectively by implanting p type impurity ions using the gate electrode 1204a and the storage electrode 1204b as an ion blocking mask.

Figure 24C:
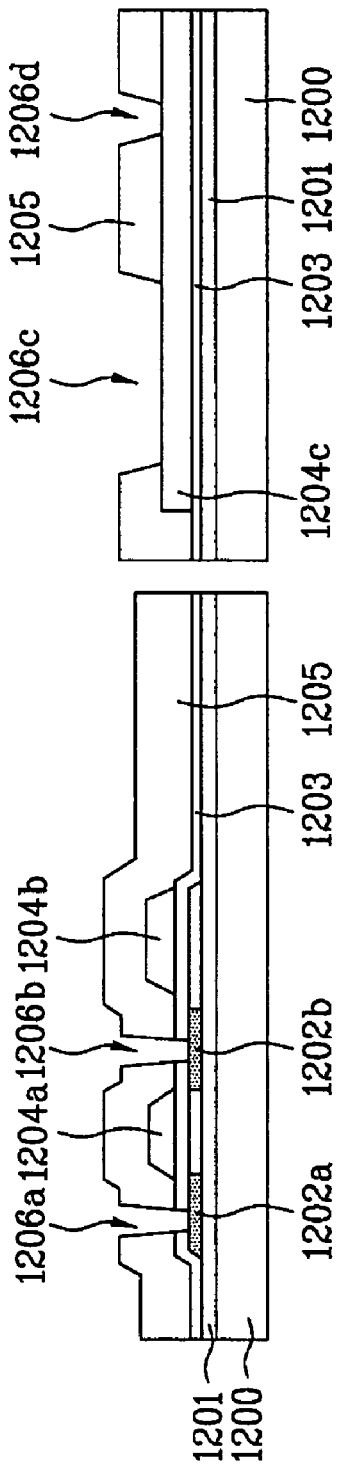

Referring to FIG. 24C, an insulating interlayer 1205 is deposited on the gate insulating layer 1203 including the gate line 1204. The insulating interlayer 1205 is formed of $SiN_x$ and has a thickness of 2,000~3,000 Å.

Subsequently, first and second contact holes 1206a and 1206b are formed on the source and drain regions 1202a and 1202b, respectively using a third mask. First and second pad contact holes 1206c and 1206d are also formed on the pad area.

Figure 24D:
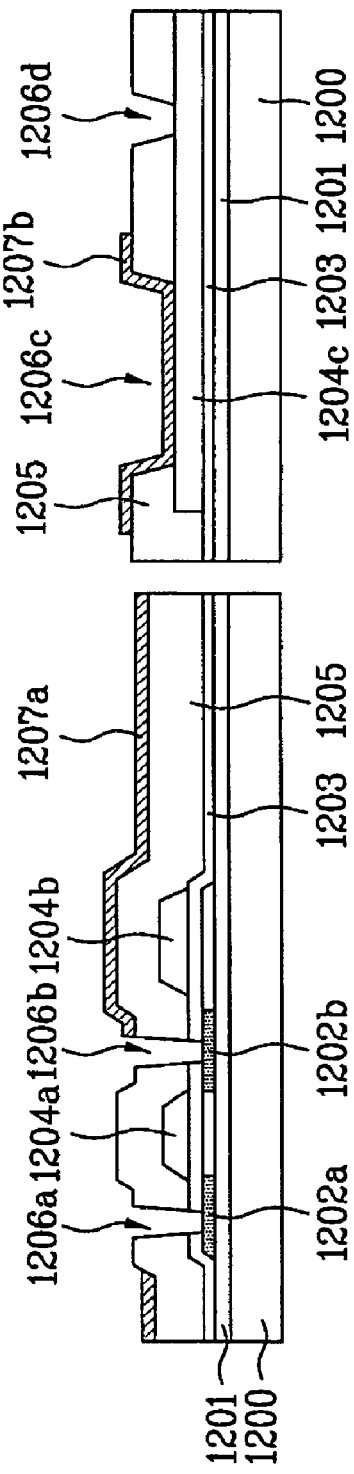

Referring to FIG. 24D, a transparent conductive layer is deposited over the insulating substrate 1200 and is then patterned to form a pixel electrode 1207a on a pixel area using a fourth mask. Indium tin oxide (ITO), tin oxide (TO), indium zinc oxide (IZO) or indium tin zinc oxide (ITZO) is used as the transparent conductive layer. A pad electrode 1207b is formed in the first pad contact hole 1206c and on the insulating interlayer 1205 in the vicinity of the first pad contact hole 1206c in the pad area.

Referring to FIG. 24E, a metal layer is deposited over the substrate 1200 including the first and second contact holes 1206a and 1206b. The deposited metal layer is then patterned using a fifth mask to form a source electrode 1208a in the first contact hole 1206a and on the insulating interlayer 1205 in the vicinity of the first contact hole 1206a, a drain electrode 1208b in the second contact hole 1206b and on the insulating interlayer 1205 in the vicinity of the second contact hole 1206b, a data line 1208 formed in one body of the source electrode 1208a to define a pixel area by crossing with the gate line 1204 (cf. FIG. 20), and a blocking layer 1208c on one area of the pixel electrode 1207a. A lower side of the drain electrode 1208b directly contacts the pixel electrode 1207a and the blocking layer 1208c is formed on a flat part of the pixel electrode 1207a.

A storage capacitor is configured between the storage electrode/insulating interlayer/pixel electrode 1204b/1205/1207a or between the storage electrode/insulating interlayer/drain electrode 1204b/1205/1208b. A second conductive layer 1208d is formed in the second pad contact hole 1206d and on the insulating interlayer 1205 in the vicinity of the second pad contact hole 1206d.

Referring to FIG. 24F, a first protective layer 1209 and a second protective layer 1210 are sequentially deposited over the substrate 1200 including the source and drain electrodes 1208a and 1208b. The first protective layer 1209 is formed of an inorganic insulator such as $SiN_x$ and the second protective layer 1210 is formed of an organic insulator such as acrylic organic compound, BCB (benzocyclobutene), PFCB and the like.

Referring to FIG. 24G, the second protective layer 1210 over the pixel electrode 1207a is removed by a development process to form a bank area 1211a therein using a sixth mask. The second protective layer 1210 over the pad electrode 1207b is removed by the development process to expose one area (first pad opening 1211b) of the first protective layer 1209 using the sixth mask.

Referring to FIG. 24H, the first protective layer 1209 on the pixel electrode 1207a is removed by dry etching to form a bank area 1211a therein. In doing so, the first protective layer 1209 in the pad area is removed by dry etching to form a first pad opening 1211b that exposes one area of the pad electrode 1207b using the sixth mask.

Figure 24I:
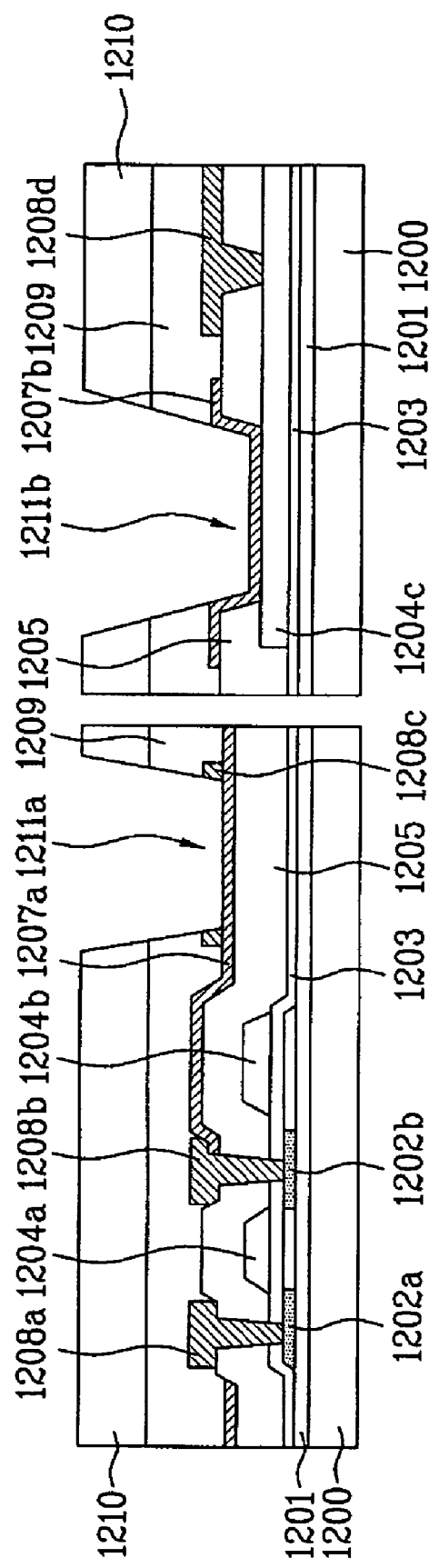

Referring to FIG. 24I, the blocking layer 1208c is removed by wet etching to form a bank area 1211a to expose one area of the pixel electrode 1207a using the sixth mask. In this case, the pad electrode 1207b is open in the pad area.

After forming the bank area 1211a, an active matrix organic light emitting device (AM-OLED) (not shown in the drawing) is formed by stacking a hole injection layer, an emitting layer, an electron injection layer and a cathode electrode sequentially on the pixel electrode 1207a.

Since the first protective layer 1209 formed of the inorganic insulator and the second protective layer 1210 formed of the organic insulator are stacked on the source and drain electrodes 1208a and 1208b and the first conductive layer 1208d connected to the pad electrode 1207b and since the blocking layer 1208c is further deposited on the pixel electrode 1207a on which the bank area 1211a will be formed, the pixel electrode 1207 is prevented from having an uneven surface in forming the bank area 1211a by dry etching and provided a stable configuration against electro-chemical corrosion that occurs when using an organic insulator in a seal periphery area.

The bank area 1211a is formed on the flat part of the pixel electrode 1207a. If the bank area 1211a is formed on an area including a tilted part of the anode electrode, an electric field is concentrated on a titled corner of the stacked hole injection layer, emitting layer, electron injection layer and cathode electrode so that the tilted corner is easily degraded to reduce the endurance of the device.

Alternatively, the pad area, as shown in FIG. 25, can be configured such that the first conductive layer 1204d connected to the pad electrode 1207c is directly extended to the inside of the LCD panel to be connected to gate and data lines instead of forming the second conductive layer 1208d.

Alternatively, the first pad opening 1211b, as shown in FIG. 23 or FIG. 25, can be configured to expose both sides of the pad electrode 1207b or 1207c. Alternatively, the first pad opening 1211b, as shown in FIG. 26 or FIG. 27, can be configured such that the first protective layer 1209 encloses both sides of the pad electrode 1207b or 1207c.

The first conductive layer 1204c is formed of the same material of the gate electrode 1204a on the same layer. The pad electrode 1207b or 1207c is formed of the same material of the pixel electrode 1207a on the same layer. The second conductive layer 1208d is formed of the same material of the source/drain electrode 1208a/1208b on the same layer.

The flat panel display device and fabricating method thereof according to the fourth embodiment of the present invention are designed for an AM-OLED (active matrix organic light emitting device) and are also applicable to a P type LTPS (low temperature polysilicon) (PMOS) LCD and fabricating method thereof. If the fourth embodiment of the present invention is applied to the LCD, the bank area may not be formed on the pixel electrode in forming the pad opening of the pad area.

In summary, the overall fabrication process for an LCD or AM-OLED is simplified and the cost decreased by reducing the number of masks. The endurance of the device is increased by configuring the flat bank area for forming the organic EL device of the AM-OLED so that the electric field is not concentrated in the corners of the contact holes. Similarly, the addition of a blocking layer to the bank area for the organic EL device of the AM-OLED permits the bank area to be open flat. The pad area is configured to effectively cope with electro-chemical corrosion. In addition, mitigation of the drive failure problem can be prevented by reducing the resistance of the pad area.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A flat panel display device comprising:
   a substrate on which a cell area and a pad area are defined;
   an active layer in an area of the cell area;
   a gate fine on the substrate including the active layer;
   a gate electrode overlapping the active layer;
   a storage electrode traversing the active layer;
   source and drain regions within the active layer;
   an insulating interlayer over the substrate having first and second contact holes on the source and drain regions, respectively;
   a data line arranged to define a pixel area by crossing with the gate line;
   a pixel electrode on the insulating interlayer of the pixel area;
   a protective layer over the substrate including the pixel electrode:
   a source electrode contacting the source region via the first contact hole;
   a drain electrode contacting the drain region via the second contact hole, the drain electrode on the pixel electrode, and
   a storage capacitor configured between the storage electrode/insulating interlayer/pixel electrode,
   wherein the pixel electrode is located between the insulating interlayer and the protective layer; and
   wherein the source and drain regions are doped and the active layer below the storage electrode is not doped.

2. The flat panel display device of claim 1, wherein the protective layer has a bank area exposing the pixel electrode.

3. The flat panel display device of claim 2, further comprising an organic electroluminescent device on the bank area over the pixel electrode.

4. The flat panel display device of claim 1, wherein the insulating interlayer has a thickness of about 2,000 to about 3,000 Å and comprises silicon nitride ($SiN_x$).

5. The flat panel display device of claim 1, wherein the storage electrode is parallel to the gate line.

6. The flat panel display device of claim 1, wherein the source and drain regions are in the vicinity of sides of the gate electrode, respectively, without being formed below the storage electrode.

7. The flat panel display device of claim 1, wherein the protective layer comprises an organic insulator.

8. The flat panel display device of claim 7, wherein the organic insulator selected comprises acrylic organic compounds, BCB (benzocyclobutene) and PFCB.

9. The flat panel display device of claim 1, wherein the pad area comprises:
   a gate insulating layer on the substrate;
   a first conductive layer on an area of the gate insulating layer;
   the insulating interlayer on the first conductive layer;
   a first pad contact hole disposed in the insulating interlayer;
   a pad electrode on the insulating interlayer including the first pad contact hole; and
   the protective layer having a pad opening to enclose an edge of the pad electrode.

10. The flat panel display device of claim 1, further comprising a blocking layer on the pixel electrode.

11. The flat panel display device of claim 10, further comprising first and second protective layers stacked over the substrate, the first and second protective layers having a bank area on the pixel electrode, the bank area perforating the blocking layer.

12. The flat panel display device of claim 11, the pad area comprising:
   a gate insulating layer on the substrate;
   an insulating interlayer on the gate insulating layer;
   a pad electrode patterned on an area of the insulating interlayer;
   a first conductive layer directly contacting an upper side of the pad electrode to extend to the cell area; and
   the first and second protective layers stacked on an area of the pad electrode and having a first pad contact hole therein.

13. The flat panel display device of claim 11, the pad area comprising:
   a gate insulating layer on the substrate;
   a first conductive layer patterned on an area of the gate insulating layer;
   the insulating interlayer on an area of the first conductive layer;
   first and second pad contact holes disposed in the insulating interlayer on the first conductive layer;
   a pad electrode in the first pad contact hole and on the insulating interlayer in the vicinity of the first pad contact hole;
   a second conductive layer in the second pad contact hole and on the insulating interlayer in the vicinity of the second pad contact hole to extend in one direction; and
   the first and second protective layers stacked over the substrate to have a first pad opening in an area of the first pad contact hole, the pad electrode exposed via the first pad opening.

14. The flat panel display device of claim 10, wherein the blocking layer is formed on a same layer as the data line and the source and drain electrodes.

15. The flat panel display device of claim 11, wherein the first protective layer comprises an inorganic insulator including $SiN_x$ and the second protective layer comprises an organic insulator containing at least one of acrylic organic compounds, BCD (benzocyclobutene) and PFCB.

16. The flat panel display device of claim 10, wherein the insulating interlayer has a thickness of about 2,000 to about 3,000 Å and comprises silicon nitride ($SiN_x$).

17. The flat panel display device of claim 10, wherein a storage capacitor is configured between the storage electrode/ insulating interlayer/pixel electrode and between the storage electrode/insulating interlayer/drain electrode.

18. The flat panel display device of claim 13, wherein the first conductive layer extends to an inside of the cell area without the second conductive layer in the pad area.

19. The flat panel display device of claim 13, wherein no edges of the pad electrode are exposed by the first pad opening.

20. The flat panel display device of claim 13, wherein an inclined side of the pad electrode is exposed by the first pad opening.

21. The flat panel display device of claim 11, further comprising an organic electroluminescent device on the bank area over the pixel electrode.

* * * * *